United States Patent
Chen et al.

(10) Patent No.: US 11,593,938 B2
(45) Date of Patent: Feb. 28, 2023

(54) RAPID AND AUTOMATIC VIRUS IMAGING AND ANALYSIS SYSTEM AS WELL AS METHODS THEREOF

(71) Applicants: Zhongwei Chen, Los Altos Hills, CA (US); Xiaoming Chen, Sunnyvale, CA (US); Daniel Tang, Fremont, CA (US); Liang-Fu Fan, Fremont, CA (US)

(72) Inventors: Zhongwei Chen, Los Altos Hills, CA (US); Xiaoming Chen, Sunnyvale, CA (US); Daniel Tang, Fremont, CA (US); Liang-Fu Fan, Fremont, CA (US)

(73) Assignee: BORRIRS PTE. LTD., Singapore (SG)

( * ) Notice: Subject to any disclaimer, the term of this patent is extended or adjusted under 35 U.S.C. 154(b) by 0 days.

(21) Appl. No.: 17/452,999

(22) Filed: Oct. 31, 2021

(65) Prior Publication Data

US 2022/0108443 A1 Apr. 7, 2022

Related U.S. Application Data

(63) Continuation-in-part of application No. 17/444,192, filed on Aug. 1, 2021, now Pat. No. 11,355,312.
(Continued)

(51) Int. Cl.
*G06T 7/00* (2017.01)
*G06T 7/50* (2017.01)
*H01J 37/28* (2006.01)

(52) U.S. Cl.
CPC .............. *G06T 7/0012* (2013.01); *G06T 7/50* (2017.01); *H01J 37/28* (2013.01);
(Continued)

(58) Field of Classification Search
CPC .............. G06T 7/0012; G06T 7/50; G06T 2207/20081; G06T 2207/30024;
(Continued)

(56) References Cited

U.S. PATENT DOCUMENTS 6,163,590 A * 12/2000 Wilkins .................. G21K 7/00
378/43
6,847,907 B1 * 1/2005 Novotny ............. B81C 99/0045
438/17
(Continued)

*Primary Examiner* — David A Vanore
(74) *Attorney, Agent, or Firm* — George Guosheng Wang; Upstream Research and Patent LLC

(57) ABSTRACT

A rapid and automatic virus imaging and analysis system includes (i) electron optical sub-systems (EOSs), each of which has a large field of view (FOV) and is capable of instant magnification switching for rapidly scanning a virus sample; (ii) sample management sub-systems (SMSs), each of which automatically loads virus samples into one of the EOSs for virus sample scanning and then unloads the virus samples from the EOS after the virus sample scanning is completed; (iii) virus detection and classification sub-systems (VDCSs), each of which automatically detects and classifies a virus based on images from the EOS virus sample scanning; and (iv) a cloud-based collaboration sub-system for analyzing the virus sample scanning images, storing images from the EOS virus sample scanning, and storing and analyzing machine data associated with the EOSs, the SMSs, and the VDCSs.

23 Claims, 55 Drawing Sheets

Related U.S. Application Data

(60) Provisional application No. 63/087,238, filed on Oct. 4, 2020.

(52) U.S. Cl.
CPC ............... *G06T 2207/20081* (2013.01); *G06T 2207/30024* (2013.01); *H01J 2237/2801* (2013.01); *H01J 2237/2802* (2013.01); *H01J 2237/2803* (2013.01); *H01J 2237/2813* (2013.01)

(58) Field of Classification Search
CPC ............... H01J 37/28; H01J 2237/2801; H01J 2237/2802; H01J 2237/2803; H01J 2237/2813
See application file for complete search history.

(56) References Cited

U.S. PATENT DOCUMENTS

| Patent/Pub. No. | | Date | Inventor | Class |
|---|---|---|---|---|
| 9,360,485 | B2 * | 6/2016 | Yeh | C12N 15/62 |
| 10,088,490 | B2 * | 10/2018 | Lewisch | G01N 33/743 |
| 2004/0114788 | A1 * | 6/2004 | Nakazawa | G06K 9/00147 |
| | | | | 382/128 |
| 2008/0003617 | A1 * | 1/2008 | Fan | C07K 16/36 |
| | | | | 435/7.1 |
| 2009/0082220 | A1 * | 3/2009 | Krause | G01N 21/658 |
| | | | | 506/12 |
| 2010/0096549 | A1 * | 4/2010 | Nishiyama | H01J 37/20 |
| | | | | 250/307 |
| 2017/0322224 | A1 * | 11/2017 | Hieke | G01N 35/00871 |
| 2020/0294764 | A1 * | 9/2020 | Takaguchi | H01J 37/22 |

\* cited by examiner

RAPID AND AUTOMATIC VIRUS IMAGING AND ANALYSIS SYSTEM AS WELL AS METHODS THEREOF

CROSS-REFERENCE TO RELATED U.S. APPLICATIONS

This application is Continuation-in-Part of U.S. non-provisional application Ser. No. 17/444,192 filed on Aug. 1, 2021 and docketed as "Elastic Connector," which claims the benefit under 35 U.S.C. Section 119(e) and Article 4 of the Stockholm Act of the Paris Convention for the Protection of Industrial Property of U.S. Provisional Patent Application No. 63/087,238, filed Oct. 4, 2020, entitled "Several Designs for Apparatus of Charged-Particle Beam and Methods Thereof," all of which are incorporated herein by reference in their entirety.

FIELD OF THE INVENTION

The present invention generally relates to a rapid and automatic virus imaging and analysis system and method thereof. Although the system will be illustrated, explained, and exemplified by an electron optical sub-system such as a scanning transmission electron microscope (STEM), a sample management sub-system, a virus detection and classification sub-system, and a cloud-based collaboration sub-system, it should be appreciated that the present invention can also be applied to other apparatuses of charged-particle beam such as a scanning electron microscope (SEM), transmission electron microscope (TEM), and an electron beam lithographical apparatus.

BACKGROUND OF THE INVENTION

Owing to the small de Broglie wavelength of electrons, TEM and STEM can enable the user to examine fine detail as small as a single column of atoms. Therefore, electron microscopes find application in cancer research, virology, materials science as well as pollution, nanotechnology, and semiconductor research, and they are used to investigate the ultrastructure of a wide range of specimens including tumor cells, microorganisms, large molecules, biopsy samples, semiconductor device, metals, and crystals.

For example, most viruses can be seen only by TEM (transmission electron microscopy), since light microscopes are limited by light itself as they cannot show anything smaller than half the wavelength of visible light, and viruses are much smaller than this. For instance, naked viruses are icosahedral, and their protein coat or capsid is more rigid and withstands a drying process well to maintain their spherical structure in negative stains. Naked human viruses are of three size ranges: 22 to 35 nm (e.g., parvoviruses, enteroviruses, and caliciviruses), 40 to 55 nm (polyomaviruses and papillomaviruses), and 70 to 90 nm (reoviruses, rotaviruses, and adenoviruses).

TEM has therefore made a major contribution to virology, including the discovery of many viruses, the diagnosis of various viral infections and fundamental investigations of virus-host cell interactions. TEM is very useful for the initial identification of unknown viral agents in particular outbreaks, and it is recommended by regulatory agencies for investigation of the viral safety of biological products and/or the cells used to produce them. In research, only TEM has a resolution sufficiently high for discrimination between aggregated viral proteins and structured viral particles. Additionally, the fine detail of viral structure may become visible if viral preparations are rapidly frozen and the vitrified specimens examined by cryo-EM. When combined with data from X-ray diffraction studies, or with electron tomography or single-particle analyses of isolated virions, highly detailed structures can be obtained at near atomic resolution.

Cynthia S. Goldsmith et al. have reported in CLINICAL MICROBIOLOGY REVIEWS, Vol. 22, No. 4, October 2009, p. 552-563 "Modern Uses of Electron Microscopy for Detection of Viruses" that Electron microscopy (EM) is still on the forefront of virus identification, particularly in cases where agents are unknown or unsuspected. EM is a valuable technique in the surveillance of emerging diseases and potential bioterrorism agents. Methods for treatment of or vaccination against viral diseases can be investigated with EM through ultrastructural studies that elucidate both viral makeup and the relationship of viruses to the cells they infect. In 1948, differences between the virus that causes smallpox and the virus that causes chickenpox were demonstrated by EM. The first image of poliovirus was taken in 1952, and virus-host relationships began to be studied in the mid-1950s. Early virus classification depended heavily on morphology as shown by EM, and many of the intestinal viruses were discovered by EM examination of feces after negative staining. One of the main advantages of using EM for viral diagnosis is that it does not require organism-specific reagents for recognizing the pathogenic agent. EM can sometimes elaborate ultrastructural differences in the morphologies of similar viruses. For example, differences in Marburg and Ebola viruses, both of which are in the filovirus family, have been demonstrated by EM. Marburg virus virions are shorter than those of Ebola virus, and their surface spikes differ. Even when EM cannot identify a virus beyond the family level, it at least points the way for more specific identification by other methods such as biochemical assays for specific pathogens. Viruses stored in various solutions for extended periods are not viable for culture detection and may be unsuitable for molecular testing. However, EM does not require live or intact virus. EM is on the front line in surveillance of viruses that might be used by terrorists. The rapid-response laboratories in the Laboratory Response Network are paired with EM facilities across the United States.

Philippe Roingeard has reported in Biol Cell. 2008 August; 100(8): 491-501 "Viral detection by electron microscopy: past, present and future" that the benefits of TEM for resolving diagnostic problems in clinical virology have been clearly illustrated on several occasions. TEM proved essential for the identification of a new morbillivirus (Hendra virus, belonging to the Paramyxoviridae) in horses and humans suffering from fatal respiratory infections in 1995 in Australia. A related virus, the Nipah virus, mostly affecting pig farmers in Malaysia, was discovered in 1990s. The aetiology of the SARS (severe acute respiratory syndrome) pandemic in Hong Kong and Southern China in 2003 was first identified as a coronavirus by TEM, leading to subsequent laboratory and epidemiological investigations. A human monkeypox outbreak in the U.S.A. in 2003 was also diagnosed only once TEM had been used. TEM is occasionally useful for the identification of new subtypes of viruses involved in human gastroenteritis, such as adenovirus or picornavirus. The role of TEM in clinical virology becomes supporting the identification of unknown infectious agents in particular outbreaks. In such investigations, the underlying 'catch-all' principle of this technique is essential for the recognition of an unknown agent. There are also many examples of the usefulness of TEM for identifying the virus involved in particular outbreaks in veterinary medicine.

FIG. 1 is an illustration created at the Centers for Disease Control and Prevention (CDC), and it reveals ultrastructural morphology exhibited by coronaviruses. The spikes that adorn the outer surface of the virus impart the look of a corona surrounding the virion, when viewed electron microscopically. A novel coronavirus, named severe acute respiratory syndrome coronavirus 2 (SARS-CoV-2), was identified as the cause of an outbreak of respiratory illness first detected in Wuhan, China in 2019. The illness caused by this virus has been named coronavirus disease 2019 (COVID-19). The symptoms of COVID-19 are highly variable, ranging from none to severe illness, and to death. Electron microscopy visualization shows that SARS-CoV-2 particles have approximately 150-200 nanometers in diameter. Electron microscopy has been used to determine how the SARS-CoV-2 uses its outer "spike" protein to interact with human cells and infect them. Such studies are really useful in working out how the virus gains access to human cells so scientists can work out how to use drugs to block it.

However, there are some defects associated with the TEMs and methods thereof in the prior art. TEMs are structurally complicated and thus expensive to manufacture. Moreover, virus imaging and analysis based on conventional TEM is manual, tedious, slow, and labor intensive. Advantageously, the present invention provides a new system for virus imaging and analysis that is not only rapid and automatic, but also exhibits numerous technical merits such as simpler structure, better manufacturability, improved cost-effectiveness, and higher reliability, among others.

SUMMARY OF THE INVENTION

One aspect of the invention provides a rapid and automatic virus imaging and analysis system comprising four sub-systems. The first one is one or more electron optical sub-systems (EOSs), each of which has a large field of view (FOV) and is capable of instant magnification switching for rapidly scanning a virus sample. The second one is one or more sample management sub-systems (SMSs), each of which automatically loads virus samples into one of the EOSs for virus sample scanning and then unloads the virus samples from the EOS after the virus sample scanning is completed. The third one is one or more virus detection and classification sub-systems (VDCSs), each of which automatically detects and classifies a virus based on images from the EOS virus sample scanning. The fourth one is a cloud-based collaboration sub-system for (a) analyzing the virus sample scanning images, (b) storing images from the EOS virus sample scanning, and (c) storing & (d) analyzing machine data associated with the EOSs, the SMSs, and the VDCSs.

Another aspect of the invention provides a method of rapid and automatic virus imaging and analysis using the system as described above. The method comprises the following steps:

(i) automatically loading a virus sample from one of the sample management sub-systems into one of the EOSs for virus sample scanning, (ii) automatically scanning the virus sample using the EOS with a larger field of view (FOV) and a lower resolution, and then detecting one or more POIs based on images from the EOS virus sample scanning, (iii) automatically and instantly switching magnification of the EOS and scanning the one or more POIs locations with a smaller FOV and a higher resolution, and automatically classifying a virus based on images from the EOS scanning of the POIs, (iv) optionally repeating steps (ii) and (iii) N times for N more FOVs, wherein integer N≥0, (v) automatically unloading the virus samples from the EOS back into the sample management sub-system, and vi) using the cloud-based collaboration sub-system to:
(1) analyze the virus sample scanning images,
(2) store images from the EOSs virus sample scanning, and
(3) store and analyze machine data associated with the EOSs, the sample management sub-systems, and the virus detection and classification sub-systems.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form in order to avoid unnecessarily obscuring the present invention. Other parts may be omitted or merely suggested.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined.

It is also to be understood that the terminology used herein is for the purpose of describing particular embodiments only and is not intended to limit the scope of the invention. For example, when an element is referred to as being "on", "connected to", or "coupled to" another element, it can be directly on, connected or coupled to the other element or intervening elements may be present. In contrast, when an element is referred to as being "directly on", "directly connected to", or "directly coupled to" another element, there are no intervening elements present.

Throughout the specification and claims, the following terms take the meanings explicitly associated herein, unless the context clearly dictates otherwise. The phrase "in one embodiment" does not necessarily refer to the same embodiment, although it may. Furthermore, the phrase "in another embodiment" does not necessarily refer to a different embodiment, although it may. Thus, as described below, various embodiments of the invention may be readily combined without departing from the scope or spirit of the invention.

In addition, as used herein, the term "or" is an inclusive "or" operator and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Figure 1:
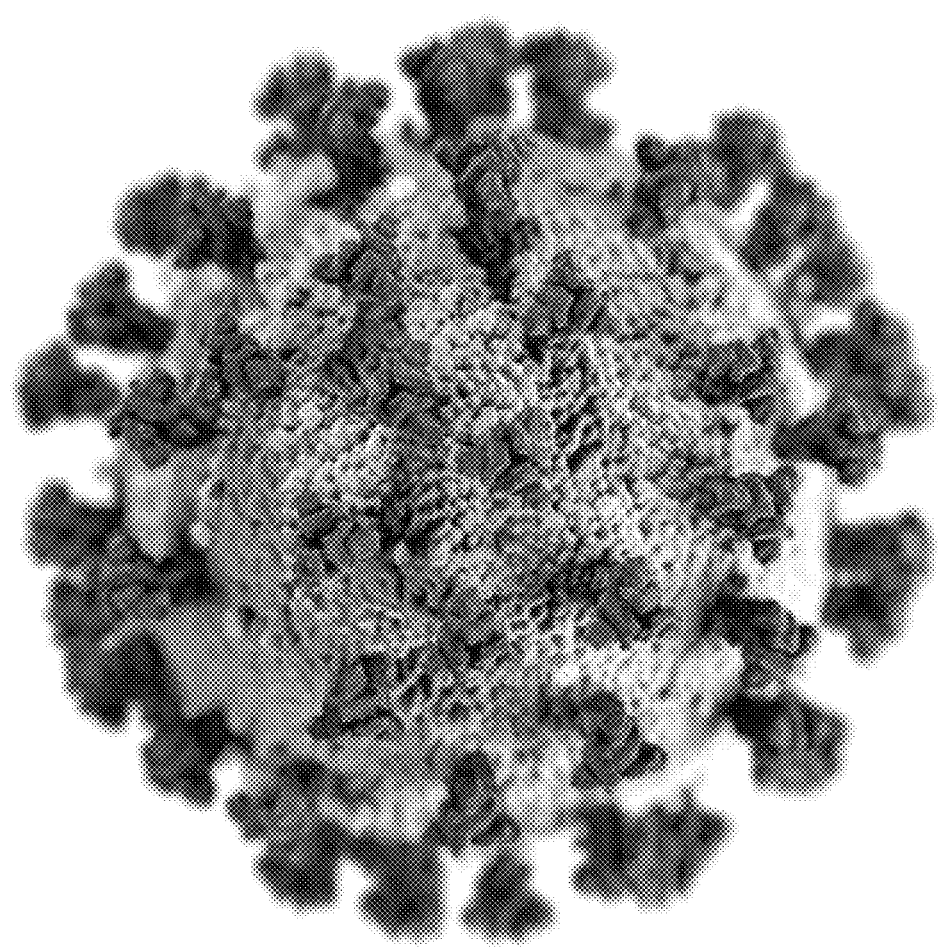
FIG. 1 shows an ultrastructural morphology of coronaviruses created at the Centers for Disease Control and Prevention (CDC).
Figure 2A:
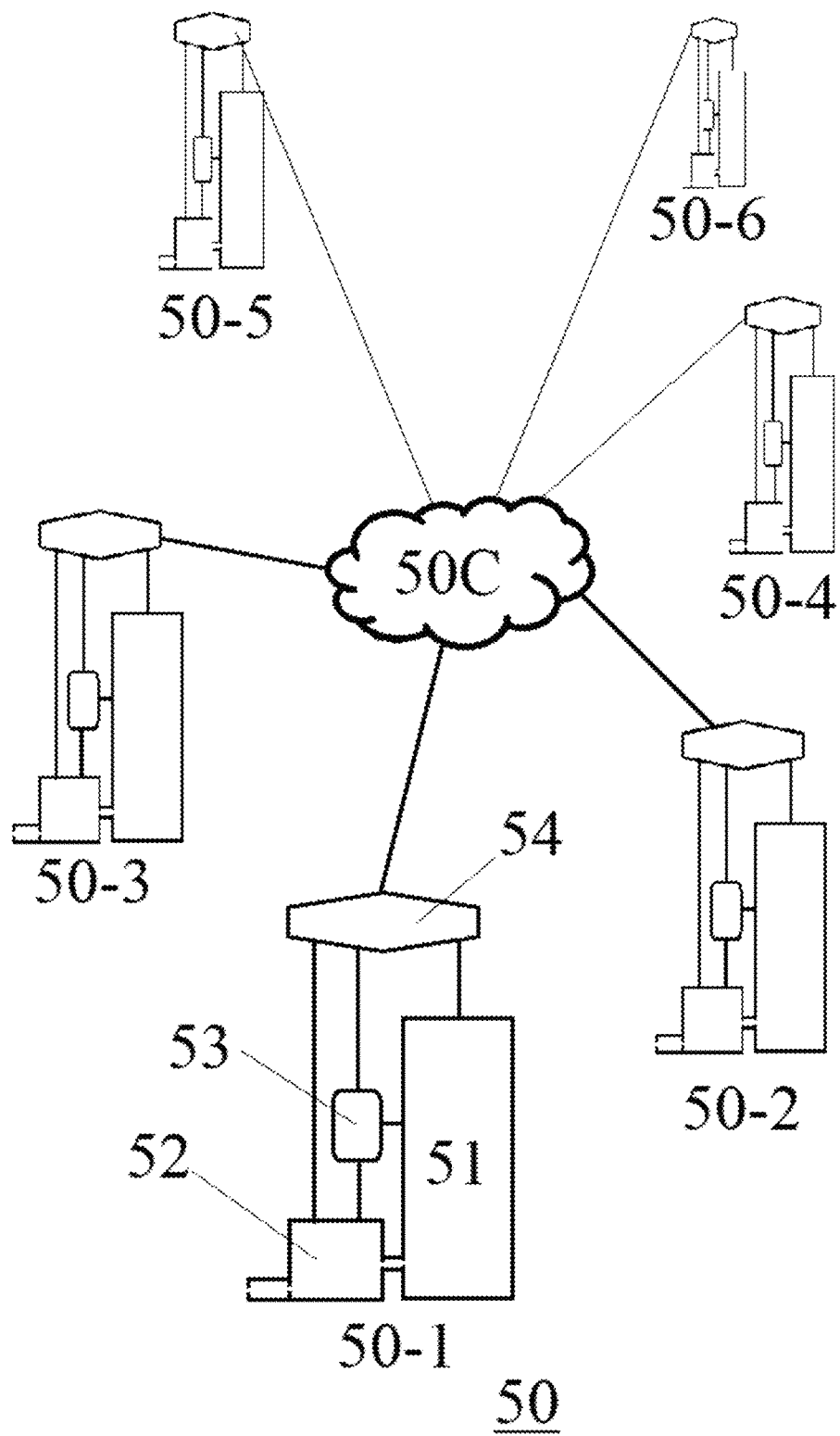
FIG. 2A schematically illustrates a rapid and automatic virus imaging and analysis system in accordance with an exemplary embodiment of the present invention.

Referring to FIG. 2A, a rapid and automatic virus imaging and analysis system 50 includes a cloud-based collaboration sub-system (CCS) 50C and one or more local systems (e.g. 50-1, 5-2, 50-3, 50-4, 50-5, 50-6 . . . and so on) that are communicatively linked to the CCS 50C. Each of the one or more local systems, for example, the local system 50-1, may locate at the user's site such as a hospital or a lab. As shown in FIG. 2A, a representative local system such as 50-1 may include:

(i) an electron optical sub-system (EOS) 51 which has a large field of view (FOV) and which is capable of instant magnification switching for rapidly scanning a virus sample (interchangeable with "specimen");

(ii) a sample management sub-system (SMS) 52 which automatically loads virus samples into the EOS 51 for virus sample scanning and then unloads the virus samples from the EOS 51 after the virus sample scanning is completed; and (iii) a virus detection and classification sub-system (VDCS) 53 which automatically detects and classifies a virus based on images from the EOS 51 virus sample scanning.

The cloud-based collaboration sub-system 50C is typically configured for (a) analyzing the virus sample scanning images in the entire system 50, (b) storing images from the EOS 51 virus sample scanning in the entire system 50, and (c) storing and (d) analyzing machine data associated with the EOSs 51, the sample management sub-systems (SMSs) 52, and the virus detection and classification sub-systems (VDCSs) 53 in the entire system 50. In some embodiments, the cloud-based collaboration sub-system 50C may control local system 50-1 though a corresponding controller or control circuit 54.

Figure 2B:
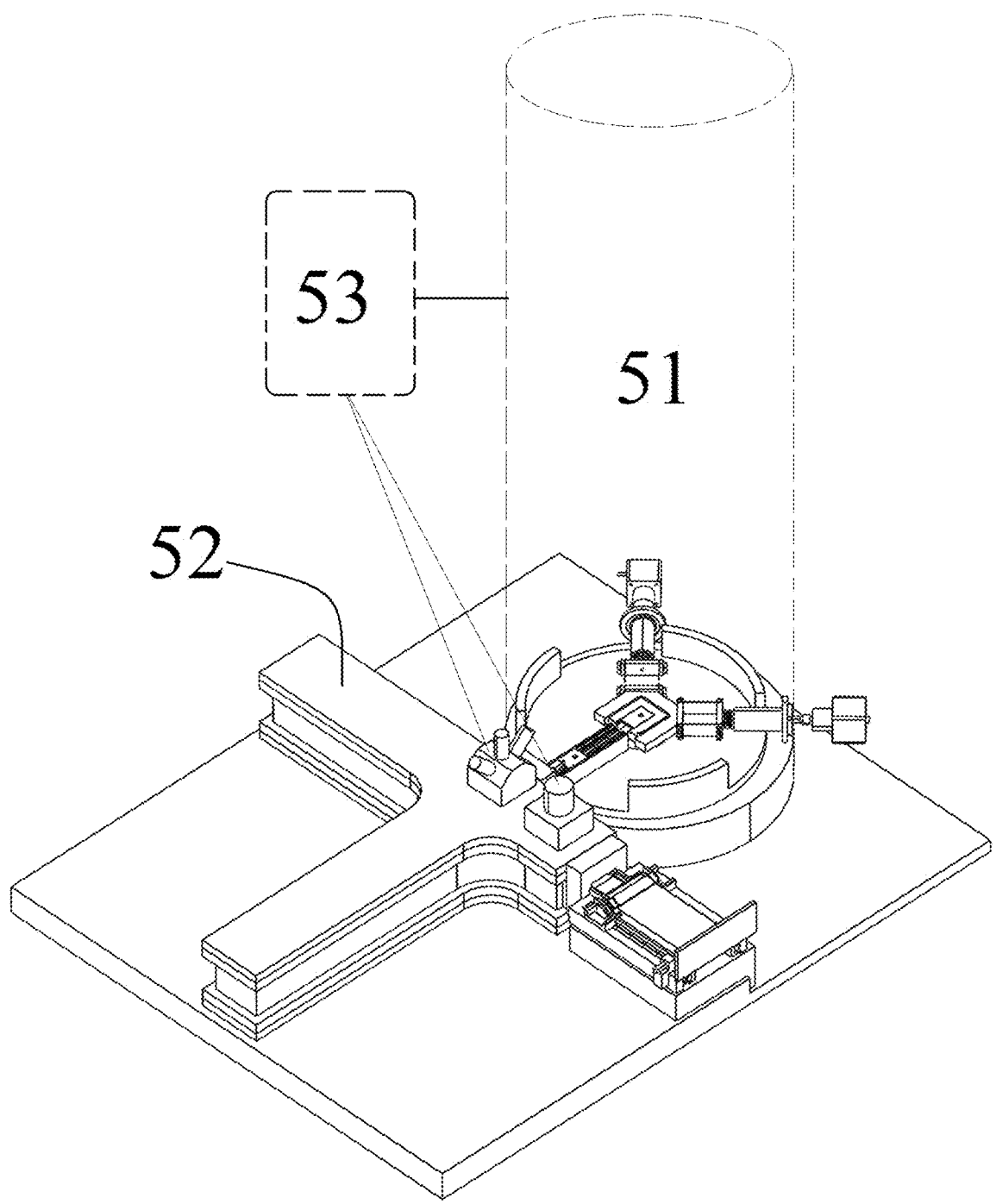
FIG. 2B schematically illustrates a local system within the system of FIG. 2A that includes an EOS, a SMS and a VDCS in accordance with an exemplary embodiment of the present invention.
Figure 3:
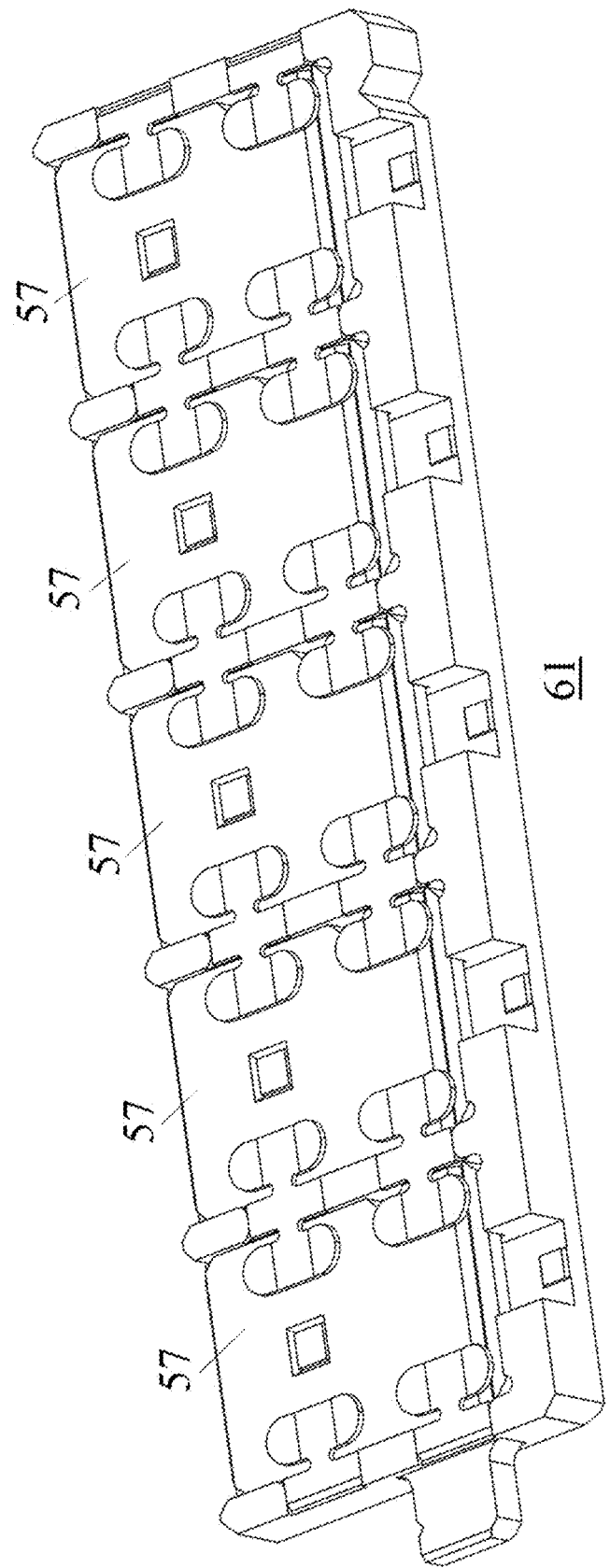
FIG. 3 shows the structure of a multiple adapter cartridge used in the SMS in accordance with an exemplary embodiment of the present invention.
Figure 4:
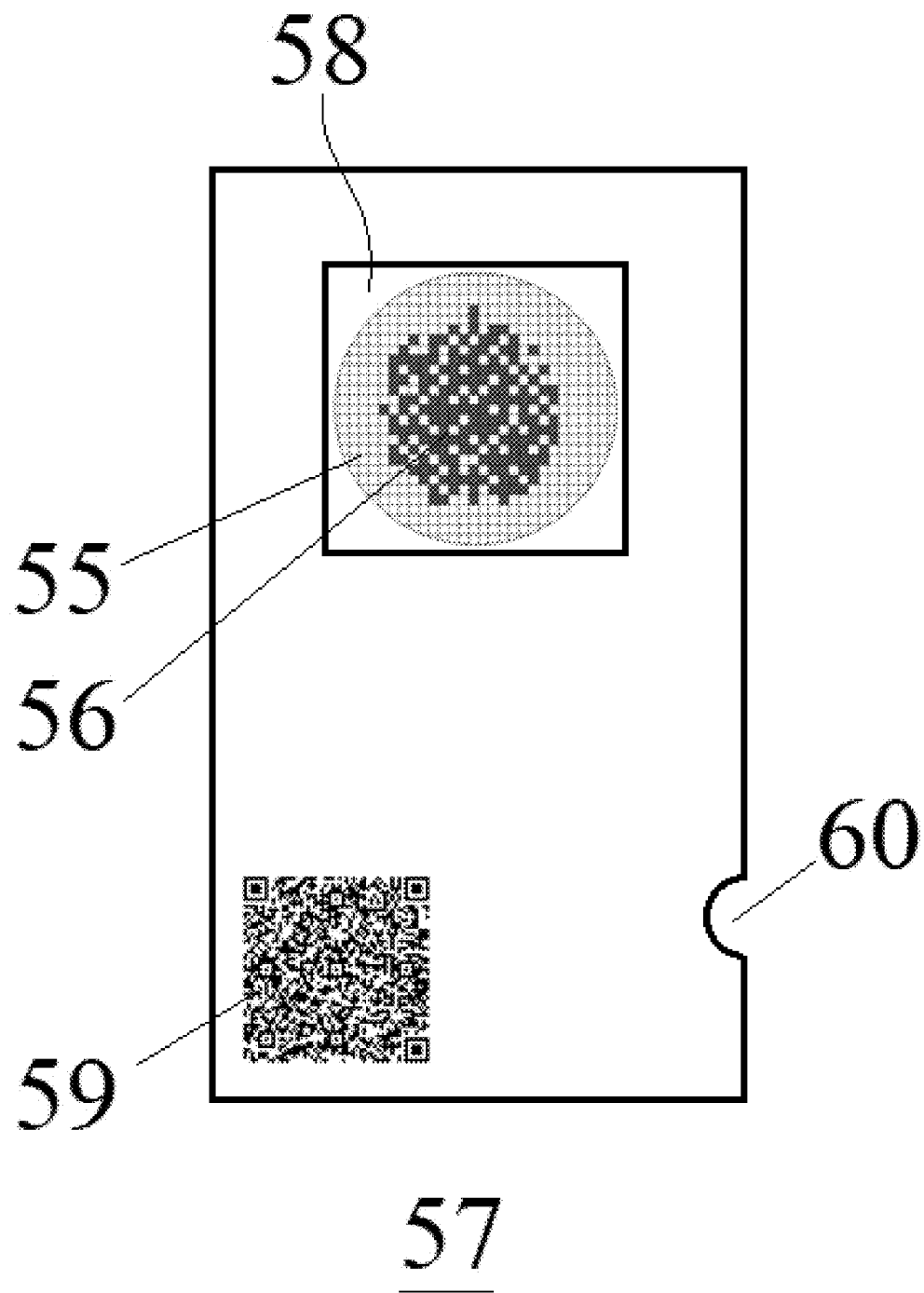
FIG. 4 illustrates the structure of a grid adapter in the SMS in accordance with an exemplary embodiment of the present invention.
Figure 5:
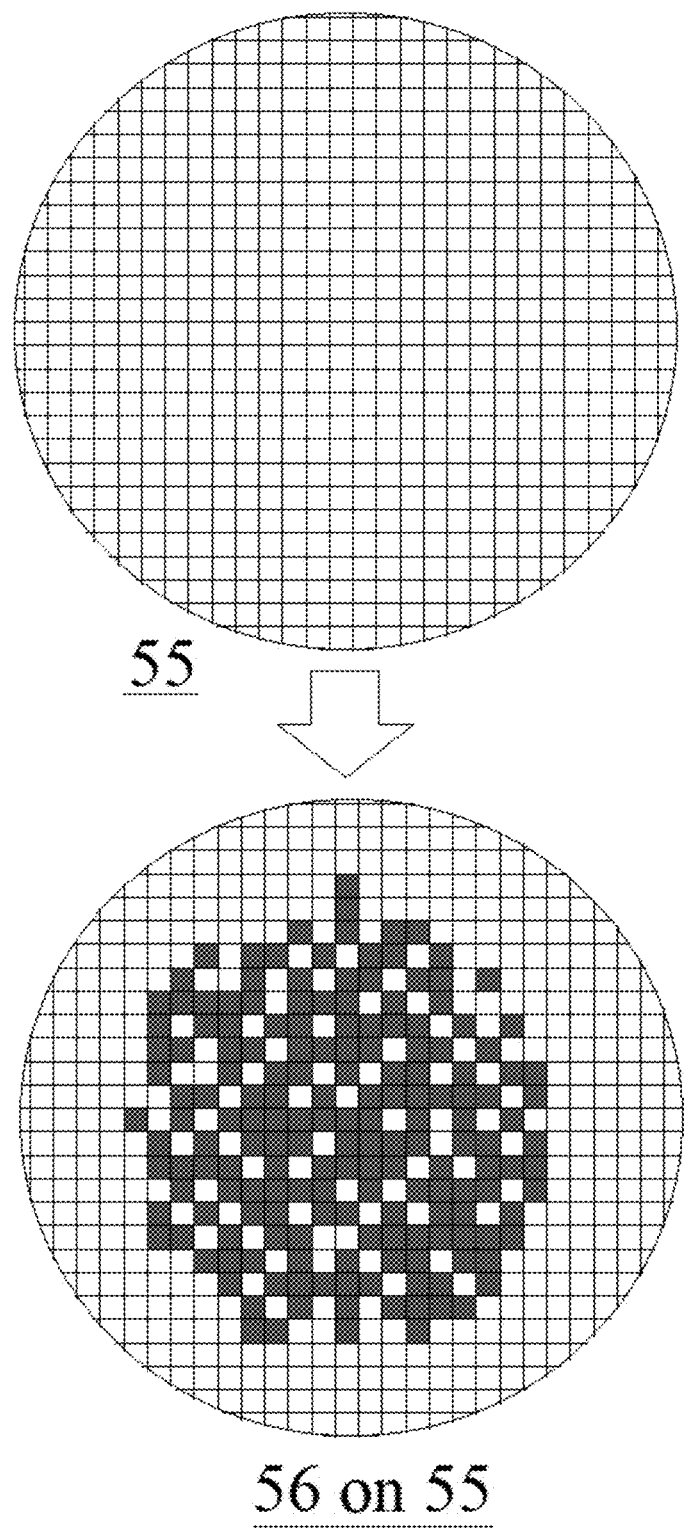
FIG. 5 demonstrates a process of loading a virus sample on a sample grid in accordance with an exemplary embodiment of the present invention.

Referring to FIG. 2B, an exemplary local system such as 50-1 may include an electron optical sub-system (EOS) 51 based on an electron microscope such as STEM, a sample management sub-system (SMS) 52, and a virus detection and classification sub-system (VDCS) 53. The sample management sub-system 52 comprises multiple adapter cartridges 61 as shown in FIG. 3. Each of the adapter cartridges 61 holds or carries an array of grid adapters 57. Although the array of the grid adapters 57 in FIG. 3 is a single row of grid adapters 57 arranged horizontally, it is contemplated that the array of the grid adapters 57 may be stacked into a column, i.e. arranged vertically (not shown). As shown in FIG. 4, a sample grid 55 may be mounted on each of the grid adapters 57. The grid adapter 57 may include (1) a grid mounting area such as a receptacle 58 for mounting a sample grid 55 thereon, (2) a machine-readable label 59 containing information related to the virus sample 56 loaded on the sample grid 55, and (3) an adapter orientation controller 60 such as a notch on an edge of the grid adapter 57. As shown in FIG. 5, the sample grid 55 is configured for loading a virus sample 56. Examples of the sample grid 55 may include a metal grid such as a 3 mm Cu-grid, or a semiconductor grid such as a MEMS grid configured for TEM/STEM samples. Examples of the virus sample 56 in a diagnostic EM laboratory may include body fluids, stool, urine, cerebrospinal fluid (CSF), bronchoalveolar lavage fluid, tears, blister fluid, or aspirates of a human or an animal. For viewing particulate specimens such as viruses, a support membrane may be placed onto the grids to hold the small particles. Examples of support films include Formvar, Collodion, Butvar, and Pioloform. Negative staining may be employed for contrasting a thin virus specimen with an optically opaque fluid, in which the background is stained, leaving the actual virus specimen untouched and thus visible. Positive staining in which the actual virus specimen is stained may be employed too, if necessary. Thin sectioning may be used for cells and tissues because they are too thick for an electron beam to penetrate. Rapid freezing of virus suspensions and examination of the vitrified samples permits examination of non-chemically altered structures. Specimens may be flash-frozen in liquid nitrogen, transferred to the microscope in a special cold chamber, and viewed frozen.

Figure 6:
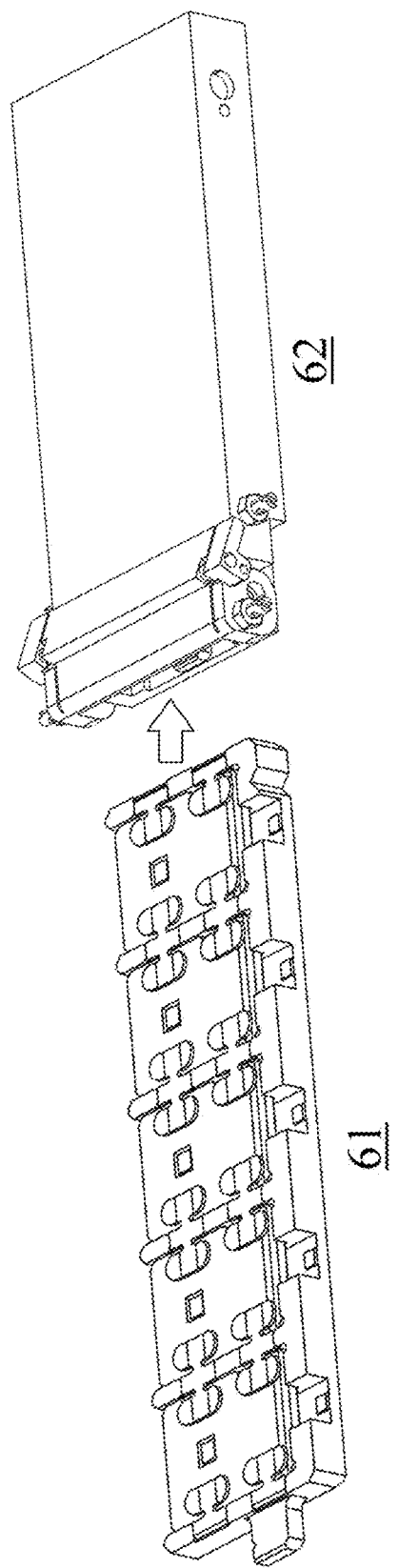
FIG. 6 shows a Front Opening Unified Pod (FOUP) for receiving and storing an adapter cartridge in accordance with an exemplary embodiment of the present invention.
Figure 7:
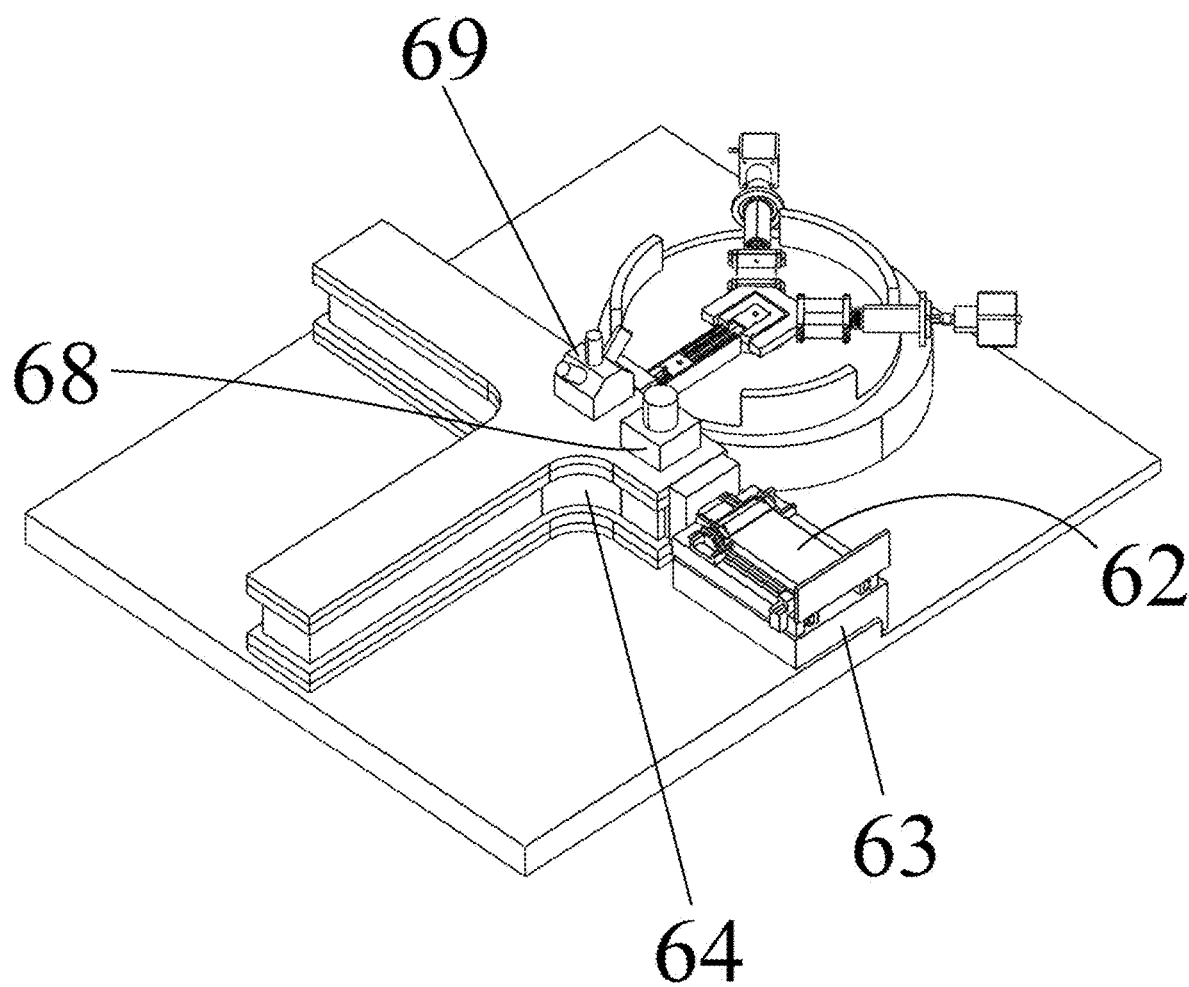
FIG. 7 illustrates the external structure of a sample management sub-system (SMS) in accordance with an exemplary embodiment of the present invention.
Figure 8:
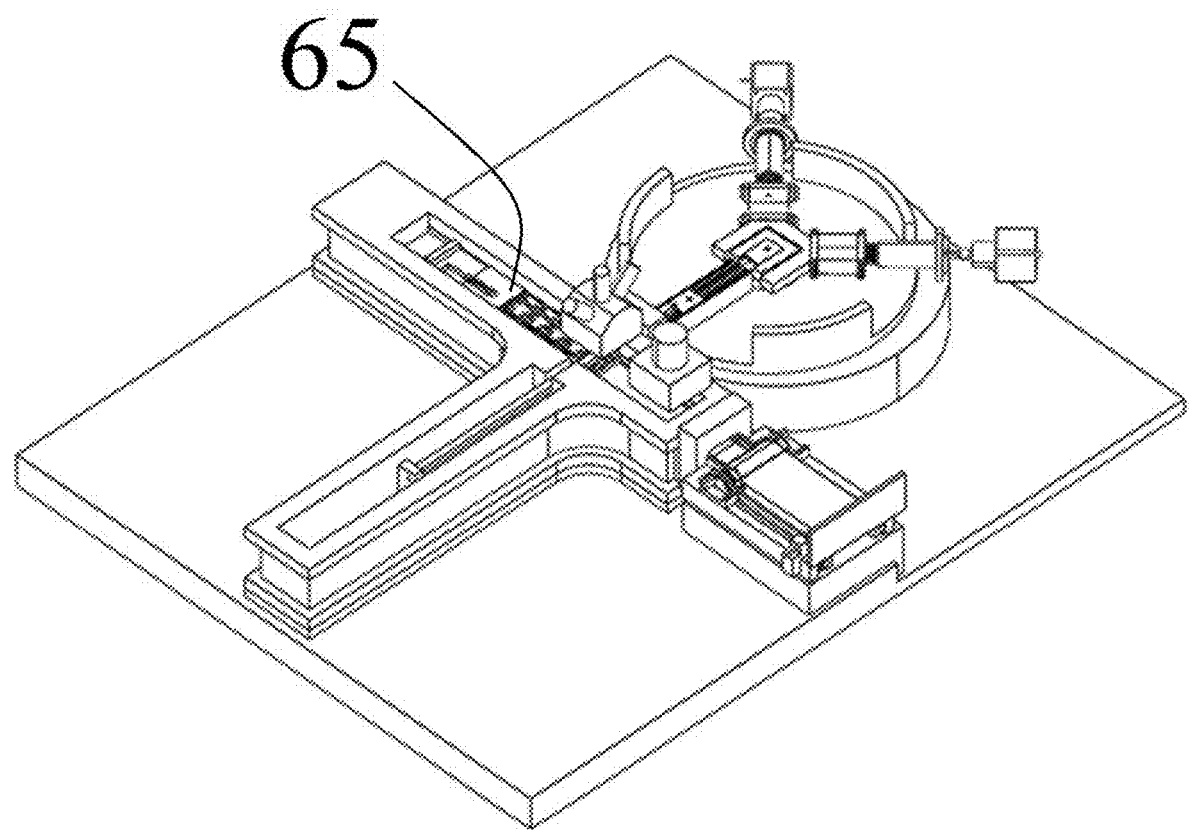
FIG. 8 shows the loadlock chamber of a loadlock system in the SMS of FIG. 7 in accordance with an exemplary embodiment of the present invention.

Referring to FIG. 6, the sample management sub-system 52 may include a cartridge container 62 such as a Front Opening Unified Pod (FOUP) for receiving and storing one or more adapter cartridges 61. Referring to FIG. 7, the sample management sub-system 52 comprises a loadport 63 for receiving the cartridge container 62 and for placing the cartridge container 62 thereon. The sample management sub-system 52 may further include a loadlock system 64 with a loadlock chamber 65 as shown in FIG. 8. In operation, the loadlock system 64 may automatically load each of the multiple adapter cartridges 61 stored in the cartridge container 62 on the loadport 63 into the loadlock chamber 65. An optical camera module 68 in the sub-system 52 is configured for automatically sensing the presence or absence of a grid adapter 57 within the loadlock chamber 65, reading a label 59 on the grid adapter 57 (if present within the loadlock chamber 65) that contains information related to the virus sample 56, and storing information related to the virus sample 56. An optical imaging system 69 with multiple cameras in the sub-system 52 is configured for automatically sensing the presence or absence of a sample 56 on a sample grid 55 within the loadlock chamber 65, generating a sample distribution map of the sample grid 55 (as shown in FIG. 5) and generating a surface depth profile/landscape of the sample distribution map.

After the loadlock system 64 automatically loads an adapter cartridge 61 stored in the cartridge container 62 on the loadport 63 into the loadlock chamber 65, it automatically loads each of the grid adaptors 57 held on the adapter cartridge 61 into the EOS 51 for virus sample 56 scanning. After the scanning is completed, the loadlock system 64 automatically unloads each of the grid adaptors 57 from the EOS 51 back to the adapter cartridge 61 which is still waiting inside the loadlock chamber 65, and then automatically unloads the adapter cartridge 61 back to the cartridge container 62 on the loadport 63.

Figure 9:
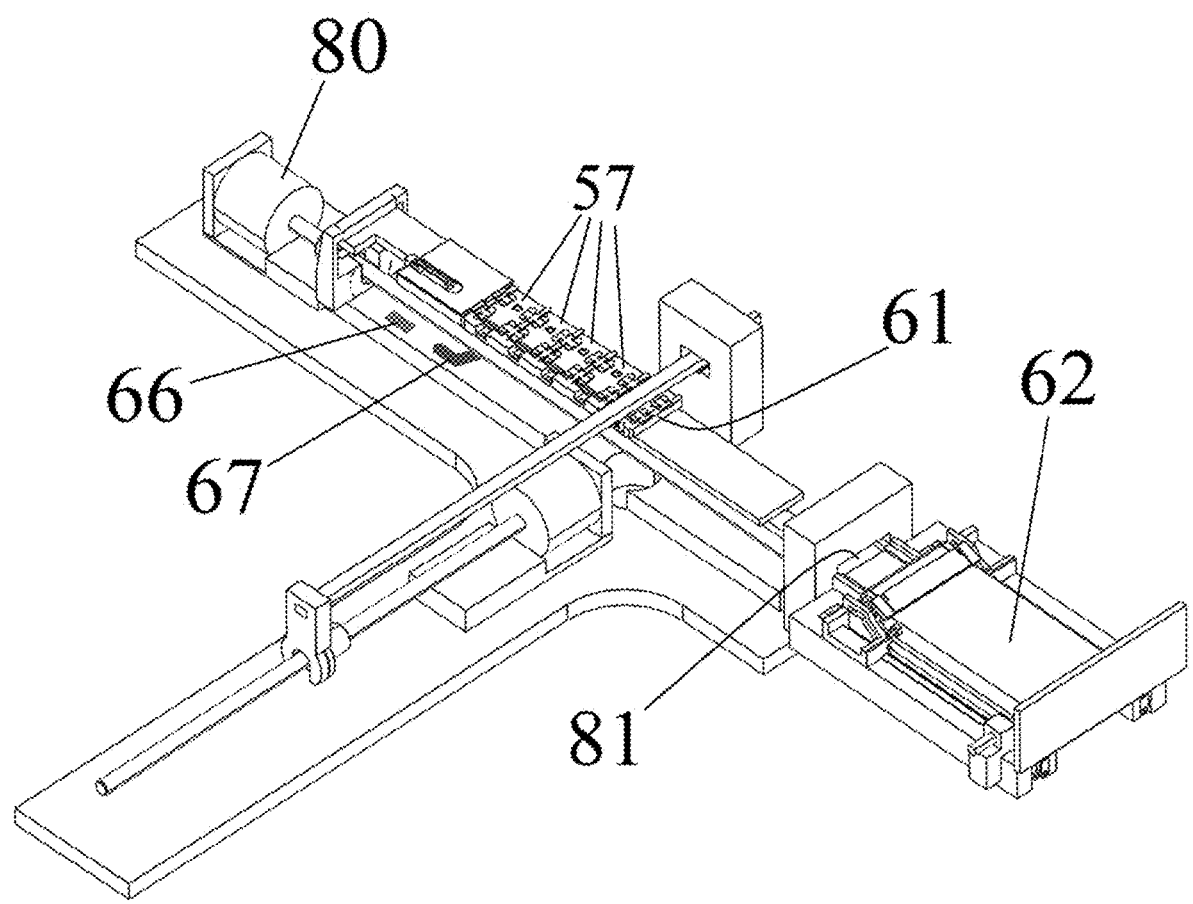
FIG. 9 illustrates the internal structure of a sample management sub-system (SMS) in accordance with an exemplary embodiment of the present invention.

Referring now to FIG. 9, a cooling system 66 such as a semiconductor cooling pad within the loadlock chamber 65 may be configured for cooling down the samples 56 to a pre-defined temperature. A discharging device 67 within the loadlock chamber 65 may be configured for removing electrostatic charge (if any) from the sample 56. The loadlock chamber 65 may be equipped with a loadlock slit valve 81. A cartridge carrier 80 including e.g. a motor may be configured to automatically load each of the multiple adapter cartridges 61 stored in the cartridge container 62 on the loadport 63 into the loadlock chamber 65 through the loadlock slit valve 81. The motor may be selected from linear motors, step motors, magnetic levitations, planar motors, piezoelectric motors, and pulse motors. After the virus sample 56 scanning in the EOS 51 is completed and the corresponding grid adaptor 57 is moved from the EOS 51 back to the corresponding adapter cartridge 61, the cartridge carrier 80 automatically unloads each of the adapter cartridge 61 out from the loadlock chamber 65 and back into the cartridge container 62 through the loadlock slit valve 81.

Figure 10:
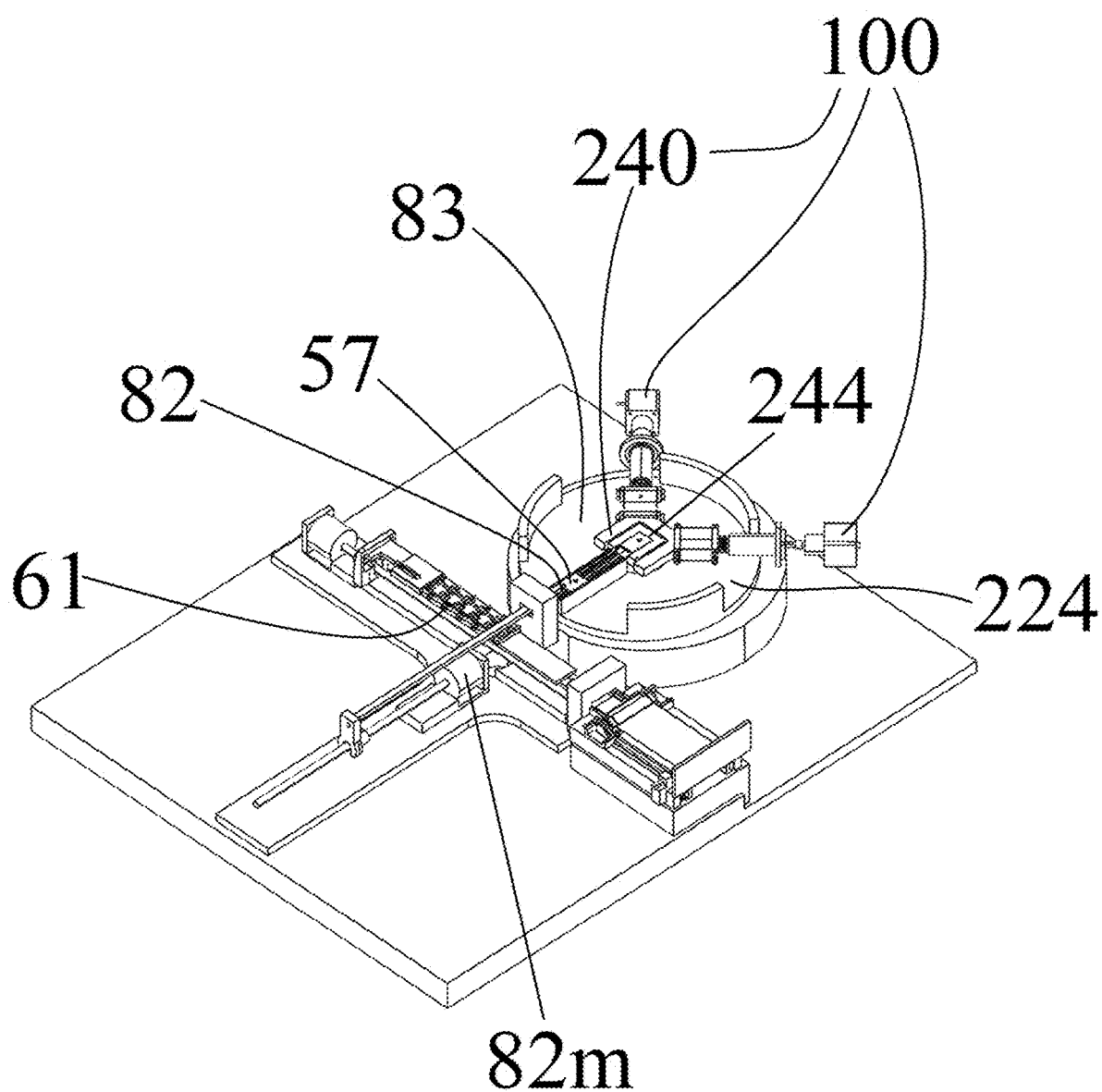
FIG. 10 illustrates the working relationship between a SMS and an EOS with a stage in accordance with an exemplary embodiment of the present invention.

Referring to FIG. 10, the sample management sub-system 52 may be equipped with an adapter gripper 82 that is driven by a motor 82m. The motor 82m may be selected from linear motors, step motors, magnetic levitations, planar motors, piezoelectric motors, and pulse motors. The EOS 51 (as shown in FIG. 2B) comprises a column chamber 83 with a column slit valve 84. The adapter gripper 82 is configured for automatically loading each of the grid adapters 57 held by the adapter cartridge 61 within the loadlock chamber 65 into the column chamber 83 through the column slit valve 84. After the scanning of the corresponding virus sample 56 in the EOS 51 is completed, the adapter gripper 82 automatically unloads each of the grid adapters 57 from the column chamber 83 back to the adapter cartridge 61 in the loadlock chamber 65 through the column slit valve 84.

Figure 11:
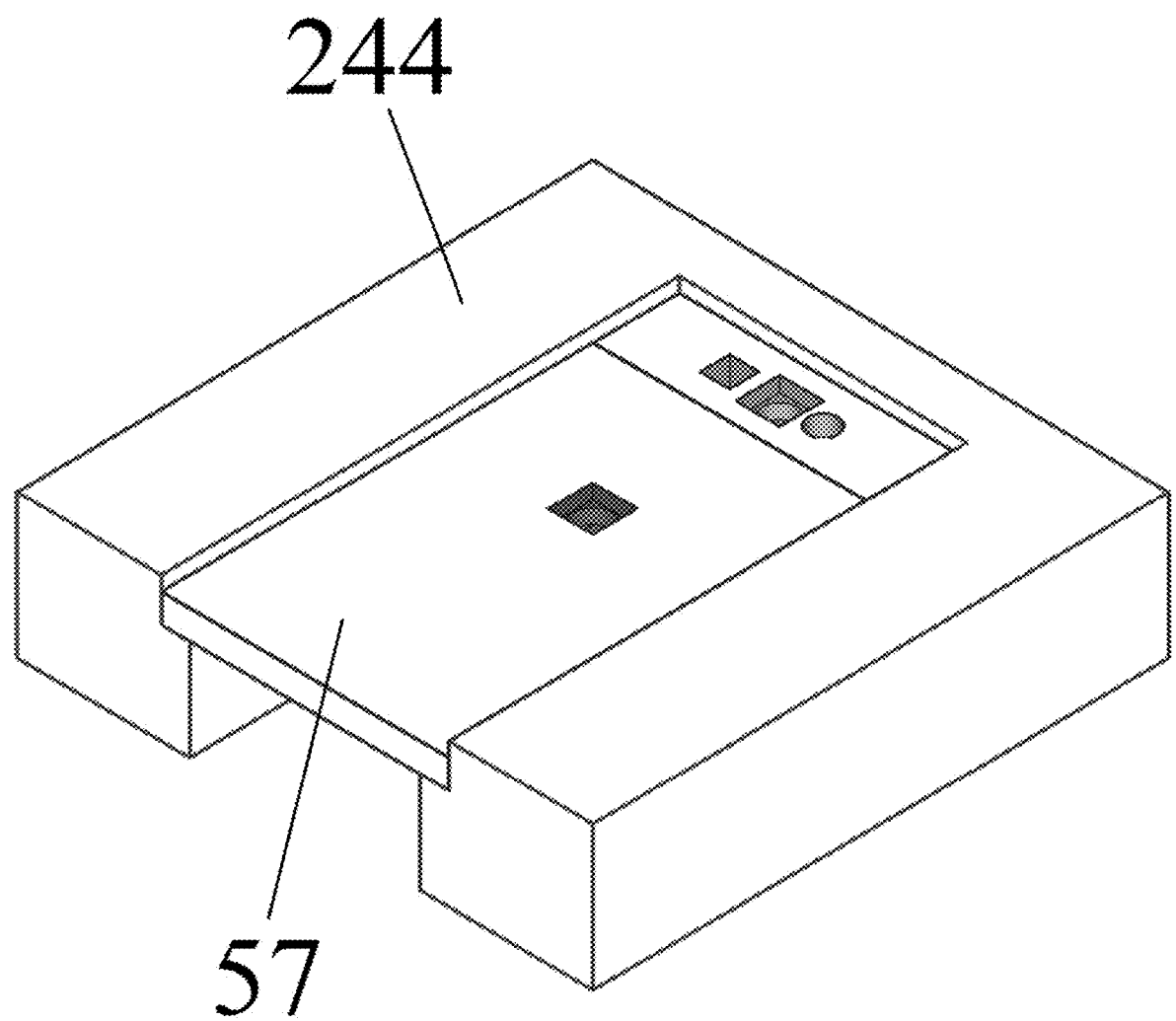
FIG. 11 shows a specimen table in the EOS in accordance with an exemplary embodiment of the present invention.

In some specific embodiments, the EOS 51 includes a specimen table 244 within the column chamber 83. The adapter gripper 82 automatically loads each of the grid adapters 57 held by the adapter cartridge 61 in the loadlock chamber 65 to the specimen table 244 through the column slit valve 84, and then automatically released the grid adapter 57 onto the specimen table 244, as illustrated in FIG. 11. After the scanning of the corresponding virus sample 56 in the EOS 51 is completed, the adapter gripper 82 automatically grips the grid adapter 57 on the specimen table 244 and unloads it from the column chamber 83 back to the adapter cartridge 61 waiting in the loadlock chamber 65 through the column slit valve 84.

Referring back to FIG. 10, the EOS 51 may further include an objective lens 224 and a stage 240 such as (but not limited to) a specimen stage 240 within the column chamber 83. The specimen stage 240 has an empty space as a receptacle for accommodating the specimen table 244. The objective lens 224 has a planar surface configured for the specimen table 244 to sit on and slide on. The specimen stage 240 can move the specimen table 244 by sliding it to a plurality of predetermined positions on the planar surface of the objective lens 224, and to hold the specimen table 244 on each of the predetermined positions for a period of time sufficient for an EOS 51 examination.

As will be described and illustrated with more details, the specimen stage 240 comprises an elastic protrusion and one or more elastic force receiving parts surrounding the receptacle such as a side wall opposite to the elastic protrusion, a side wall neighboring the elastic protrusion, and/or protrusion(s) on the side wall opposite to the elastic protrusion and/or the side wall neighboring the elastic protrusion. The elastic protrusion may be configured to push or press the specimen table 244 against the one or more elastic force receiving parts of the specimen stage 240 after the specimen table 244 is placed into the receptacle, so that the orientation and the position of the specimen table 244 is fixed relative to the specimen stage 240. When a disturbing vibration between the objective lens 224 and the specimen stage 240 occurs during the period of EOS 51 examination time, the elastic protrusion will absorb the disturbing vibration to an effect that the specimen table 244 remains stationary relative to the objective lens 224.

Referring again to FIG. 10, the EOS 51 further comprises a stage driving system 100 for moving the stage such as the specimen stage 240, for example, on the planar surface of the objective lens 224. As will be described and illustrated with more details, the stage driving system 100 comprises a first actuator configured to move a first shaft; a second actuator configured to move a second shaft; a first elastic connector connecting the first shaft and the specimen stage 240; and a second elastic connector connecting the second shaft and the specimen stage 240. The specimen stage 240 is moved around by combined elastic forces from the two elastic connectors that are deformed by the one or two actuators.

Figure 12:
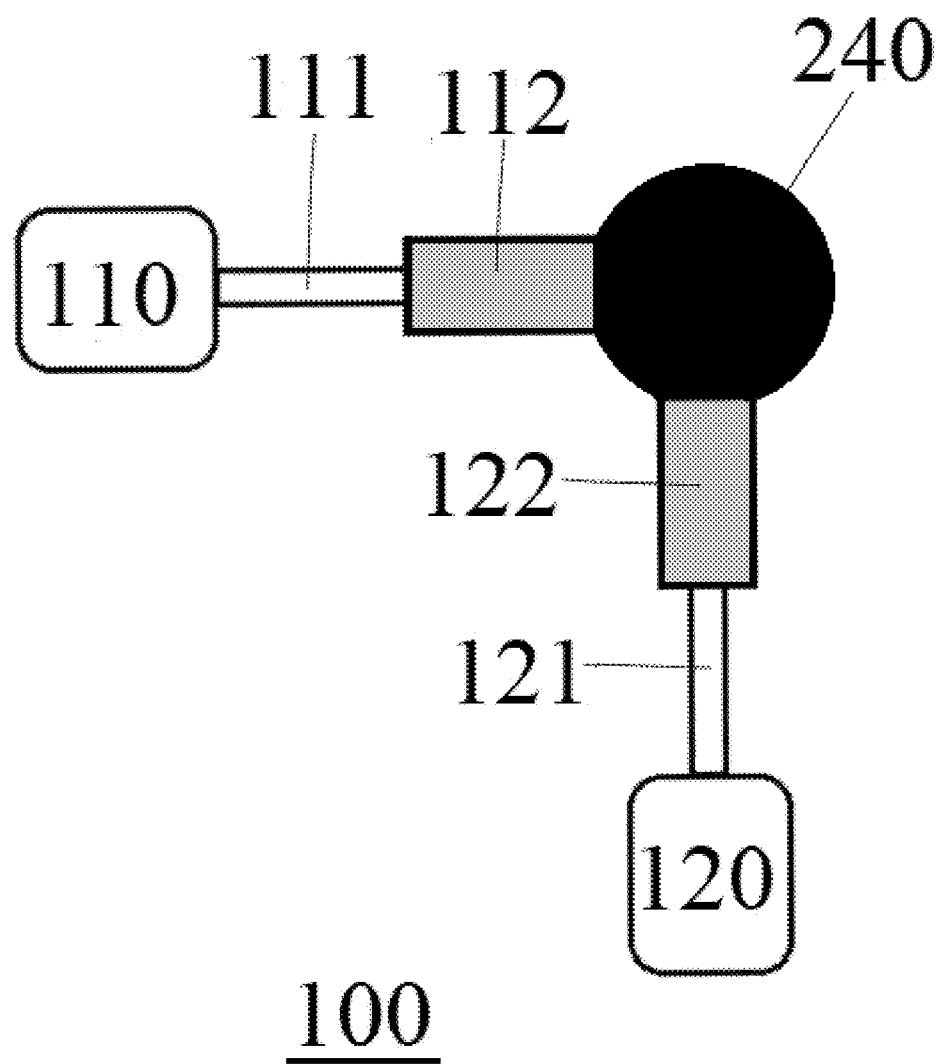
FIG. 12 schematically illustrates a general driving system of the EOS in accordance with an exemplary embodiment of the present invention.
Figure 13:
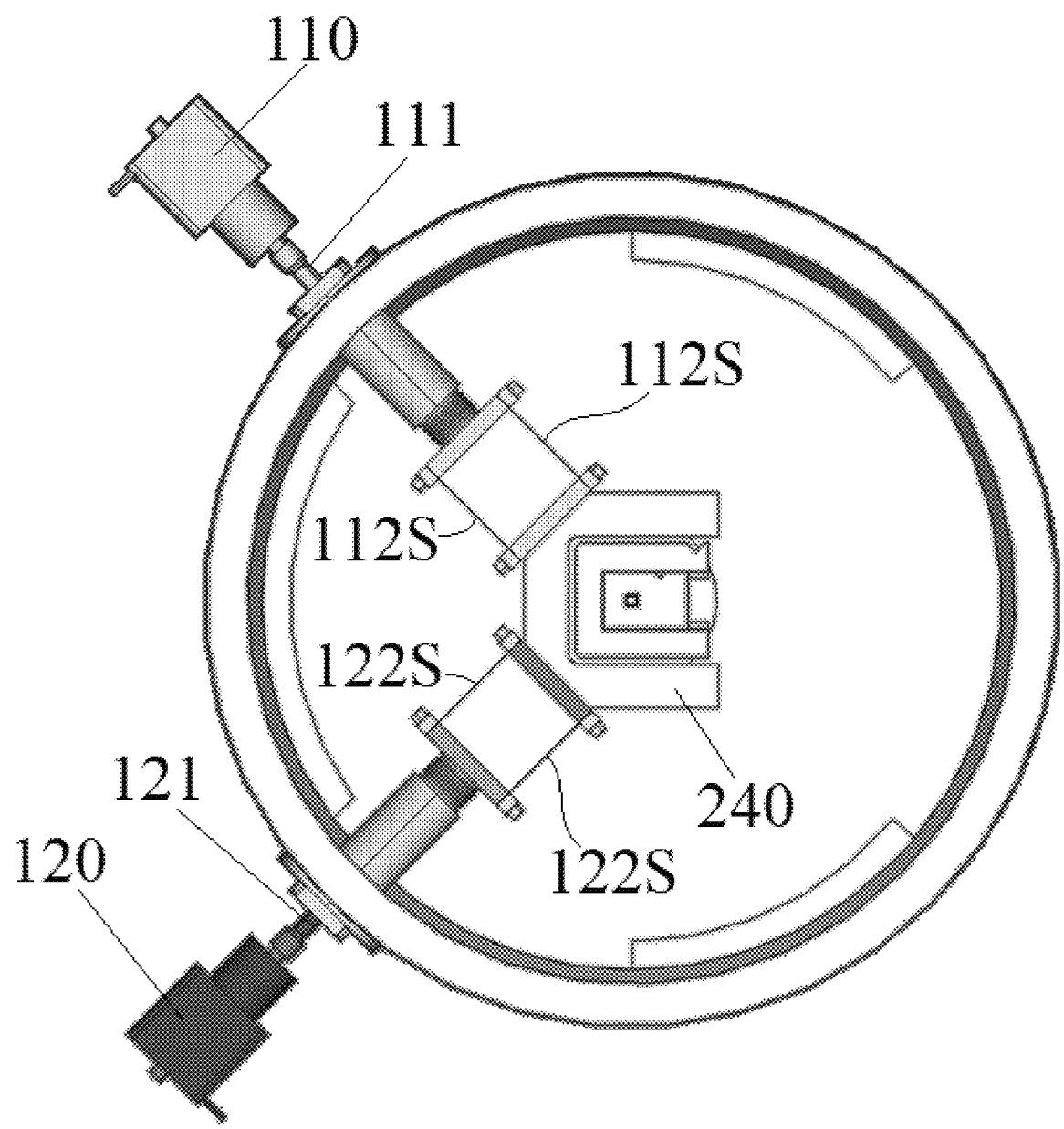
FIG. 13 schematically illustrates a driving system of the EOS using spring leaves as the elastic connector in accordance with an exemplary embodiment of the present invention.

With reference to FIG. 12 for more details, the driving system 100 includes a first actuator 110 configured to move a first shaft 111, a second actuator 120 configured to move a second shaft 121, the stage 240 as described above, a first elastic connector 112 connecting the first shaft 111 and the stage 240; and a second elastic connector 122 connecting the second shaft 121 and the stage 240. The driving system 100 may be placed inside a vacuum environment or an atmospheric environment. The first and second actuators (110, 120) may be selected from two motors such as linear motors, step motors, magnetic levitations, planar motors, piezoelectric motors, and pulse motors. The first elastic connector 112 may include a block of elastic material such as polybutadiene, butyl rubber, silicone rubber and the like as shown in FIG. 12, or two or more spring leaves 112S such as copper spring leaves as shown in FIG. 13. Similarly, the second elastic connector 122 may include a block of elastic material such as polybutadiene, butyl rubber, silicone rubber and the like as shown in FIG. 12, or two or more spring leaves 122S such as copper spring leaves as shown in FIG. 13.

In preferred embodiments, the first actuator 110 and the second actuator 120 are identical; the first shaft 111 and the second shaft 121 are identical; and the first elastic connector 112 and the second elastic connector 122 are identical.

As shown in FIGS. 12 and 13, the first actuator 110 may be configured to move the first shaft 111 along a longitudinal direction thereof ("the first longitudinal direction"). The second actuator 120 may be configured to move the second shaft 121 along a longitudinal direction thereof ("the second longitudinal direction"). The first longitudinal direction and the second longitudinal direction may have an angle of greater than 0° and less than 180° such as 85°-95° or about 90°.

Figure 14:
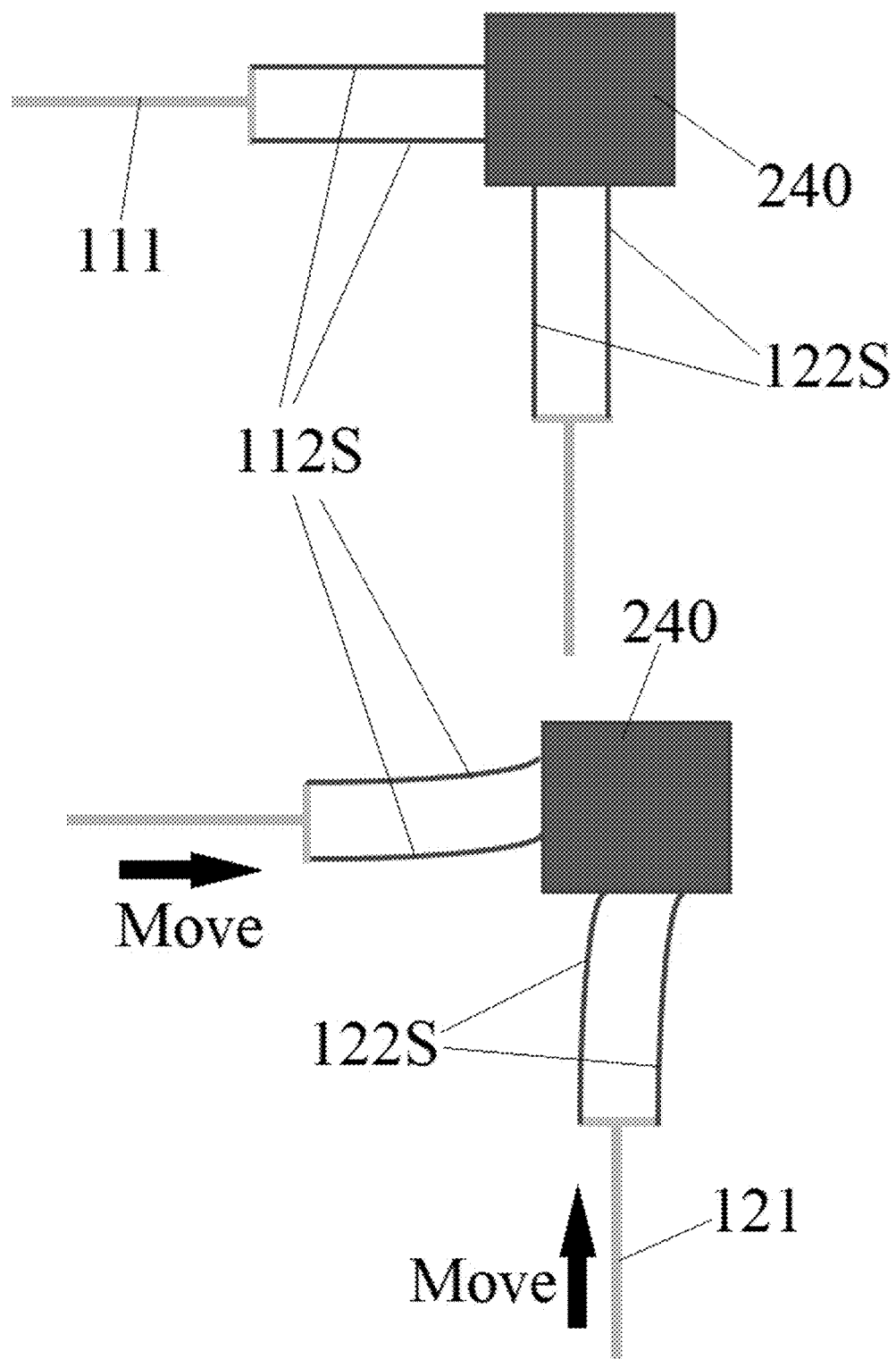
FIG. 14 schematically illustrates a working state of the driving system of FIG. 13 in accordance with an exemplary embodiment of the present invention.

Referring to FIG. 14, the stage 240 may be moved around on a X-Y plane such as a horizontal plane by combined elastic forces from the two elastic connectors (112, 122) that are deformed by the one or two actuators (110 and/or 120). For example, by moving (pushing or pulling) shafts 111 and 121 along the first longitudinal direction and the second longitudinal direction respectively for calculated distances (same or different), a combined elastic forces may be generated from spring leaves 112S and 122S that are bent to the same degree or different degrees. Such a combined elastic forces may position the stage 240 at a desirable location on the X-Y plane.

Figure 15:
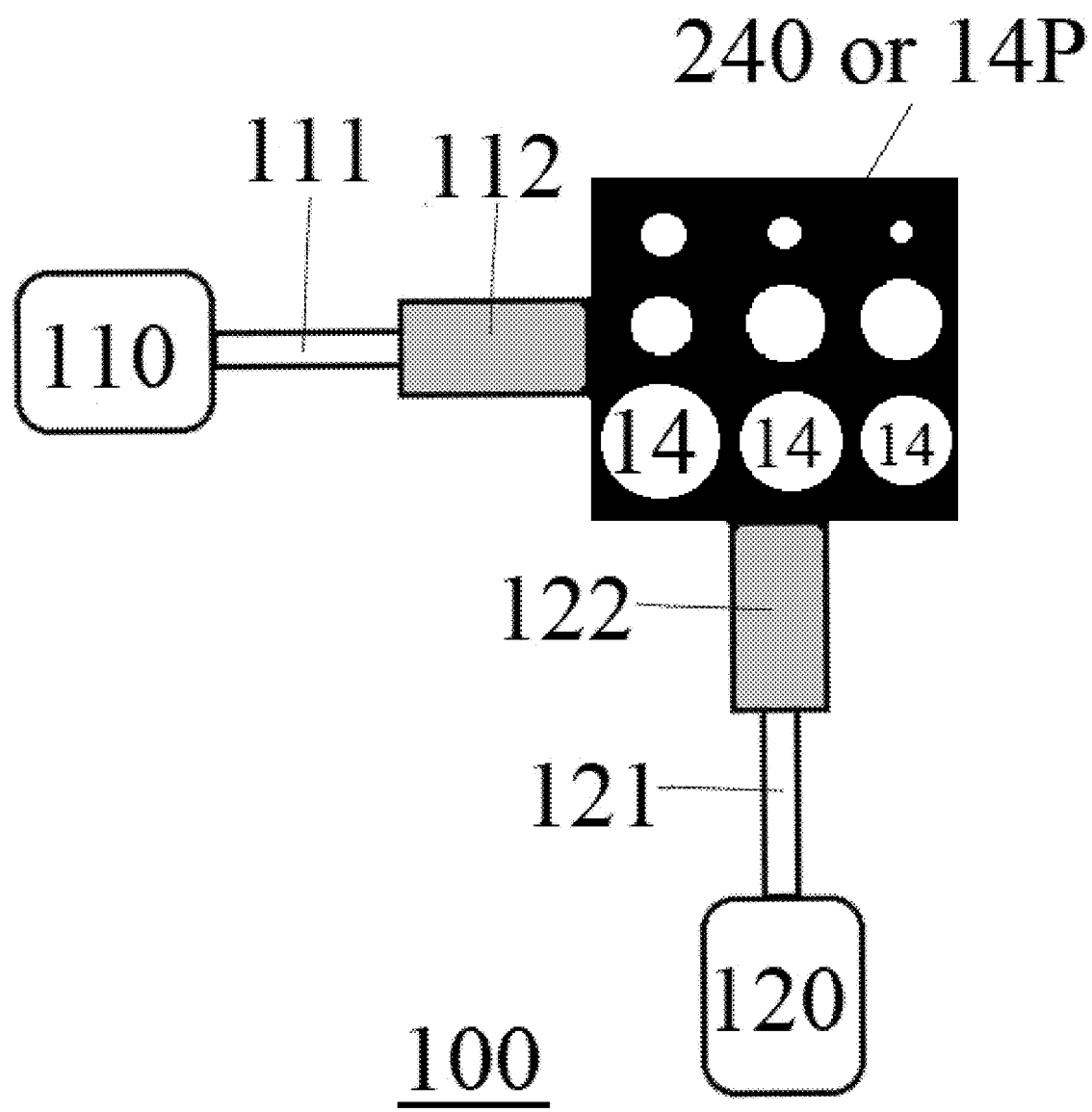
FIG. 15 shows a design of the stage in the EOS as a plate with two or more apertures in accordance with an exemplary embodiment of the present invention.

In various embodiments, the stage 240 may be configured to carry a control device, a sample (e.g. a specimen table) or a workpiece. It is also possible that at least a part of the stage itself is a control device, a sample (e.g. a specimen table) or a workpiece. As shown in FIG. 15, the stage 240 itself may be a control device such as an electron beam control device, which may be e.g. a (metal) plate 14P with two or more apertures 14 of different sizes for electron beam to pass through, such as a matrix of apertures 14.

Figure 16:
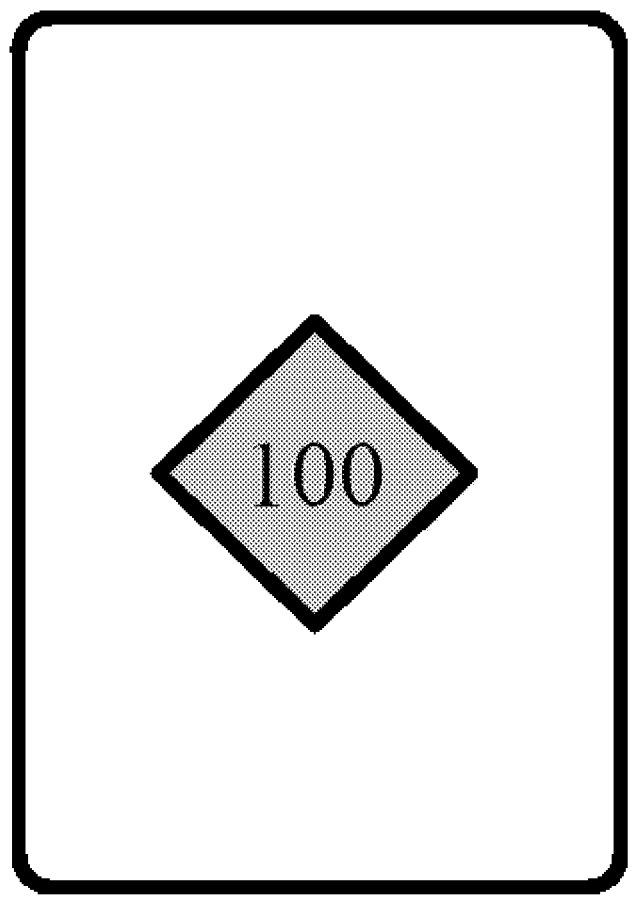
FIG. 16 schematically illustrates a general apparatus/device comprising the driving system of FIG. 12 in accordance with an exemplary embodiment of the present invention.

As shown in FIG. 16, a further aspect of the invention provides an apparatus/device 130 comprising a driving system 100 as escribed above. The apparatus/device 130 may be a machine tool, an analytical instrument, an optical microscope, and an apparatus of charged-particle beam such as electron microscope and an electron-beam lithographical apparatus.

Figure 17:
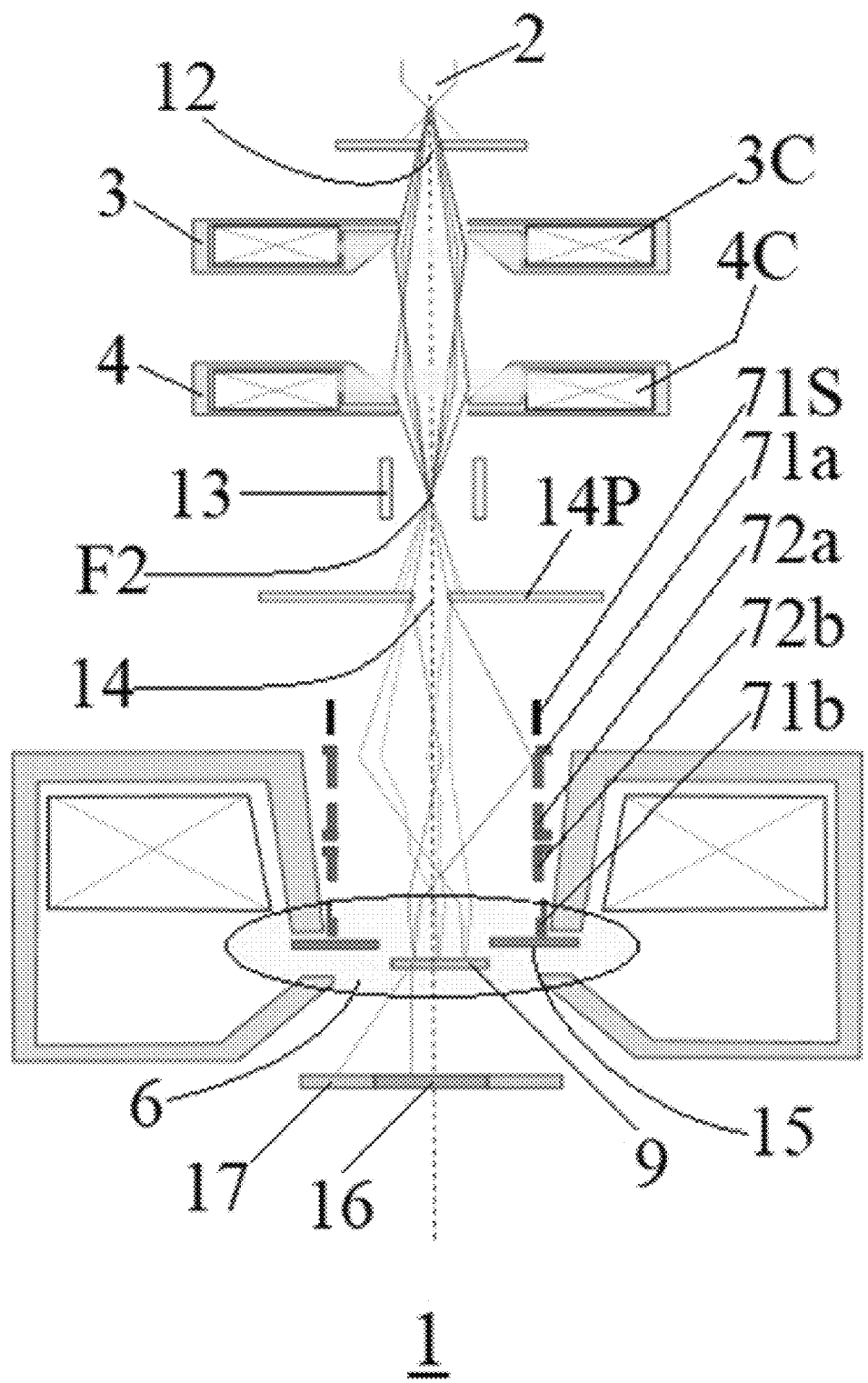
FIG. 17 shows an electron microscope in the EOS including the plate of FIG. 15 in accordance with an exemplary embodiment of the present invention.

For example, the plate 14P as shown in FIG. 15 may be used in an electron microscope 1 as shown in FIG. 17. For conciseness, components 110-112 and 120-122 in FIG. 15 are not shown (omitted) in FIG. 17. With reference to FIG. 17, the source of charged particles may be an electron gun 2 configured to emit an electron beam through gun aperture 12. Along the beam trajectory, co-condenser 3 with magnetic coil 3C is placed between gun aperture 12 and co-condenser 4 with a magnetic coil 4C. The electron beam is focused to crossover spot F2 before it passes through beam blanking 13. After the beam passes through objective aperture 14 and stigmator 71s, it is deflected by an upper deflector 71a and a lower deflector 71b in a macroscopic deflection subsystem. It can also be deflected by an upper deflector 72a and a lower deflector 72b in a microscopic deflection sub-system. In the meanwhile, the beam is focused by the magnetic objective lens 6 onto a specimen within the specimen holder 9. Electrons scattered from and penetrated through the specimen are detected by the BSE detector 15, BF detector 16 and DF detector 17 for generating specimen images. Deflectors 71a, 72a, 72b and 71b may reside in the central bore the magnetic objective lens 6, and they are disk-shaped rings which are axially symmetric about the Z-axis. Each deflector may have a same or different diameter and may fit at a particular position along the Z-axis. An actual bucket-shaped structure may be used to hold the deflectors, and the structure is inserted into the bucket-shaped space of the lens system thus making assembly easier.

Figure 18:
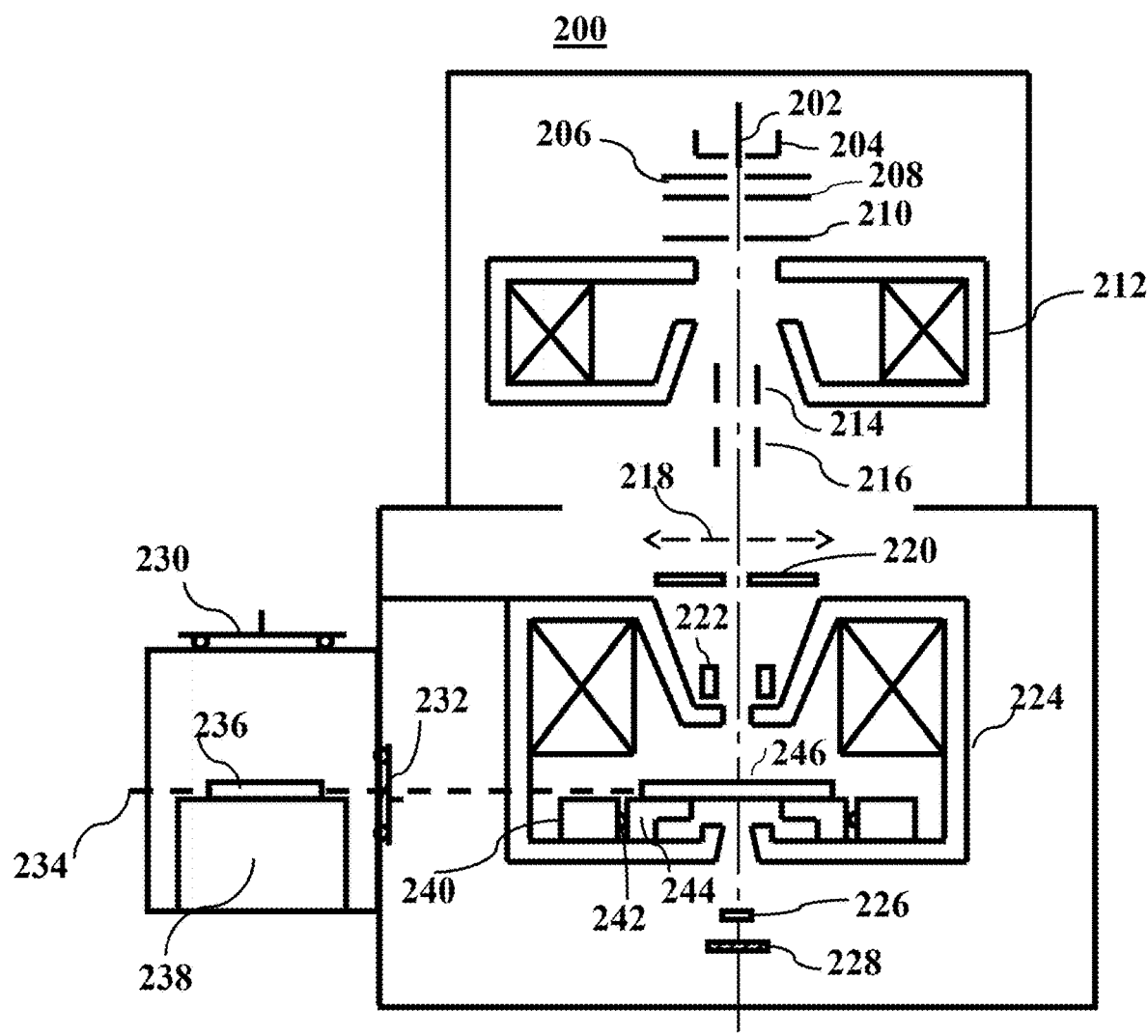
FIG. 18 schematically shows the structure of an apparatus of charged-particle beam such as an electron microscope comprising the general driving system of FIG. 12 in accordance with an exemplary embodiment of the present invention.

In some other embodiments, the stage 240 as shown in FIGS. 13 and 14 may be used in a representative example of an electron microscope as shown in FIG. 18. For conciseness, components 110-112 and 120-122 in FIGS. 13 and 14 are not shown (omitted) in FIGS. 18-31. In an apparatus of charged-particle beam such as an electron microscope, the manipulation of an electron beam is performed using two physical effects. The interaction of electrons with a magnetic field will cause electrons to move according to the left-hand rule, thus allowing for electromagnets to manipulate the electron beam. The use of magnetic fields allows for the formation of a magnetic lens of variable focusing power, and the lens shape is determined by the distribution of magnetic flux. Electrostatic fields can cause the electrons to be deflected through a constant angle. Coupling of two deflections in opposing directions with a small intermediate gap allows for the formation of a shift in the beam path. From these two effects, as well as the use of an electron imaging system, sufficient control over the beam path is made possible. The lenses in the beam path can be enabled, tuned, and disabled entirely and simply via rapid electrical switching, the speed of which is only limited by effects such as the magnetic hysteresis.

For a skilled person in the art, many of the components in FIG. 18 are well-known. For example, electron beam source 202 such as a tungsten filament or a lanthanum hexaboride (LaB$_6$), suppressor electrode 204, beam extractor 206, anode 208, gun aperture 210, condenser lens 212 that is responsible for primary beam formation, beam blanker 214, stigmator 216 for the correction of asymmetrical beam distortions, objective aperture 218, SEM up detector 220, deflector 222, bright field detector 226, dark field detector 228. A system for the insertion into, motion within, and removal of specimens from the beam path is also needed. The system may include load lock 230, chamber interlock 232, lock port 234, loading and unloading mechanism 236, and transfer table 238. Other parts in the microscope may be omitted or merely suggested.

Figure 19:
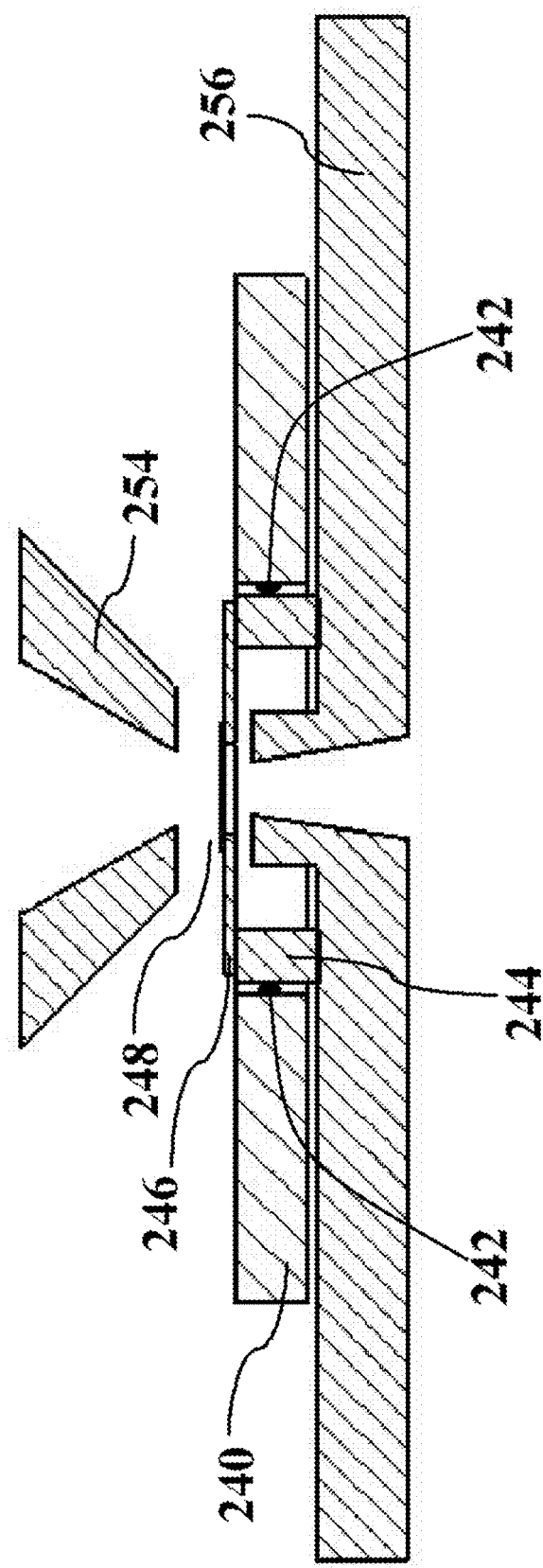
FIG. 19 illustrates the local structure around the specimen table in an electron microscope in the EOS in accordance with an exemplary embodiment of the present invention.

FIG. 19 only show some parts of FIG. 18 that are necessary in order to elucidate the stage 240 (specimen stage 240) as shown in FIGS. 13-14 and other parts around specimen stage 240. These parts include an objective lens 224, sliding specimen table 244, specimen holder 246, and specimen 248. An elastic protrusion and one or more elastic force receiving parts of the specimen stage 240, such as small convex or protrusions 242, in FIG. 18 are also necessary in order to elucidate the invention.

Although electron lenses may operate electrostatically or magnetically, the majority of electron lenses use electromagnetic coils to generate a convex lens. The field produced for the lens must be radially symmetrical, as deviation from the radial symmetry of the magnetic lens causes aberrations such as astigmatism and worsens spherical and chromatic aberration. A quadrupole lens is an arrangement of electromagnetic coils at the vertices of the square, enabling the generation of a lensing magnetic fields, the hexapole configuration simply enhances the lens symmetry by using six, rather than four coils. Electron lenses may be manufactured from iron, iron-cobalt or nickel cobalt alloys, such as permalloy, due to their good magnetic properties, such as magnetic saturation, hysteresis and permeability. It should be appreciated that the objective lens 224 may be an electromagnetic lens or an electrostatic lens.

Objective lens 224 allows for electron beam convergence, with the angle of convergence as a variable parameter. The magnification may be simply changed by modifying the amount of current that flows through the coil of lenses. Lens 224 may include the yoke, the magnetic coil, the poles, the pole piece, and the external control circuitry. As shown in FIG. 18, electromagnetic lens 224 includes an upper pole piece 254 and a lower pole piece 256. The pole piece must be manufactured in a very symmetrical manner, as this provides the boundary conditions for the magnetic field that forms the lens. Imperfections in the manufacture of the pole piece can induce severe distortions in the magnetic field symmetry, which induce distortions that will ultimately limit the lenses' ability to reproduce the object plane. The exact dimensions of the gap, pole piece internal diameter and taper, as well as the overall design of the lens is often performed by finite element analysis of the magnetic field, considering of the thermal and electrical constraints of the design.

The coils which produce the magnetic field are located within the lens yoke. The coils can contain a variable current, but typically utilize high voltages, and therefore require significant insulation in order to prevent short-circuiting the lens components. Thermal distributors are placed to ensure the extraction of the heat generated by the energy lost to resistance of the coil windings. The windings may be water-cooled, using a chilled water supply in order to facilitate the removal of the high thermal duty.

As previously described, the specimen stage 240 includes an empty space as a receptacle for accommodating the specimen table 244. There may be a horizontal planar surface around lower pole piece 256, and the specimen table 244 can sit on, and slide on, the planar surface. The specimen stage 240 can move the specimen table 244 by sliding it to a plurality of predetermined positions on the horizontal planar surface, and to hold the specimen table 244 on each of the predetermined positions for a period of EOS 51 examination time. When a disturbing vibration between the objective lens 224 and the specimen stage 244 occurs during the period of examination time, the vibration will be absorbed or dampened to an effect that the specimen table 244 remains stationary relative to the objective lens 224 during the period of examination time. In other words, an ensuing vibration of noise level about each of the predetermined positions will not be generated between the objective lens 224 and the specimen table 244 during the period of examination time.

In a typical embodiment, the specimen stage 240 can move specimen table 244 by sliding the table on the horizontal planar surface around lower pole piece 256 from one observation point to another one. For example, the sliding distance between two adjacent observation points may be greater than 1 μm, preferably greater than 5 or 10 μm. Once specimen table 244 arrives at the observation point, it will stay stationary on the observation point, until it is moved again by stage 240 to the next observation point. At each observation point, however, the disturbing vibration of the stage 240 cannot transmit to the specimen table. For example, the vibration may have an amplitude of less than 2 nm, such as less than 1 nm.

Figure 20:
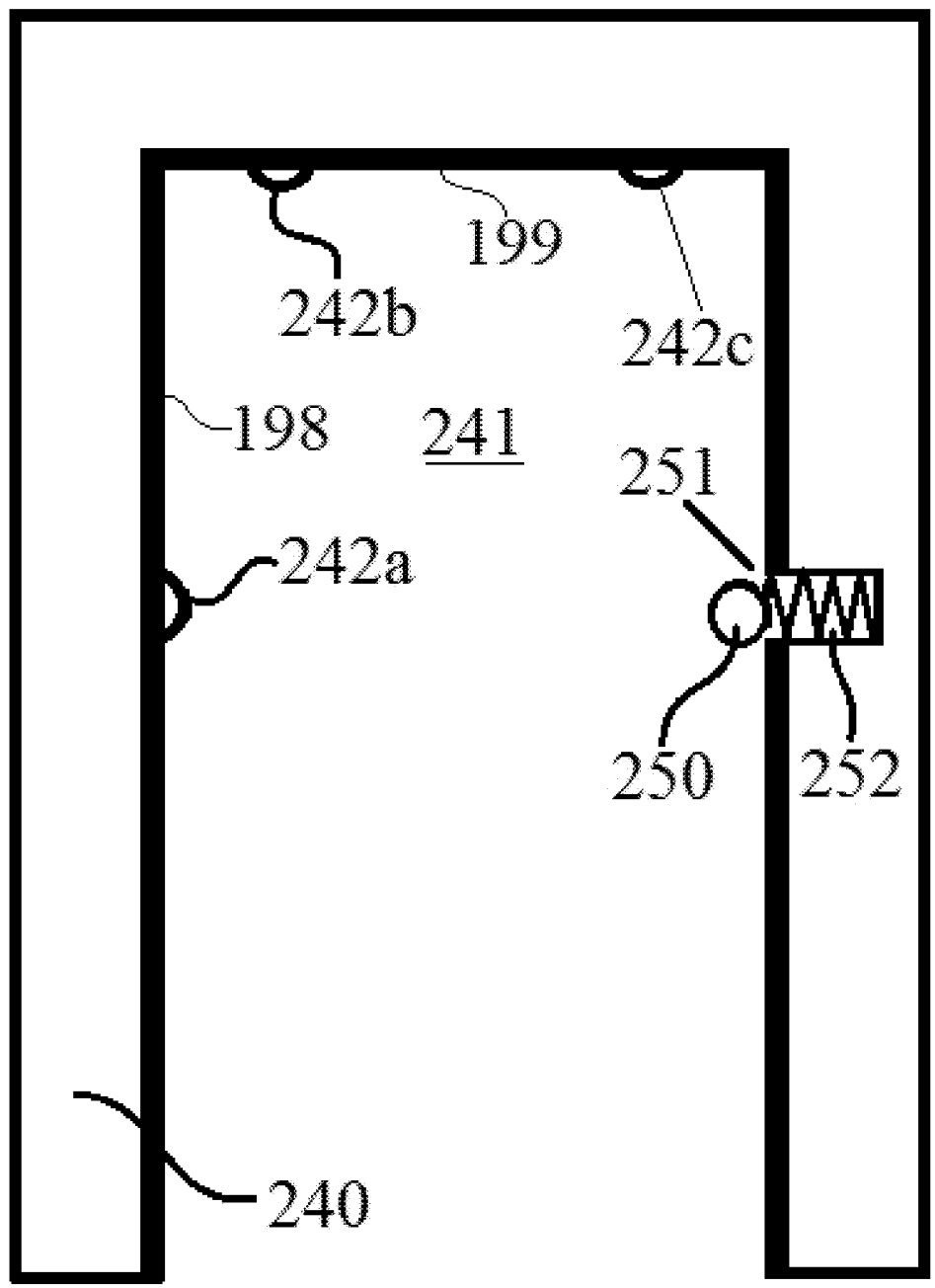
FIG. 20 is the top view of a table receptacle in a specimen stage in the EOS in accordance with an exemplary embodiment of the present invention.

Referring to FIG. 20, the specimen stage 240 has an empty space as a receptacle 241 for accommodating the specimen table 244. In operation, specimen table 244 can be placed in and removed away from the receptacle 241. The specimen stage 240 may include an elastic protrusion 252 and one or more elastic force receiving parts, for example the side wall 198 opposite to the elastic protrusion 252, the side wall 199 neighboring the elastic protrusion 252, and/or protrusion(s) on the side walls 198 and/or 199, such as three permanent protrusions 242a, 242b and 242c, that are surrounding the empty space of receptacle 241. Permanent protrusions 242a, 242b and 242c may be dome-shaped as shown in FIG. 20 and may be made of a non-magnetic material such as ceramic material, non-ferrous metals such as aluminum, copper, lead, nickel, tin, titanium and zinc, and non-ferrous alloys such as Beryllium Copper (BeCu). An embodiment of elastic protrusion 251 includes a ball 250 attached to a spring 252. Depending on the force against ball 250, the ball can extend more or less into the empty space of receptacle 241 to press or push specimen table 244. Ball 250 may also be made of a non-magnetic material such as ceramic material, non-ferrous metals such as aluminum, copper, lead, nickel, tin, titanium and zinc, and non-ferrous alloys such as Beryllium Copper (BeCu). Any three protrusions of the four protrusions (242a, 242b, 242c and 251) are not spatially arranged in a linear relationship. As will be described in more details, the elastic protrusion 251 can push/press the specimen table 244 against all the three permanent protrusions 242a, 242b and 242c after the specimen table 244 is placed in the receptacle 241, so that the orientation and the position of the specimen table 244 relative to the specimen stage 240 is fixed. By 'fixed", it intends to mean that a disturbing vibration between 240 and 244 is ignored. As will be described later, in the presence of such vibration, the orientation and the position of the specimen table 244 is not absolutely fixed relative to the specimen stage 240.

Figure 21:
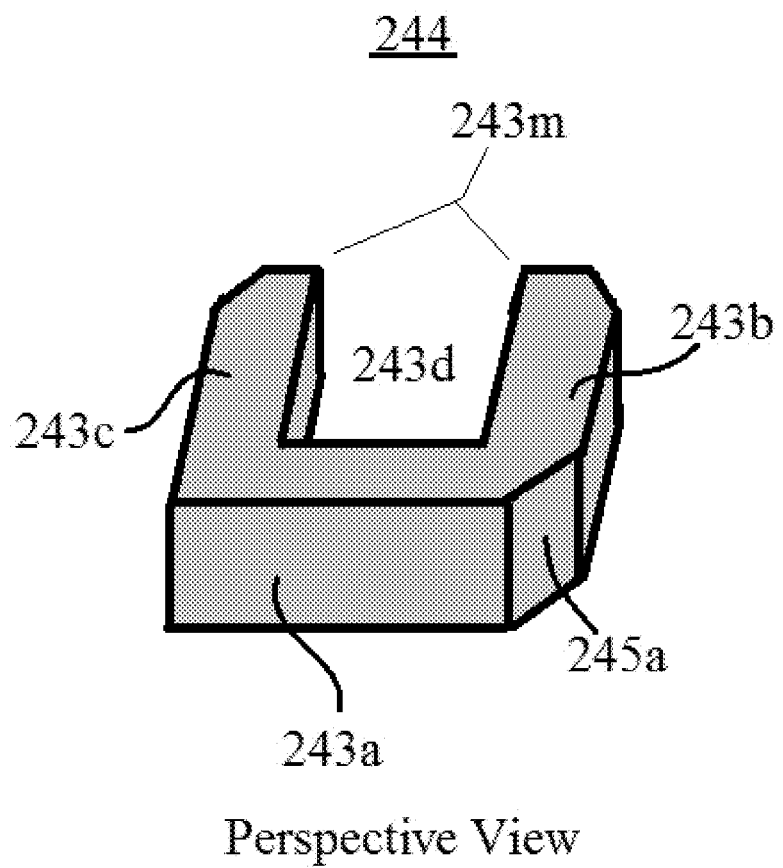
FIG. 21 demonstrates the perceptive view and top view of a specimen table in the EOS in accordance with an exemplary embodiment of the present invention.
Figure 21:
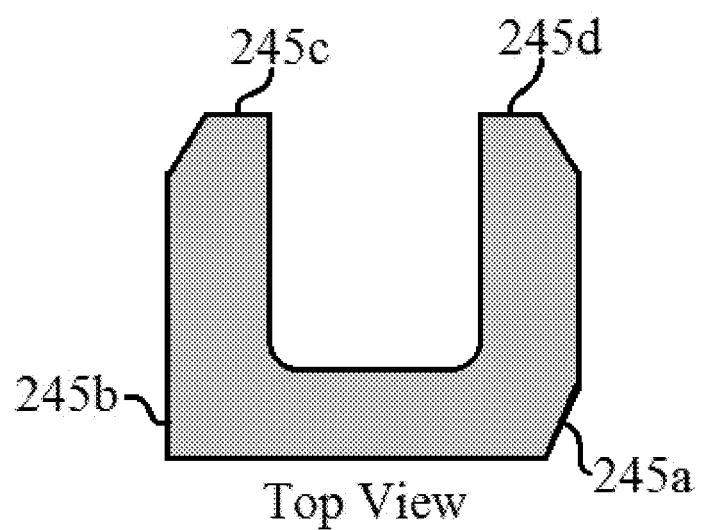

Referring to FIG. 21, the specimen table 244 may be U-shaped, and may include a base 243a, a right arm 243b and a left arm 243c that are extended from the base 243a. An open space 243d is thus formed by the base 243a and the two arms 243b and 243c. The open space 243d has a mouth 243m. An electron beam can pass through specimen 248, and then pass through the open space 243d in a transmission electron microscope. The specimen table 244 may include four side zones (245a, 245b, 245c and 245d) for contacting the four protrusions (242a, 242b, 242c and 251) in specimen stage 240. At least two of the side zones (245a, 245b, 245c and 245d) are flat or planar to prevent rotation of the specimen table 244 inside receptacle 241. For example, two, three or all of the side zones are flat. Any three of the four side zones are not parallel to each other, to prevent drifting of the specimen table 244 inside receptacle 241. Two side zones within a same plane are viewed as a special case of "parallel relationship". For example, zones 245c and 245d may be within the same plane and they are viewed as "parallel to each other". Zone 245b is perpendicular to zones 245c and 245d. Side zone 245a is not in parallel with, or perpendicular to, any other side zone (245b, 245c or 245d).

In some embodiments, one end or both ends of right arm 243b and left arm 243c that are distal from the base 243a may be tapered for facilitating the entry of the specimen table 244 into the receptacle 241. For example, the elastic protrusion 251 and front permanent protrusion 242a can function as a flexible gate structure to admit the specimen table 244 into the receptacle 241. The specimen table 244 can thus be "snapped into", and temporarily locked in, the receptacle 241. The end of the base 243a that is distal from the arms 243b and 243c may also be tapered for facilitating the retreat of the specimen table 244 from the receptacle 241. Side zone 245a may also function as the tapered end for facilitating the retreat of the specimen table 244.

Figure 22:
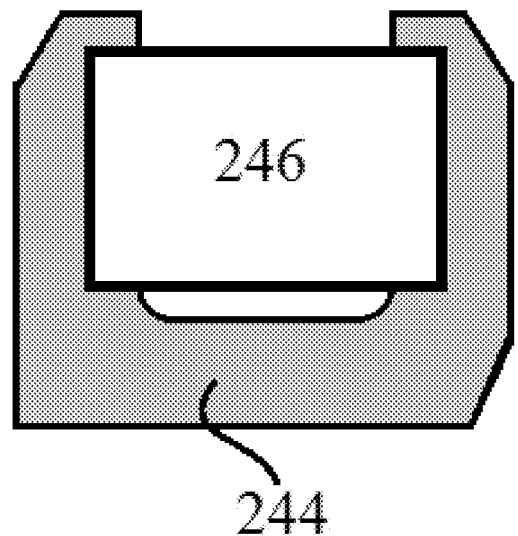
FIG. 22 depicts a piece of specimen and a holder thereof are placed over a specimen table in the EOS in accordance with an exemplary embodiment of the present invention.
Figure 22:
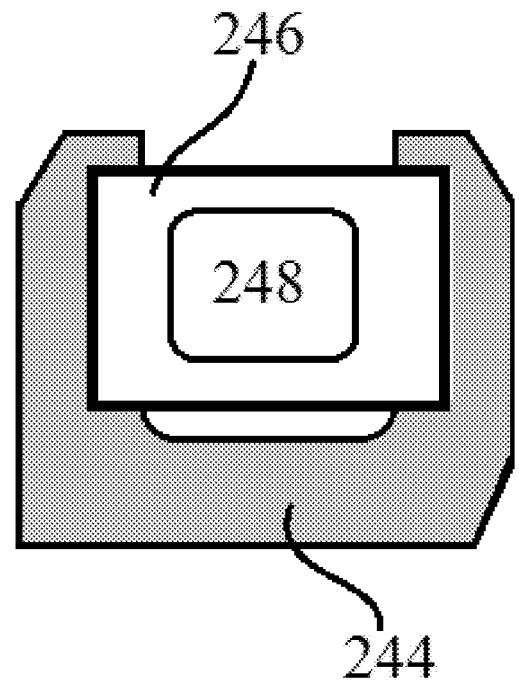

Referring to FIG. 22, a specimen holder 246 can be placed on the specimen table 244 and spanned over open space 243d. A specimen or a sample 248 can be placed on specimen holder 246 for microscope examination. Since specimen holder 246 and specimen 248 are stationary relative to specimen table 244, they will be stationary relative to the objective lens 224 during the period of examination time as well.

Figure 23:
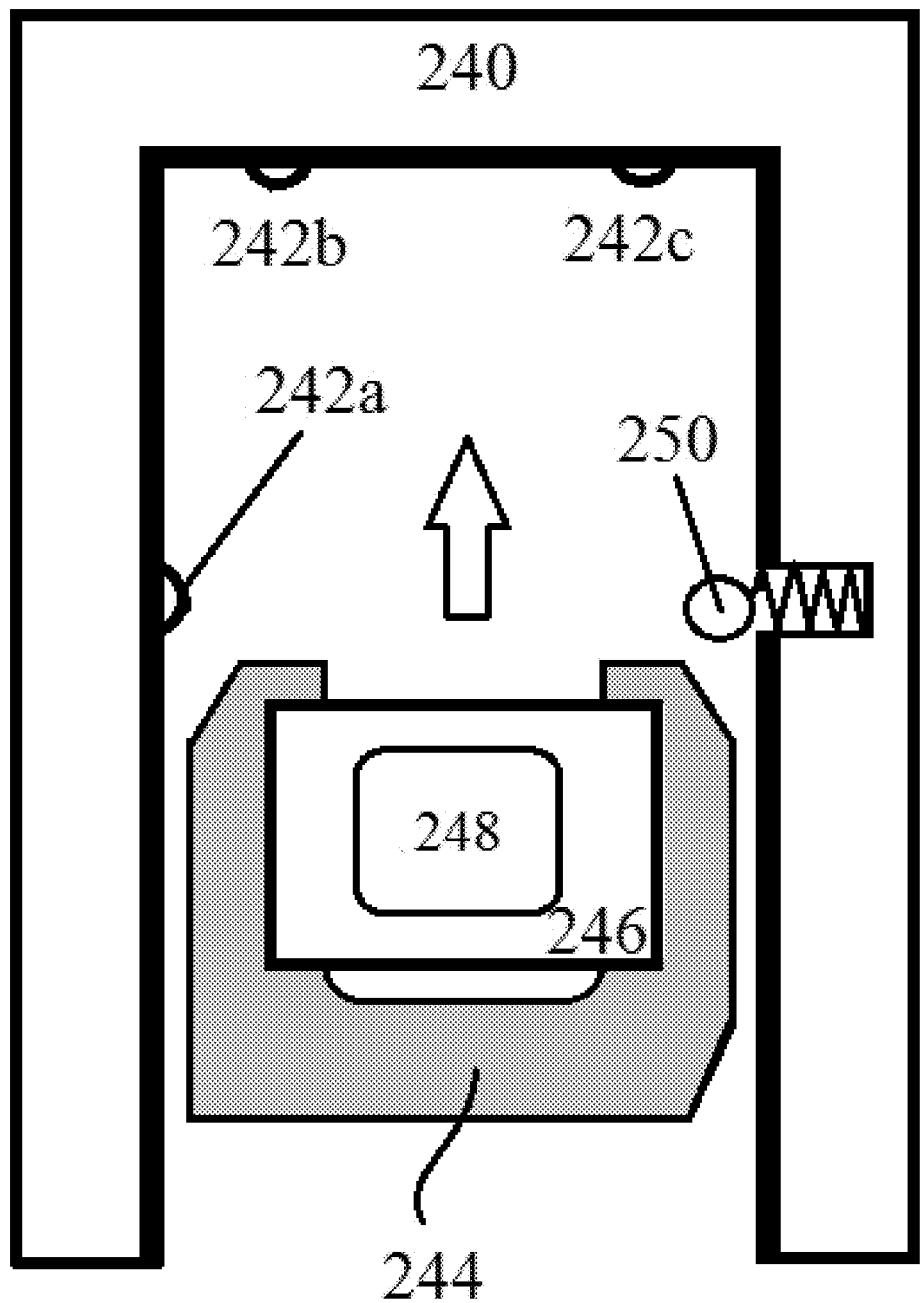
FIG. 23 schematically shows that a specimen table in the EOS is to enter the receptacle of a specimen stage in the EOS in accordance with an exemplary embodiment of the present invention.
Figure 24:
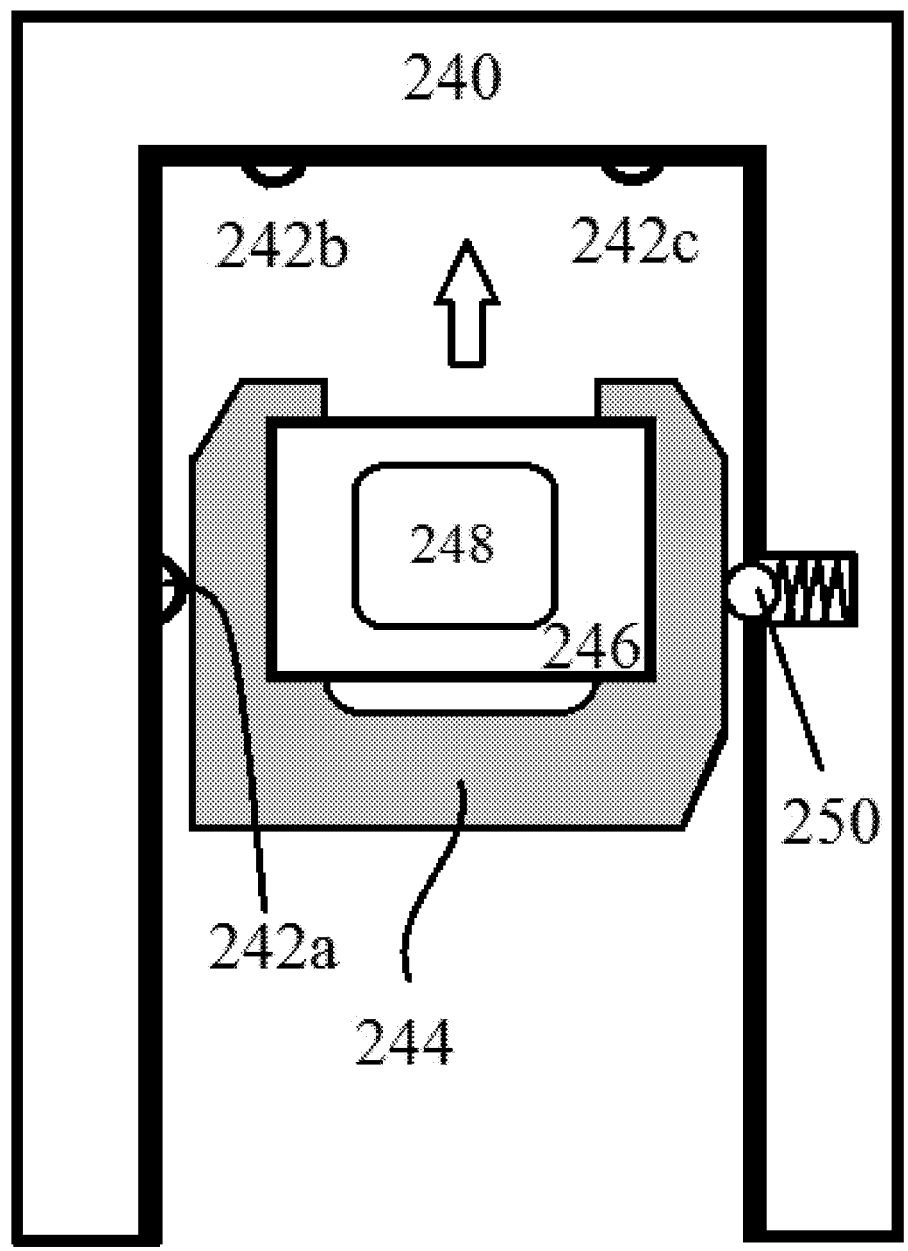
FIG. 24 schematically shows that a specimen table in the EOS is entering the receptacle of a specimen stage in the EOS in accordance with an exemplary embodiment of the present invention.
Figure 25:
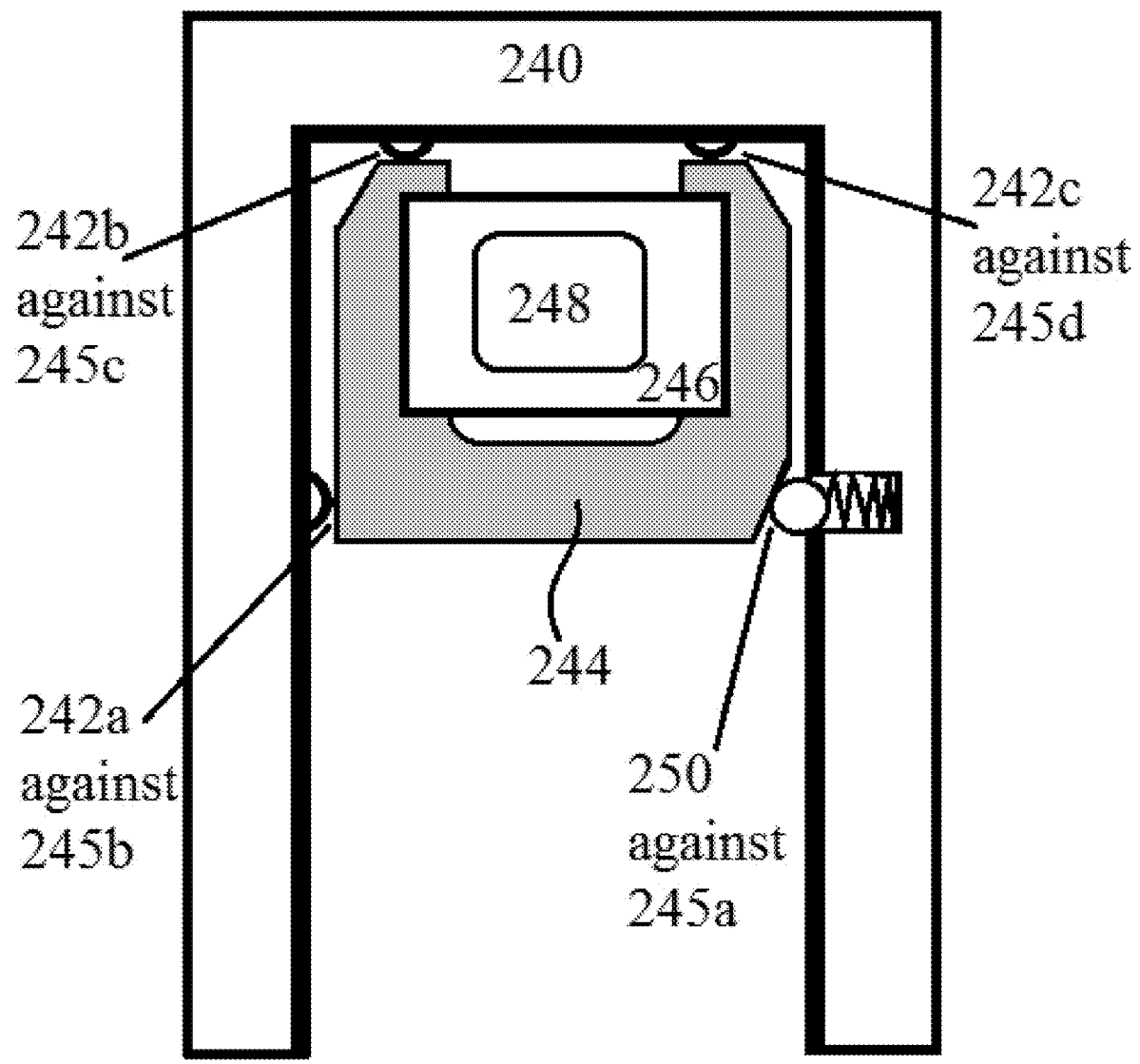
FIG. 25 shows that a specimen table in the EOS has entered the receptacle of a specimen stage in the EOS in accordance with an exemplary embodiment of the present invention.

Referring to FIGS. 23, 24 and 25, after specimen table 244 is loaded with specimen holder 246 and specimen 248, it can be gradually pushed into the receptacle 241 of a specimen stage 240.

Figure 26:
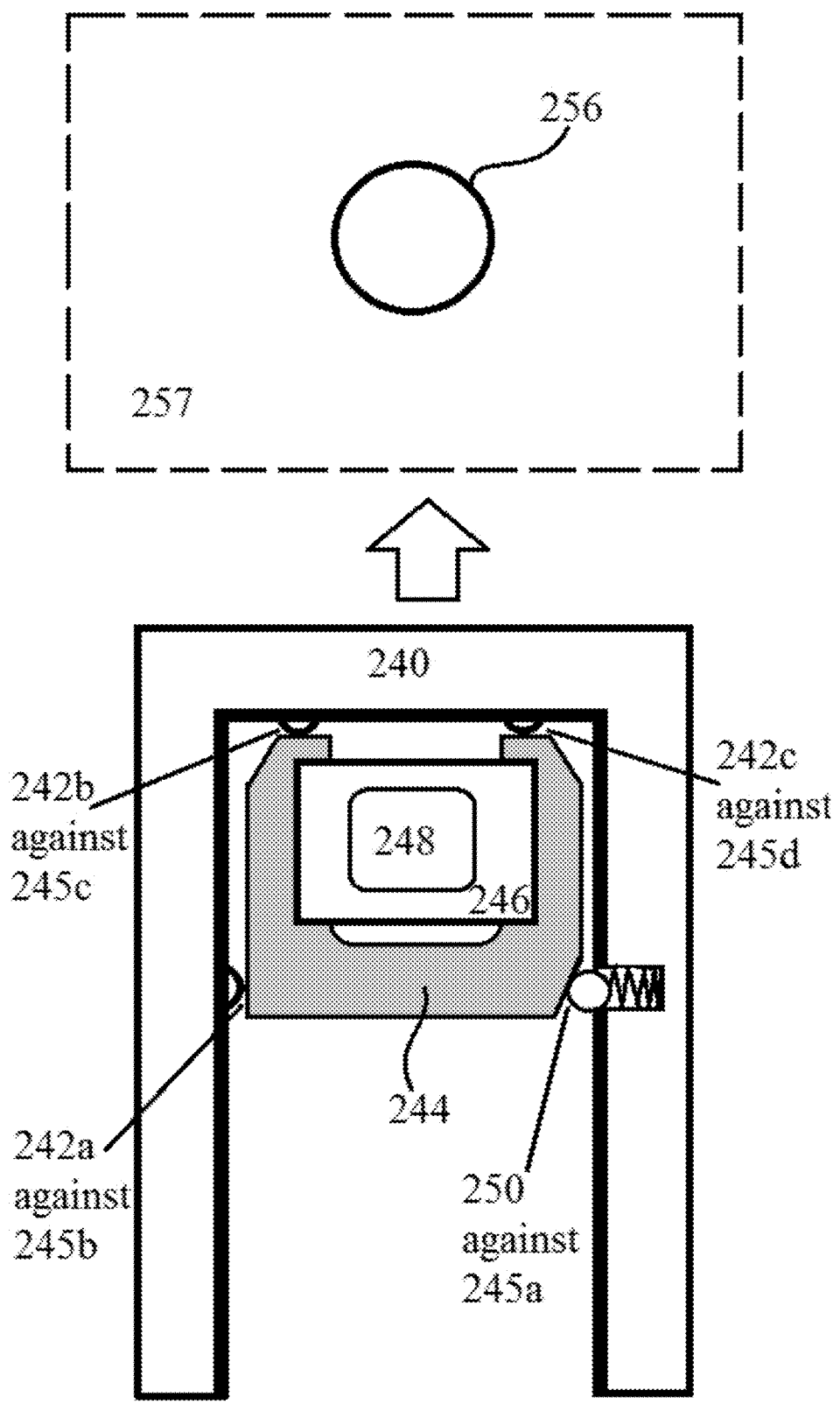
FIG. 26 illustrates that a specimen table in the EOS is moved to a horizontal planar surface around the lower pole piece of the objective lens in the EOS in accordance with an exemplary embodiment of the present invention.

Referring to FIGS. 26 and 18, the objective lens 224 has a horizontal planar surface 257 around lower pole piece 256 for the specimen table 244 to sit on and slide on. Specimen stage 240, loaded with specimen table 244, specimen holder 246 and specimen 248, can be gradually pushed onto horizontal planar surface 257. The open space 243d has a mouth 243m, and lower pole piece 256 can enter open space 243d through mouth 243m. Therefore, lower pole piece 256 does not hinder the movement of specimen table 244.

Figure 27:
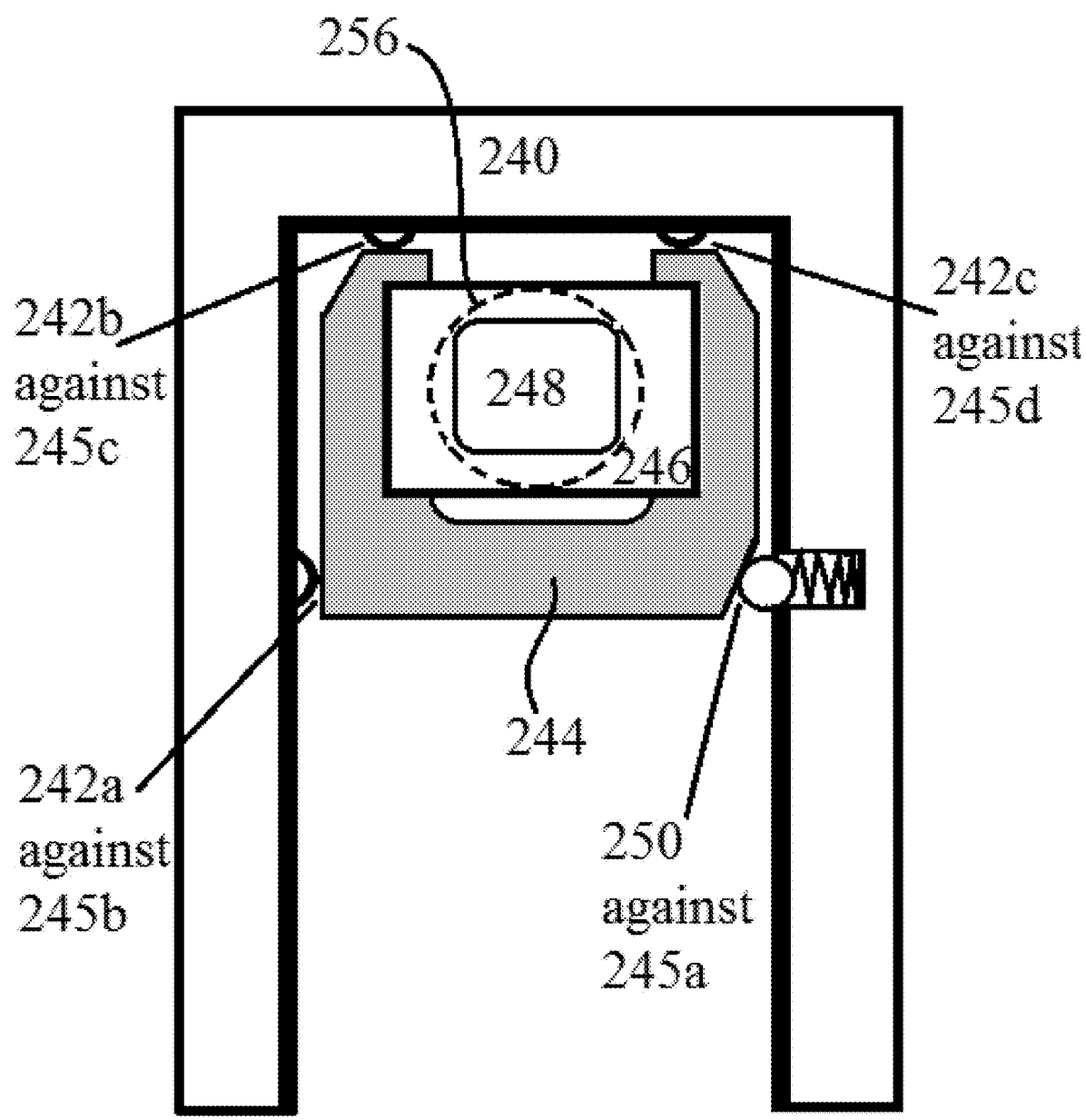
FIG. 27 demonstrates that the specimen is placed over the lower pole piece of the objective lens in the EOS in accordance with an exemplary embodiment of the present invention.

Referring to FIG. 27, the specimen 248 is placed over, and aligned with, the lower pole piece 256, ready for microscopic measurement or examination. Referring back to FIG. 18, a beam of electrons is transmitted through an ultra-thin specimen 248, interacting with the specimen as it passes through it. An image is formed from the interaction of the electrons transmitted through the specimen. The image is magnified and focused onto an imaging device, such as a fluorescent screen, on a layer of photographic film, or to be detected by a sensor such as a charge-coupled device.

Figure 28:
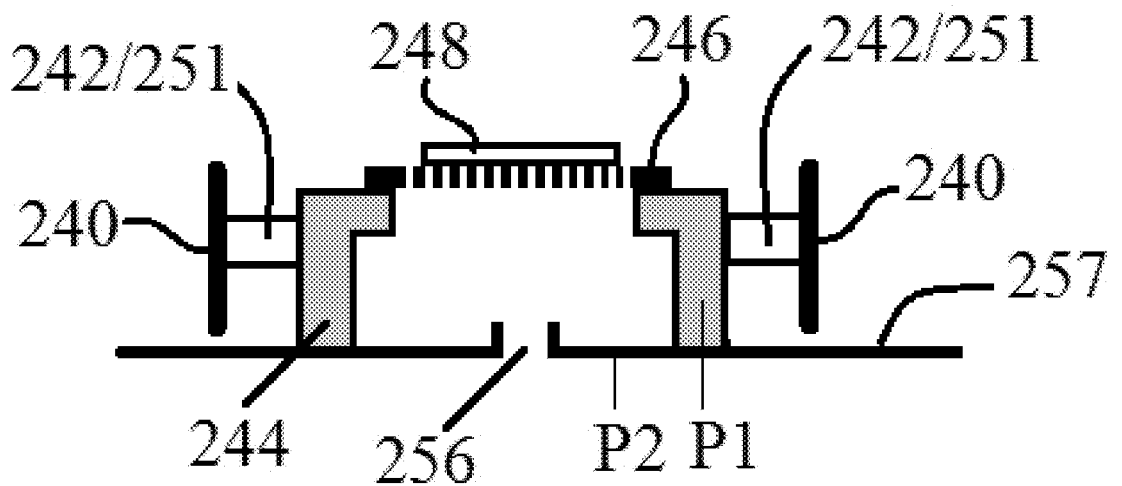
FIG. 28 depicts that, at a first predetermined position, a vibrating specimen stage in the EOS cannot overcome the static friction between the specimen table in the EOS and a planar surface of the objective lens in the EOS, and therefore the specimen table remains stationary to the objective lens, in accordance with an exemplary embodiment of the present invention.
Figure 28:
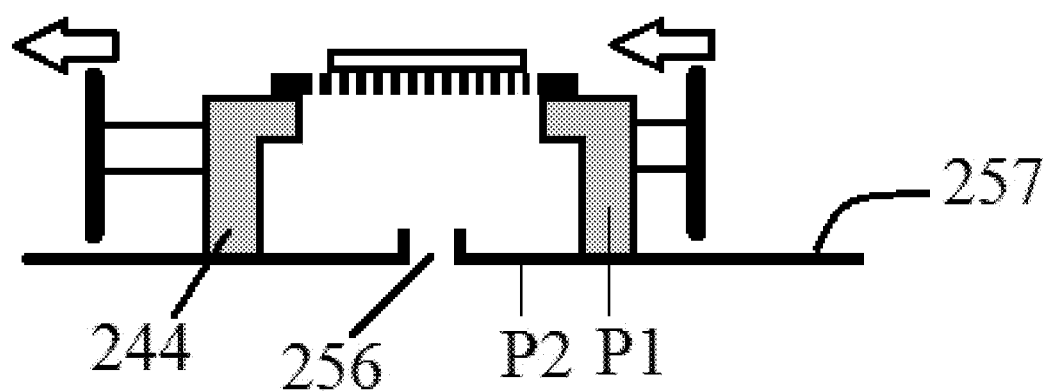
Figure 28:
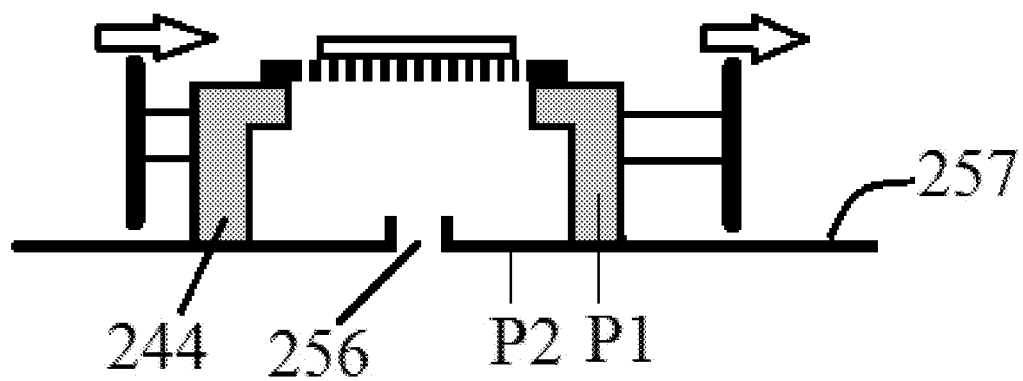

Referring to FIG. 28, when a disturbing vibration (represented by the arrows) between the objective lens 224 and the specimen stage 244 occurs during the period of microscopic examination time, at least some of the four protrusions (242a, 242b, 242c and 251) will absorb or dampen the vibration to an effect that the specimen table 244 remains stationary relative to the objective lens 224 during the period of examination time. In other words, an ensuing vibration is not generated between the objective lens 224 and the specimen table 244 on each of the predetermined positions during the period of examination time. The disturbing vibration may be a mechanical oscillation that occurs about one of the predetermined positions P1 as the equilibrium point. The vibration may be caused by the specimen stage 240 that vibrates relative to a stationary objective lens 224 or caused by the objective lens 224 that vibrates relative to a stationary specimen stage 240. The vibration may be caused by a vibrating specimen stage 240 and an objective lens 224, but the two vibrations have different amplitudes and/or different phases.

When the specimen stage 240 vibrates relative to the objective lens 224, one or more of the four protrusions will be deformed or compressed, and an elastic force of equal magnitude and opposite direction is generated from the deformation or compression of the protrusions. The force is applied to the specimen table 244. However, the vibration has a small amplitude of less than 2 nm, such as less than 1 nm, and the deformation or compression of the protrusions is also in the same magnitude. As a result, the generated force is not strong enough to overcome the static friction between the specimen table 244 and the planar surface 257 of the objective lens 224. The disturbing vibration of the stage 240 cannot transmit to the specimen table 244. In other words, the specimen stage 240 cannot overcome the static friction between the specimen table 244 on the predetermined position P1 and the planar surface 257 of the objective lens 224, so that an ensuing vibration between the objective lens 224 and the specimen table 244 cannot be generated. The specimen table 244 on the predetermined position P1 remains stationary relative to the objective lens 224.

Figure 29:
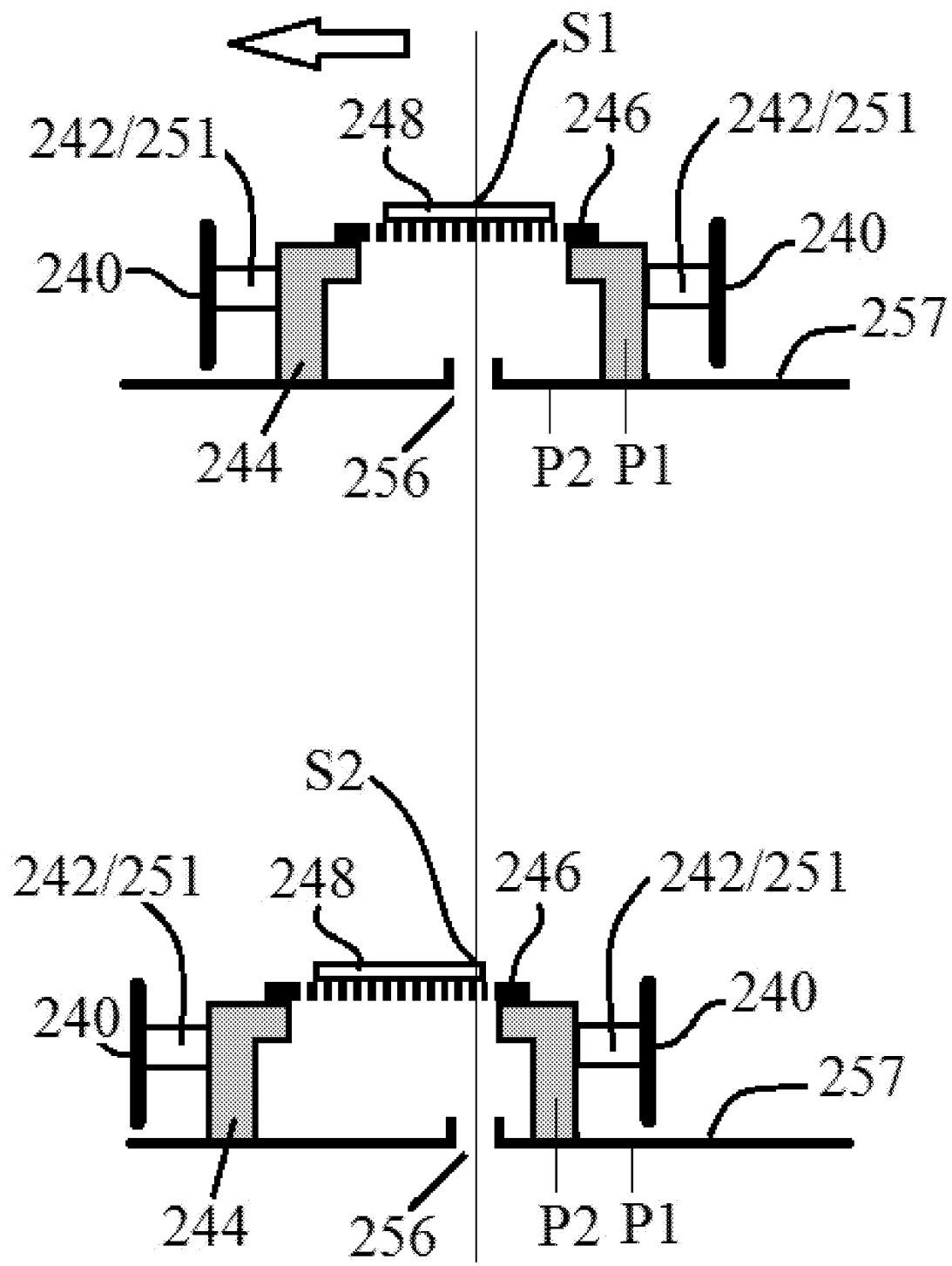
FIG. 29 schematically shows that a moving specimen stage in the EOS can overcome the static friction between the specimen table and a planar surface of the objective lens in the EOS, and it can therefore move the specimen table from the first predetermined position to a second predetermined position, in accordance with an exemplary embodiment of the present invention.

After the measurement on position P1 is completed, the specimen table 244 can slide on the planar surface 257 from position P1 to another predetermined position P2. A predetermined position may be corresponding to an observation point S of the specimen. As shown in FIG. 29, the predetermined positions P1 and P2 on the planar surface 257 of the objective lens 224 are corresponding to observation point S1 and S2 of the specimen 248, respectively. Since the sliding distance between P1 and P2 (or S1 and S2) is greater than 1 μm, which is more than 1000 times longer than the disturbing vibration amplitude (<1 nm level), the elastic force generated from the deformation or compression of the protrusions will be much greater than the static friction force between the specimen table 244 and the planar surface 257. The specimen stage 240 can overcome the static (let alone kinetic) friction between the specimen table 244 and the planar surface 257 of the objective lens 224. As a result, the specimen stage 240 forces the specimen table 244 to slide on the planar surface 257 from a predetermined position P1 to another P2.

Figure 30:
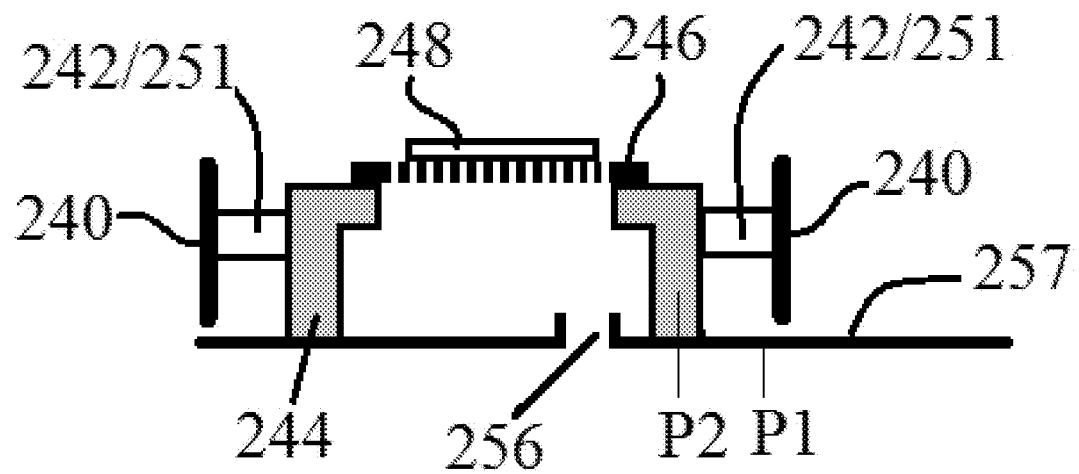
FIG. 30 illustrates that, at the second predetermined position, a vibrating specimen stage in the EOS cannot overcome the static friction between the specimen table and a planar surface of the objective lens in the EOS, and therefore the specimen table remains stationary to the objective lens, in accordance with an exemplary embodiment of the present invention.
Figure 30:
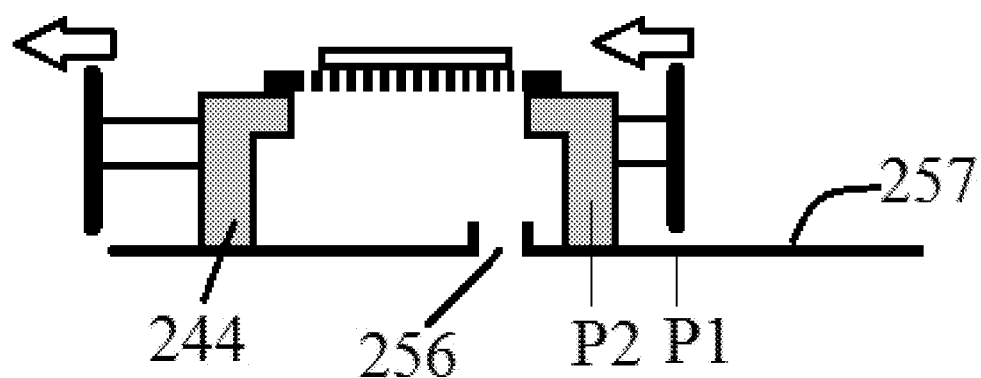
Figure 30:
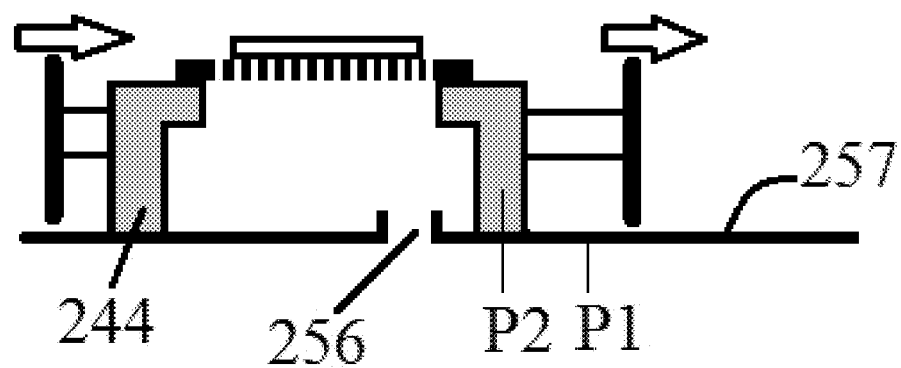

Like FIG. 28, FIG. 30 shows that the vibration occurs about a new predetermined positions P2 as the equilibrium point. Again, the specimen stage 240 cannot overcome the static friction between the specimen table 244 on the predetermined position P2 and the planar surface 257 of the objective lens 224, so that an ensuing vibration between the objective lens 224 and the specimen table 244 cannot be generated. The specimen table 244 on the predetermined position P2 remains stationary relative to the objective lens 224, until it is forced to slide to another predetermined point.

The aforementioned "static friction" is defined as friction between two solid objects that are not moving relative to each other. For example, static friction can prevent an object from sliding down a sloped surface. The static friction force must be overcome by an applied force before an object can move. The maximum value of static friction, when motion is impending, is referred to as limiting friction. In the present invention, disturbing vibration and drift generates a force that is lower than the limiting friction between the specimen table 244 and the planar surface 257 of the objective lens 224.

When sliding occurs, static friction is no longer applicable, the friction between the two surfaces is then called kinetic friction, dynamic friction or sliding friction. Kinetic friction occurs when two objects are moving relative to each other and rub together (like a sled on the ground). The coefficient of static friction is generally higher than the coefficient of kinetic friction.

According to the present invention, the limiting friction between the specimen table 244 and the planar surface 257 of the objective lens 224 can be adjusted and made suitable for any apparatus of charged-particle beam such as an electron microscope in the EOS 51. The following variable factors can be used for the purpose of tuning the limiting friction: the weight of specimen table 244, the size of specimen table 244's bottom surface that contacts planar surface 257, the surface properties of specimen table 244's bottom surface, and the surface properties of planar surface 257, among others.

Figure 31:
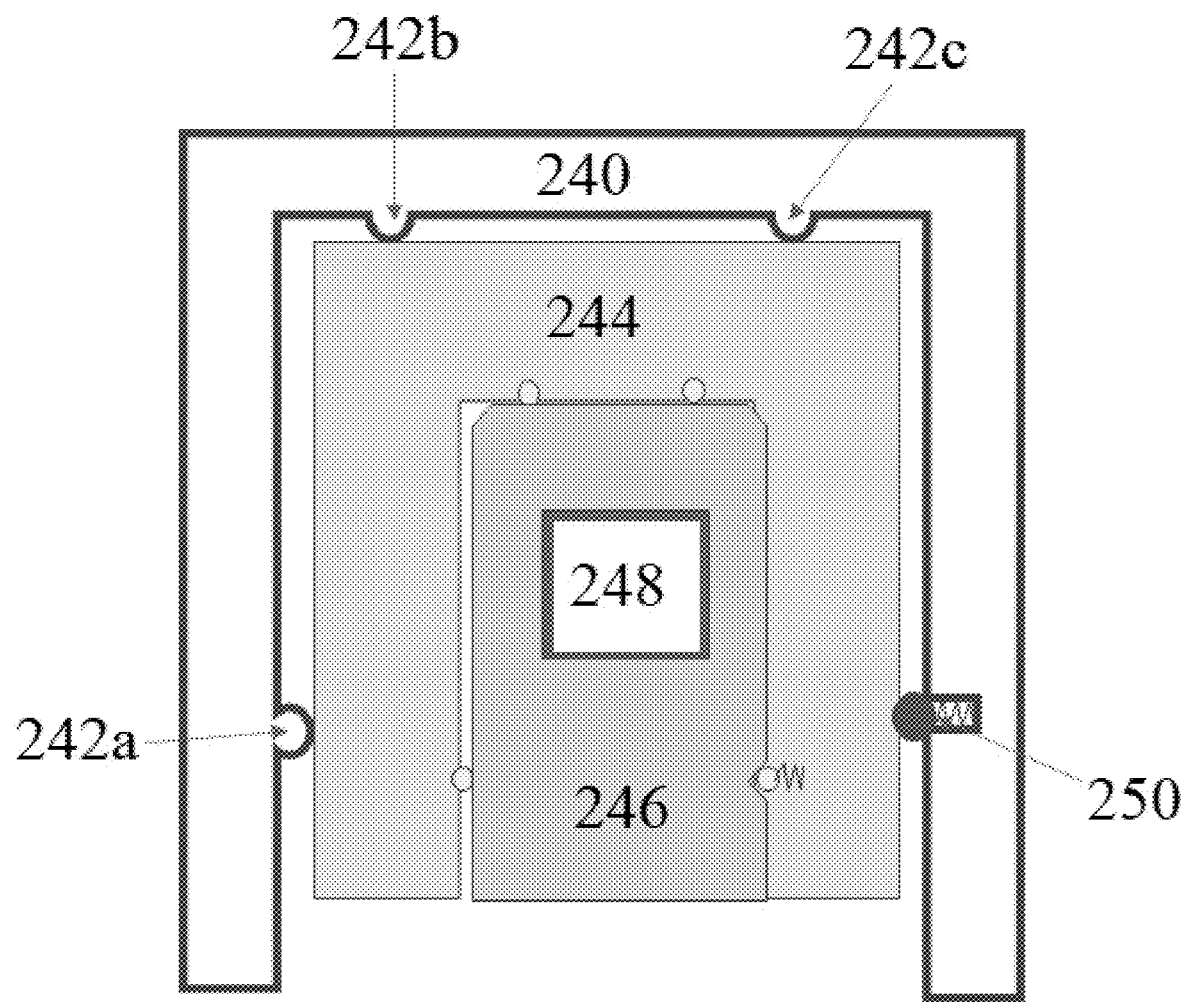
FIG. 31 schematically shows a different design of sliding specimen table and specimen holder in the EOS in accordance with an exemplary embodiment of the present invention.

In some other embodiments of the invention as shown in FIG. 31, sliding specimen table 244 and specimen holder 246 may have a design that is different from those described above. Like FIG. 21, specimen table 244 in FIG. 31 may also be U-shaped, and may also include a base 243a, a right arm 243b and a left arm 243c that are extended from the base 243a. An open space 243d is thus formed by the base 243a and the two arms 243b and 243c. The open space 243d has a mouth 243m.

However, unlike FIG. 21, it is the base 243a (rather than mouth 243m) that will contact permanent protrusions 242b and 242c. Side zone 245a is thus optional in FIG. 31. When side zone 245a is not present, left arm 243c itself will directly contact ball 250. Moreover, one or both of the ends of right arm 243b and left arm 243c that are distal from the base 243a may be flat, and may not necessarily be tapered, since they are not needed for facilitating the entry of the specimen table 244 into the receptacle 241. Instead, base 243a can be tapered for facilitating the entry of the specimen table 244 into the receptacle 241.

Unlike in FIG. 22, specimen holder 246 in FIG. 31 is not placed on or above the specimen table 244 and is therefore not spanned over open space 243d. Instead, specimen holder 246 in FIG. 31 will be inserted into open space 243d. Like FIG. 22, a specimen or a sample 248 can be placed on specimen holder 246 for microscope examination.

As an alternative to, or in addition to, three permanent protrusions 242a, 242b and 242c, and one elastic protrusion 251 including ball 250 attached to spring 252 as described and illustrated above, specimen table 244 may have three same or similar permanent protrusions and one elastic protrusion same or similar around specimen holder 246.

Referring back to FIGS. 13, 14 and 18-31, in a specific embodiment, X-Y stage 240 is moved by two spring leaves and the X-Y moving is un-orthogonal moving. X-Y stage is in the same level and combined moving, not like traditional X-Y stage that is moved separately and overlay together. The stage moving range is small and orthogonal X Y position will need to be calibrated.

As will be described and illustrated with more details, the EOS 51 as shown in FIGS. 2B and 10 further comprises co-condensers within the column chamber 83 and a source of electrons configured to emit an electron beam. The term "co-condensers" is defined as two or more magnetic condensers configured to coherently focus the electron beam to a single crossover spot F. The electron beam does not have a crossover spot between any two of the two or more magnetic condensers.

As will be described and illustrated with more details, the EOS 51 as shown in FIGS. 2B and 10 further comprises a deflector within the column chamber 83 and a source of electrons configured to emit an electron beam along a primary axis (e.g. z axis). The deflector includes an electrode assembly that comprises two or more electrodes arranged around the primary axis (e.g. z axis). There is a central channel space having a boundary surface that is axially symmetrical around the primary axis, and the deflector is configured to deflect the electron beam when the beam travels through the central channel space. The boundary surface is different from a single right cylindrical surface (or at least two round cross-sections of the central channel space along planes in parallel with the x-y plane have different diameters). Each of the electrodes has a body and a front face with a facial surface. The facial surface of each electrode overlaps (or conforms to) a portion of the boundary surface, and the entire body of each electrode remains outside the central channel space.

Figure 32:
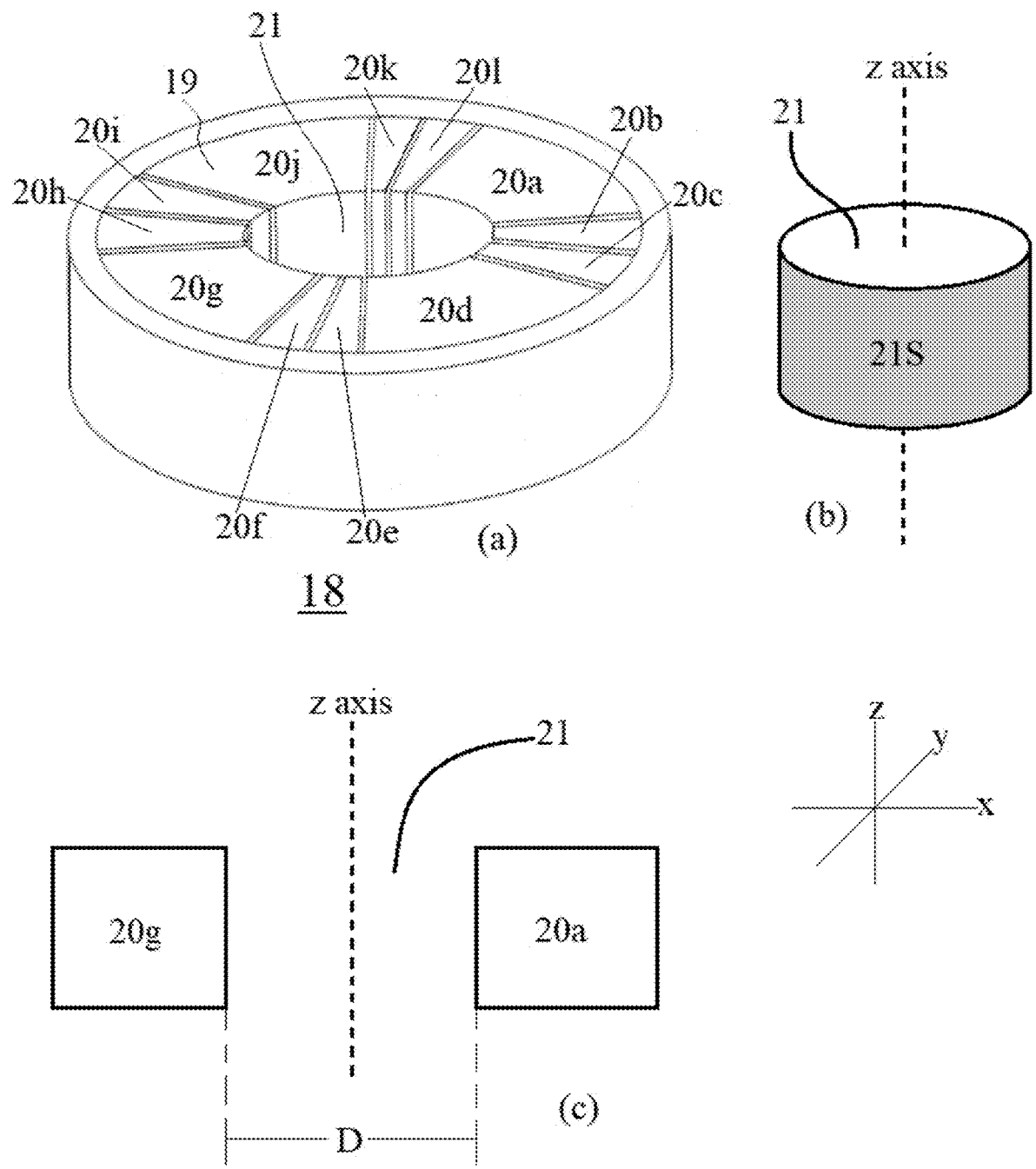
FIG. 32 shows an electrode assembly forming a cylindrical central channel space in the prior art.

As shown in FIG. 32, electrode assembly 19 in a conventional deflector 18 (prior art) includes two or more electrodes 20 (e.g. 12 electrodes 20a, 20b, 20c, 20d, 20e, 20f, 20g, 20h, 20i, 20j, 20k, and 20l) arranged around a primary axis (e.g. z axis). A central channel space 21 has a boundary surface 21S that is axially symmetrical around the primary axis. The boundary surface 21S is a single right cylindrical surface. In other words, all the round cross-sections of the central channel space 21 along planes in parallel with the x-y plane have a same diameter D.

However, there are some disadvantages associated with the conventional deflector 18 as shown in FIG. 32. For example, when the central channel space 21 is immersed in the magnetic field of a magnetic objective lens in an EM, the electrical field within the central channel space 21 may be co-optimized with the magnetic field. However, aberrations of the electron beam after it passes through the central channel space 21, including distortion, field curvature, astigmatism, and chromatic aberrations, remain a problem.

Figure 33:
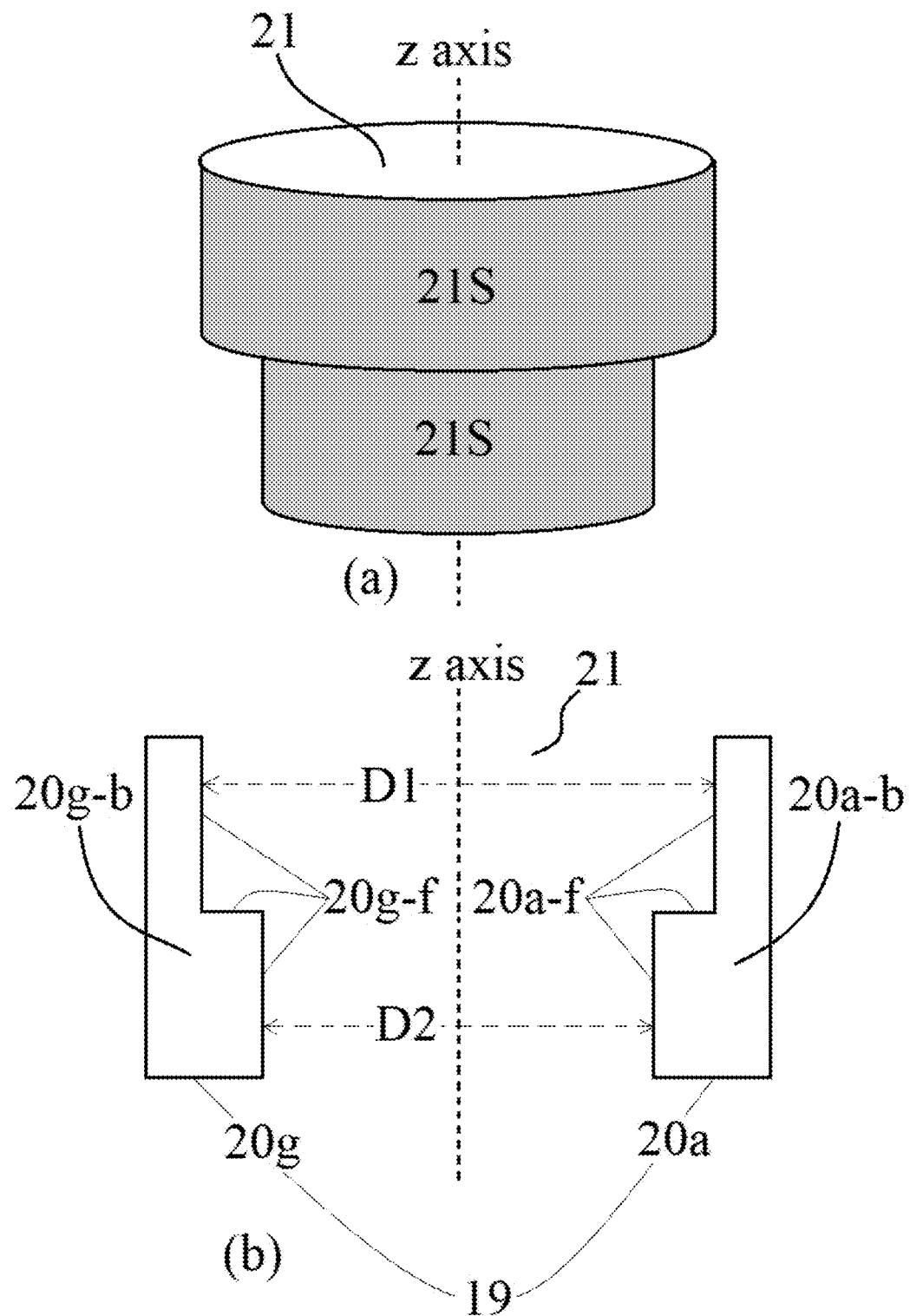
FIG. 33 schematically illustrates an electrode assembly forming a non-cylindrical central channel space in accordance with an exemplary embodiment of the present invention.

Advantageously, various embodiments of the invention provide an electrode assembly 19 as shown in FIG. 33, that is an improvement over that as shown in FIG. 32. The electrode assembly 19 includes two or more electrodes 20 similar to that in FIG. 32 (e.g. 12 electrodes 20*a*, 20*b*, 20*c*, 20*d*, 20*e*, 20*f*, 20*g*, 20*h*, 20*i*, 20*j*, 20*k* and 20*l*) arranged around a primary axis, for example z axis or beam axis, and the x and y axes define a plane transverse to the z-axis. The two or more electrodes 20 may be made from conducting metal, such as copper or beryllium copper, and assembled and fixed onto a substrate made of a ceramic material such as approximately 95% to 98% alumina. Some of electrodes 20 may be grouped together and the group may be tied to a variable voltage driver. For example, when used as a deflector in an EM, the 12 electrodes 20 may be divided into 4 groups each comprising 3 electrodes. Two of the groups control deflection in the X direction and two of the groups control deflection in the Y direction. By controlling the voltage of these electrodes 20, the electron/particle beam is deflected away from some electrodes and towards other electrodes in a precise manner permitting accurate deflection of the beam. Alternatively, four groups of two or five electrodes (with a total of eight or twenty electrodes 20) may also be used.

Similar to FIG. 32, a central channel space 21 (or a central bore) has a boundary surface 21S that is axially symmetrical around the primary axis. However, the boundary surface 21S of the invention differs from a single right cylindrical surface. In other words, at least two round cross-sections of the central channel space 21 along planes in parallel with the x-y plane have different diameters, D1 and D2. For example, the central channel space 21*a* may function as a hollow channel/lumen for a particle beam such as an electron beam to travel or pass through.

Each of the electrodes (e.g. 20*g* and 20*a*) has a body 20*g-b* or 20*a-b* and a front face with a facial surface 20*g-f* or 20*a-f*. As such, the central channel space 21 is generally a non-cylindrical channel space. The facial surface of each electrode 20*g-f* or 20*a-f* overlaps (or conforms to) a portion of the boundary surface 21S, and the entire body of each electrode 20*g-b* or 20*a-b* remains outside the central channel space 21. The two or more electrodes 20 are separated with an insulating medium such as vacuum.

The non-cylindrical central channel space 21 may have a height H along the direction of the primary axis, and each facial surface 20-*f* (e.g. 20*g-f* and 20*a-f*) of the two or more electrodes 20 has a same height H along the direction of the primary axis.

Similarly to those in FIG. 32, two or more electrodes of the invention may also be in the form of n pairs of identical electrodes, and n≥1 or n≥2. In preferred embodiments of the invention, n=2, 4, 6, or 10. In other words, the electrode assembly 19 of the invention may consist of 4, 8, 12 or 20 electrodes 20. Two identical electrodes in a pair are opposite to each other across the primary axis. The two identical electrodes in a pair are axially symmetrical around the primary axis. For example, electrodes 20*a* and 20*g*, 20*b* and 20*h*, 20*c* and 20*i*, 20*d* and 20*j*, 20*e* and 20*k*, and 20*f* and 20*l* are 6 pairs of identical electrodes, and any two identical electrodes in a pair are opposite to each other across the primary axis, or they are axially symmetrical around the primary axis.

Figure 34:
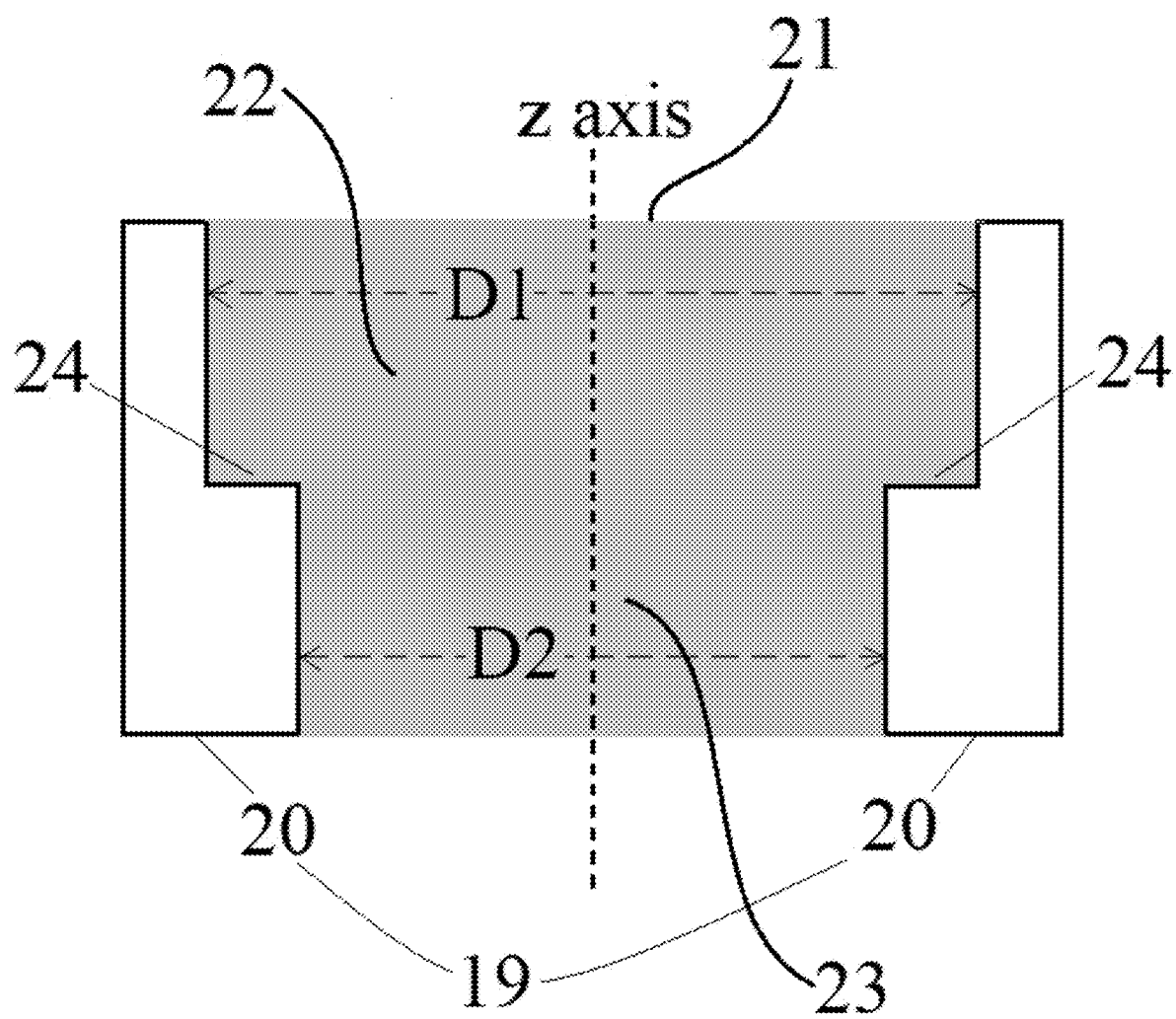
FIG. 34 schematically illustrates an electrode assembly forming a central channel space with a first non-cylindrical shape in accordance with an exemplary embodiment of the present invention.

In an exemplary embodiment of the invention as shown in FIG. 34, the non-cylindrical central channel space 21 consists of a first single right cylindrical segment 22 with a diameter D1, a second single right cylindrical segment 23 with a diameter D2, and a shoulder 24 in parallel to x-y plane connecting the first segment 22 to the second segment 23. D1>D2.

Figure 35:
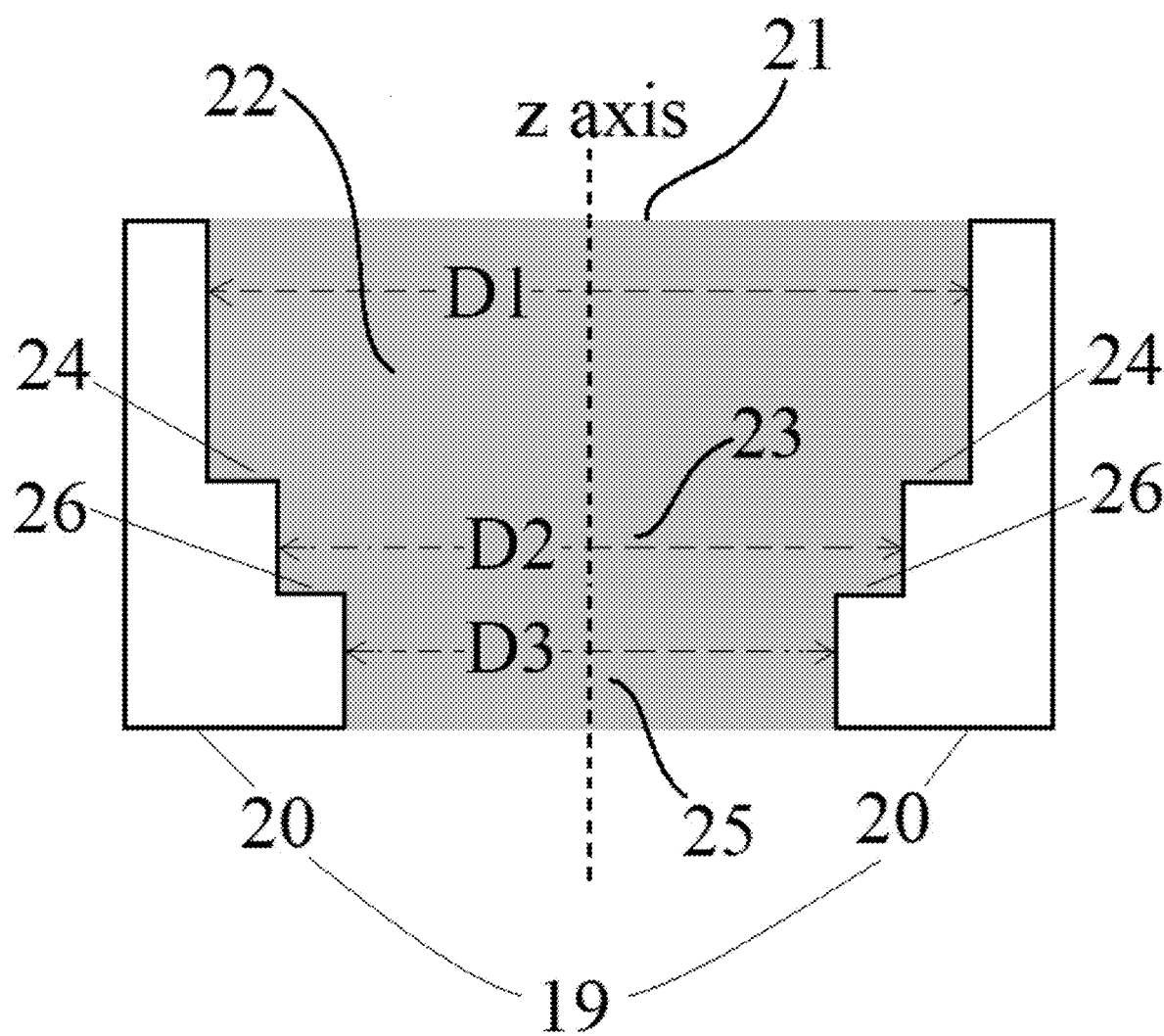
FIG. 35 schematically illustrates an electrode assembly forming a central channel space with a second non-cylindrical shape in accordance with an exemplary embodiment of the present invention.

In an exemplary embodiment of the invention as shown in FIG. 35, the non-cylindrical central channel space 21 consists of a first single right cylindrical segment 22 with a diameter D1, a second single right cylindrical segment 23 with a diameter D2, and a third single right cylindrical segment 25 with a diameter D3. A first shoulder 24 in parallel to x-y plane connects the first segment 22 to the second segment 23; and a second shoulder 26 in parallel to x-y plane connecting the second segment 23 to the third segment 25. D1>D2>D3.

Figure 36:
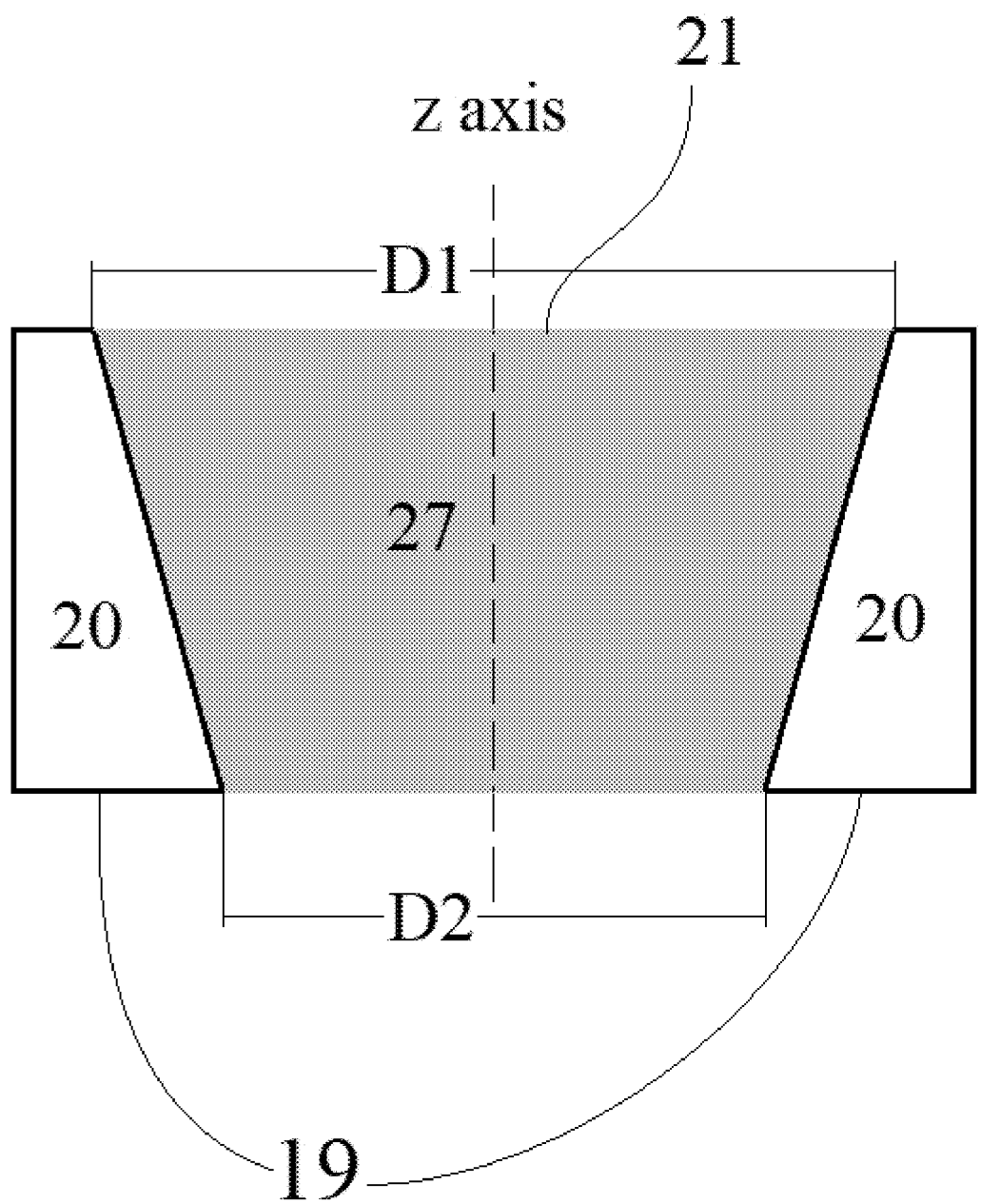
FIG. 36 schematically illustrates an electrode assembly forming a central channel space with a third non-cylindrical shape in accordance with an exemplary embodiment of the present invention.
Figure 37:
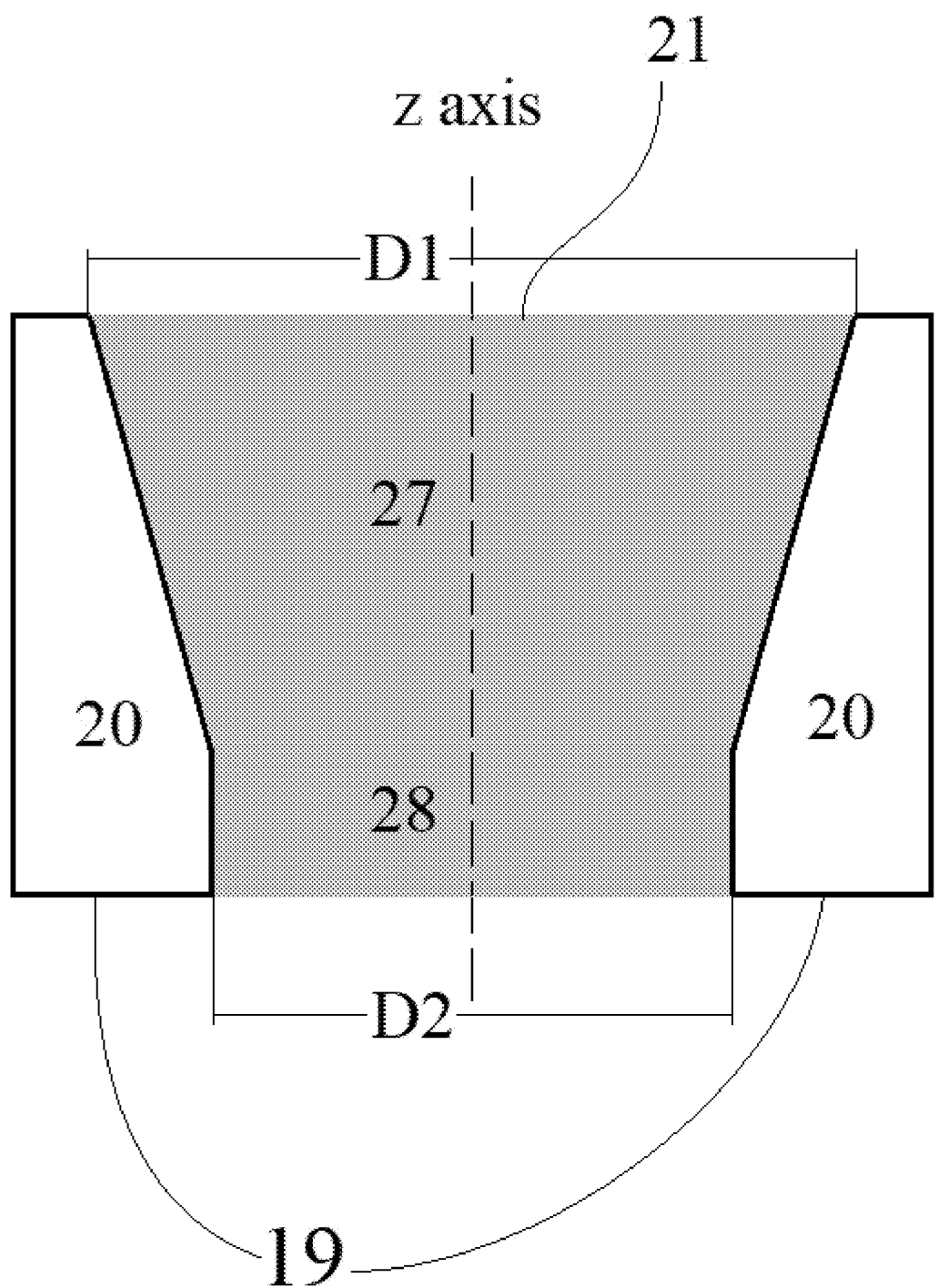
FIG. 37 schematically illustrates an electrode assembly forming a central channel space with a fourth non-cylindrical shape in accordance with an exemplary embodiment of the present invention.

In an exemplary embodiment of the invention as shown in FIG. 36, the non-cylindrical central channel space 21 comprises (or consists of) a truncated cone segment 27 (or a straight funnel-shaped segment) with a diameter decreasing from D1 to D2, and D1>D2. Alternatively, as shown in FIG. 37, the non-cylindrical central channel space 21 comprises (or consists of) a truncated cone segment 27 and a single right cylindrical segment 28 with a diameter D2, the former being continuously or seamlessly transitioned to the latter.

Figure 38:
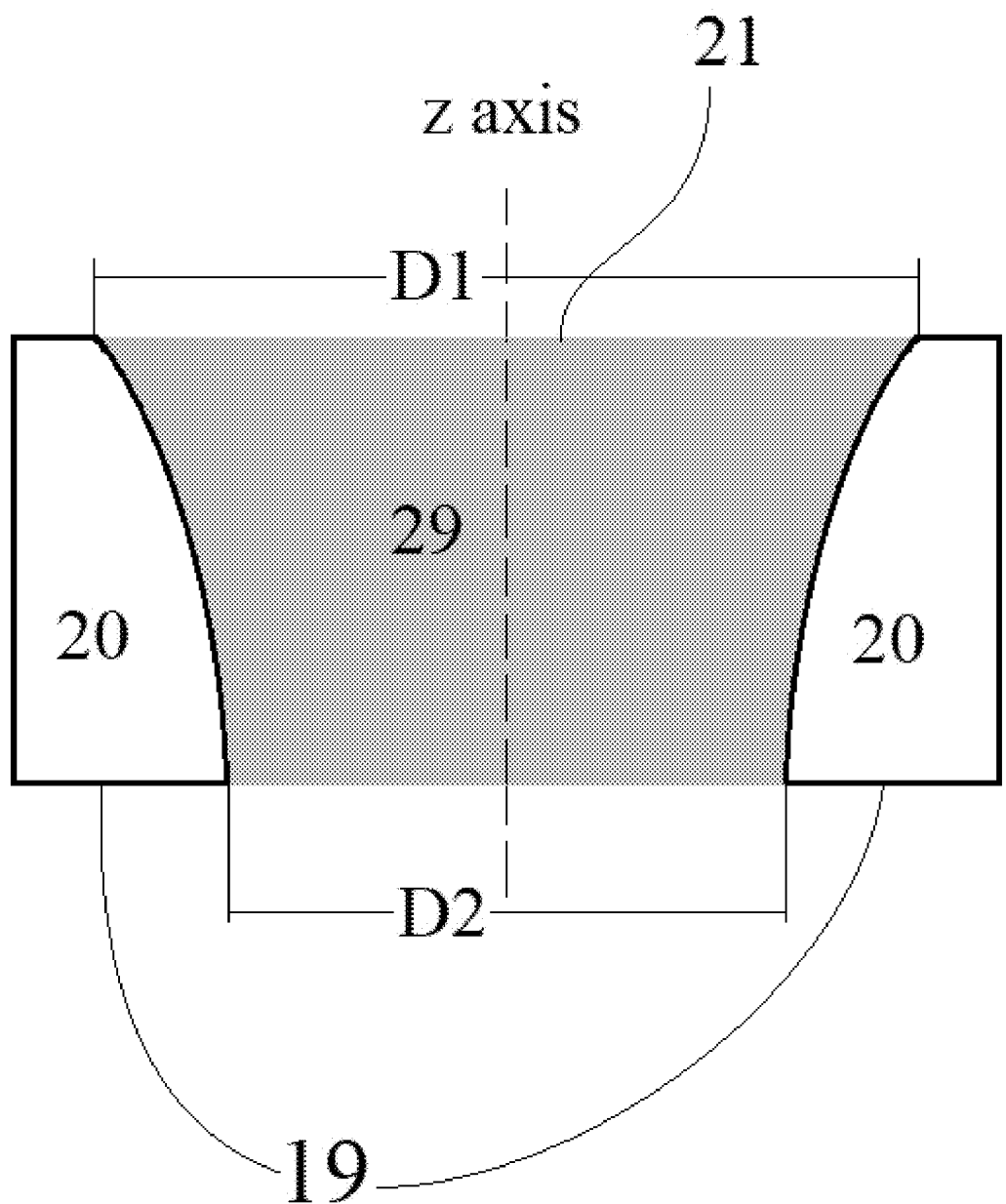
FIG. 38 schematically illustrates an electrode assembly forming a central channel space with a fifth non-cylindrical shape in accordance with an exemplary embodiment of the present invention.
Figure 39:
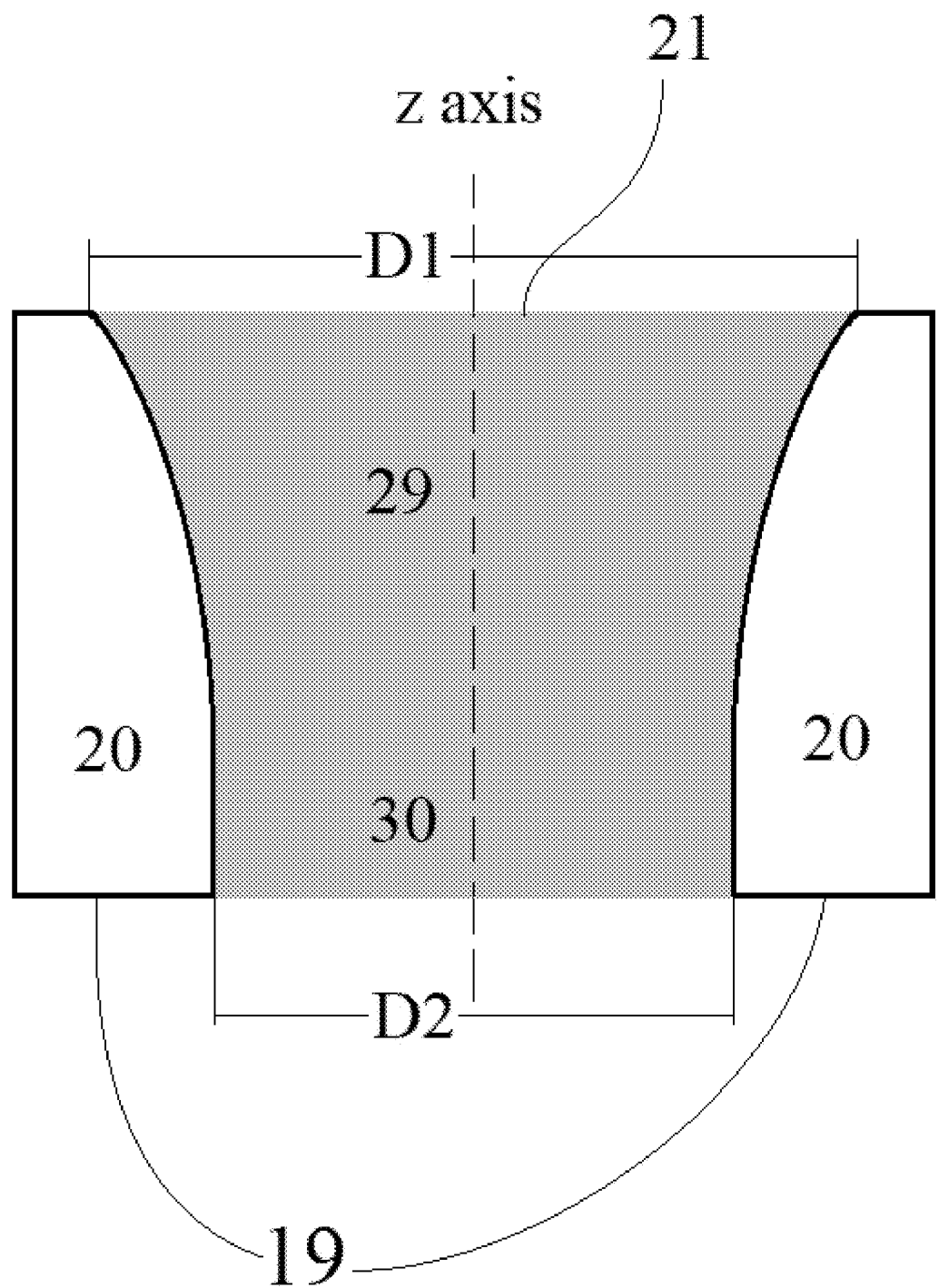
FIG. 39 schematically illustrates an electrode assembly forming a central channel space with a sixth non-cylindrical shape in accordance with an exemplary embodiment of the present invention FIG. 40 schematically illustrates a general electronic apparatus/device using an electrode assembly forming a non-cylindrical central channel space in accordance with an exemplary embodiment of the present invention.

In an exemplary embodiment of the invention as shown in FIG. 38, the non-cylindrical central channel space 21 comprises (or consists of) a trumpet-shaped segment 29 (or a curved funnel-shaped segment)) with a diameter decreasing from D1 to D2, and D1>D2. For example, segment 29 may have a shape like a half of hyperboloid of one sheet. Alternatively, as shown in FIG. 39, the non-cylindrical central channel space 21 comprises (or consists of) a trumpet-shaped segment 29 and a single right cylindrical segment 30 with a diameter D2, the former being continuously or seamlessly transitioned to the latter.

Figure 40:
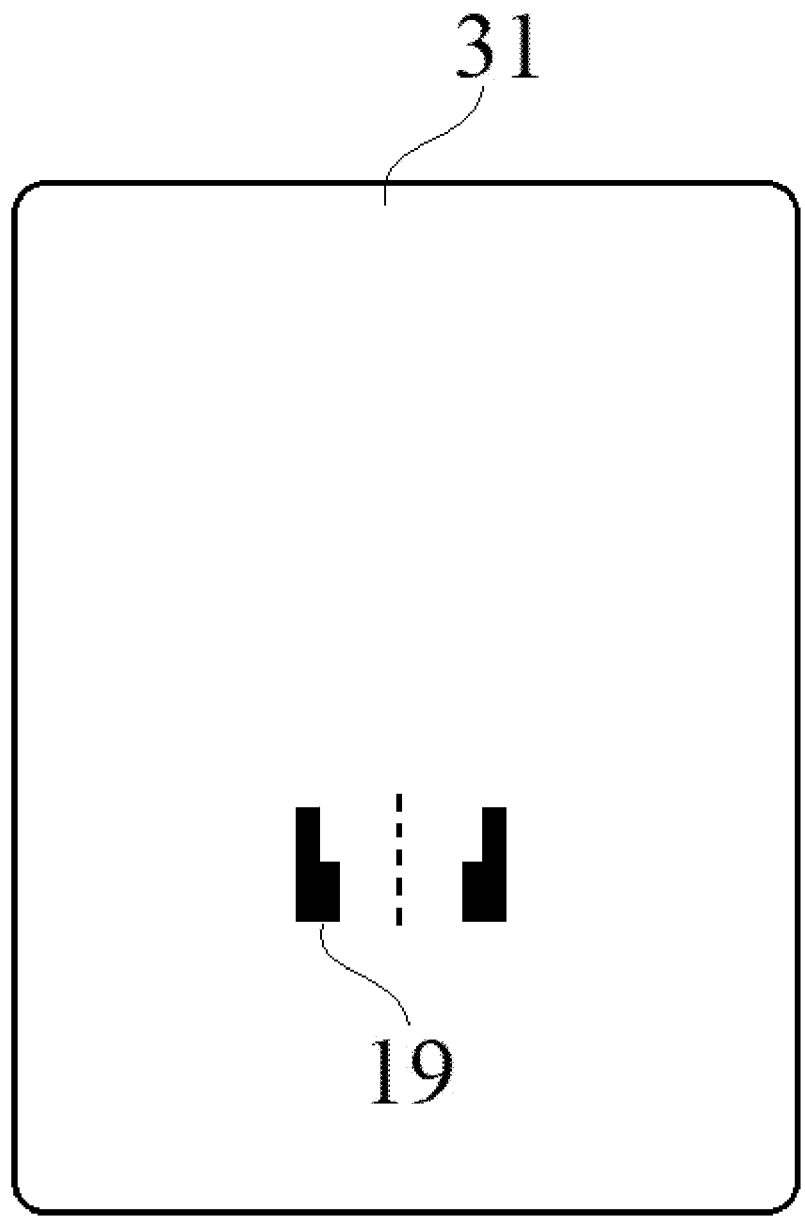
Figure 41:
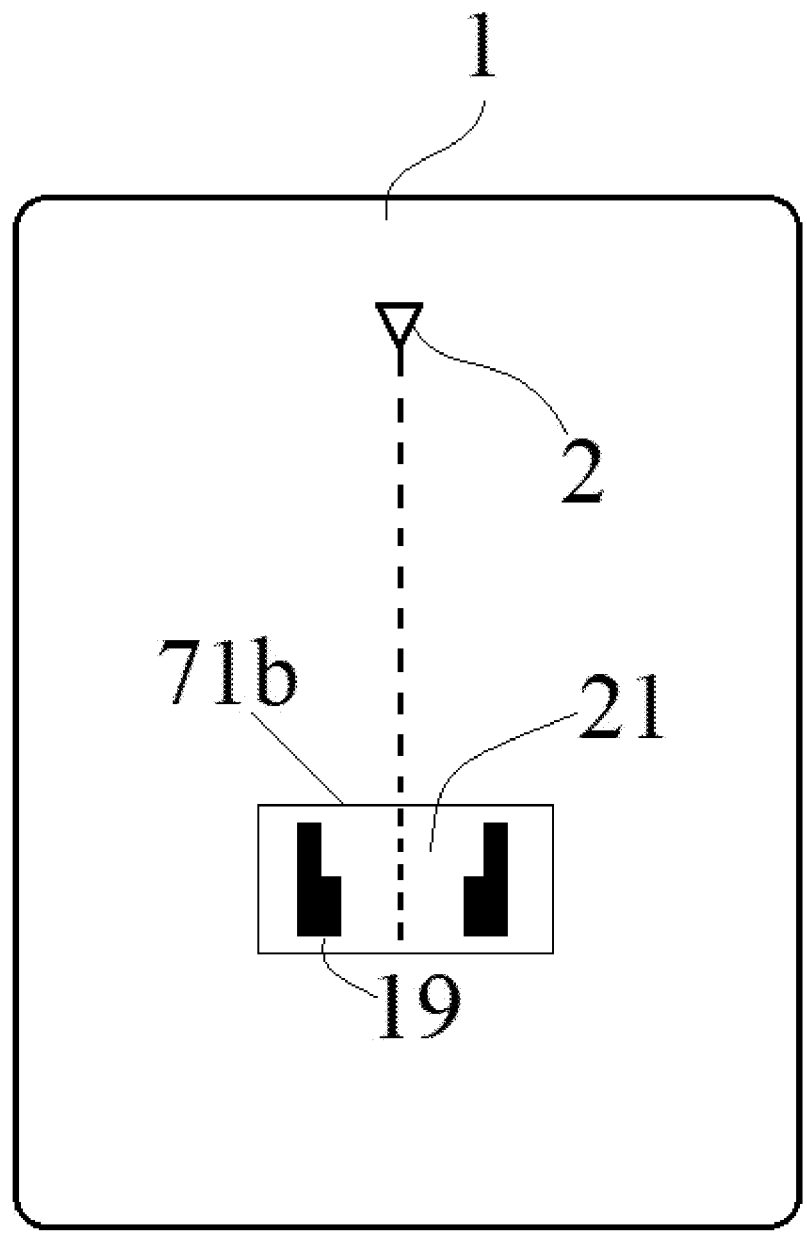
FIG. 41 schematically illustrates an apparatus of charged-particle beam in the EOS using an electrode assembly forming a non-cylindrical central channel space as a deflector in accordance with an exemplary embodiment of the present invention.

Various embodiments of the invention provide a general electronic apparatus/device 31 that includes the electrode assembly 19 with non-cylindrical central channel space 21, as shown in FIG. 40. Examples of electronic apparatus/device 31 include, but are not limited to, cathode-ray tube (CRT), an apparatus of charged-particle beam such as electron microscope useful for EOS 51 and an electron beam lithographical apparatus, and analytical instruments. For example, an apparatus of charged-particle beam 1 as shown in FIG. 41 may include a source 2 of charged particles configured to emit a beam of charged particles along a primary axis (e.g. z axis), and a deflector such as an electrostatic deflector 71*b* including the electrode assembly 19 as described above. The deflector 71*b* is configured to deflect the beam when the beam travels through the central channel space 21.

Figure 42:
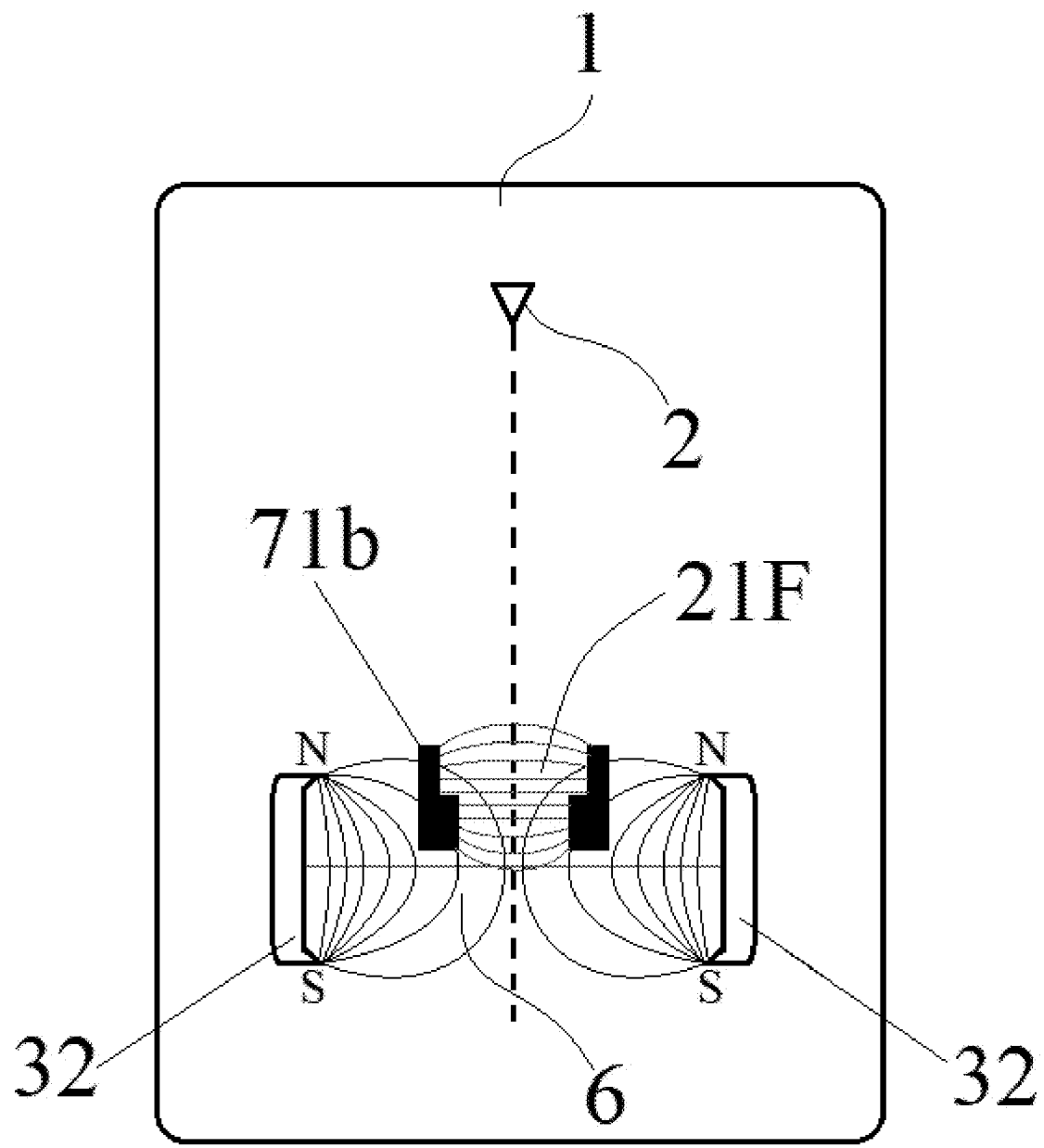
FIG. 42 schematically illustrates an apparatus of charged-particle beam in the EOS using an electrode assembly forming a non-cylindrical central channel space which is completely or partially immersed in a magnetic field in accordance with an exemplary embodiment of the present invention.

As shown in FIG. 42, the apparatus of charged-particle beam 1 may further include a magnetic field generator 32 configured to generate a magnetic field 6, sometimes known as magnetic lens field 6 or simply magnetic lens 6. The central channel space 21 is completely or partially immersed in the magnetic field 6 so that an electrical field 21F within the central channel space 21 is co-optimized or coupled with the magnetic field 6, as shown in FIGS. 42 and 50-52. The field pattern in the central channel space 21 is complex and is calculated to minimize the introduction of aberrations into the beam when deflecting the primary beam. Generally, this optimization or co-optimization is carried out by numerical methods on digital computer and seeks to maintain the circular shape of the beam at maximum deflection from the Z-axis. As will be described in detail, the magnetic field generator 32 may be a magnetic objective lens, and the electrical field 21F within the central channel space 21 is co-optimized or coupled with the magnetic field 6 for reducing aberration(s) such as distortion, field curvature, astigmatism, and chromatic aberration, after the beam passes through the central channel space 21. Alternatively or additionally, the magnetic field generator 32 may be a magnetic condenser.

Figure 43:
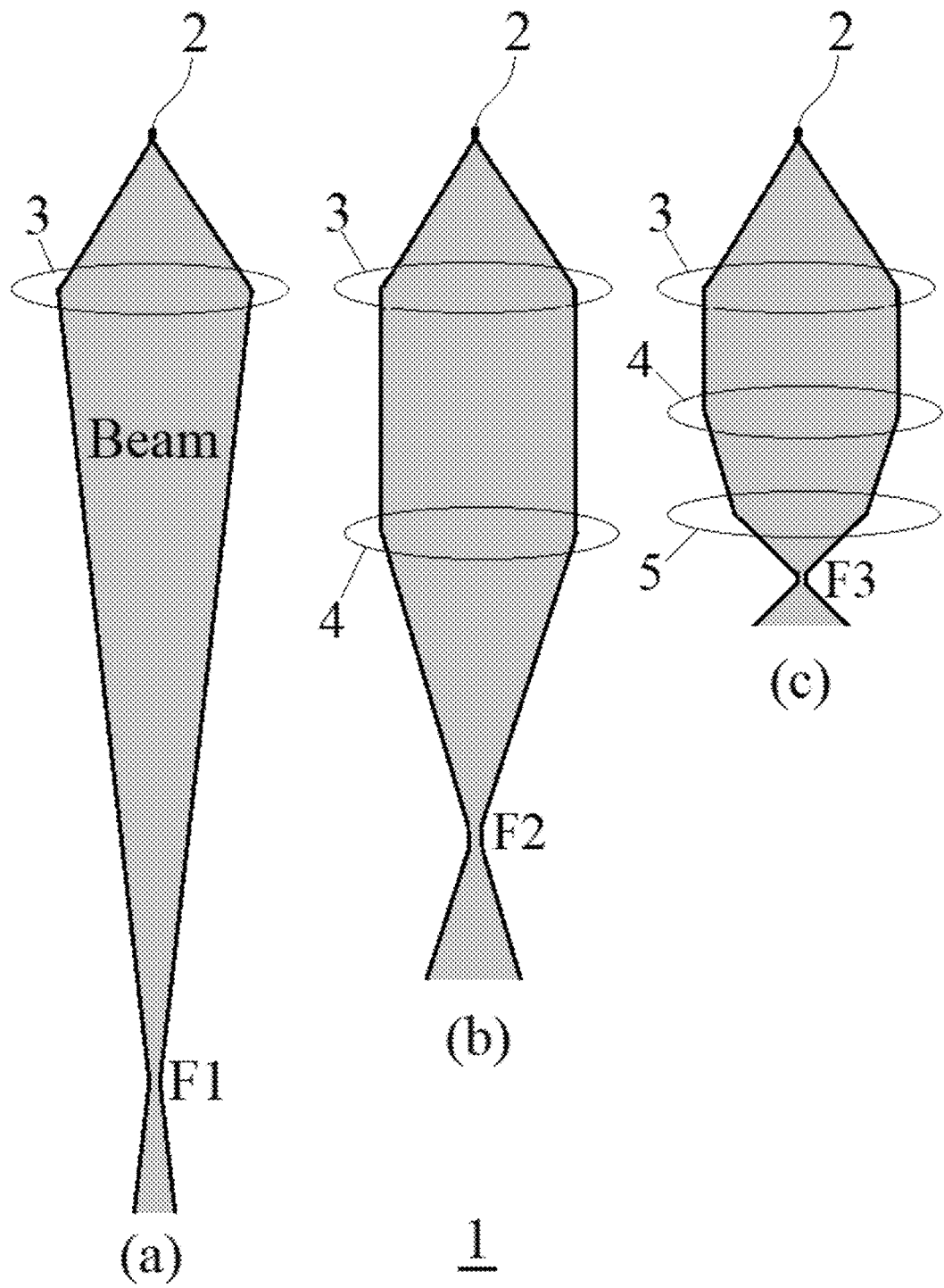
FIG. 43 schematically illustrates the formation of co-condensers in the EOS which can be optionally used with the electrode assembly (deflector) in an apparatus of charged-particle beam in the EOS in accordance with an exemplary embodiment of the present invention.
Figure 44:
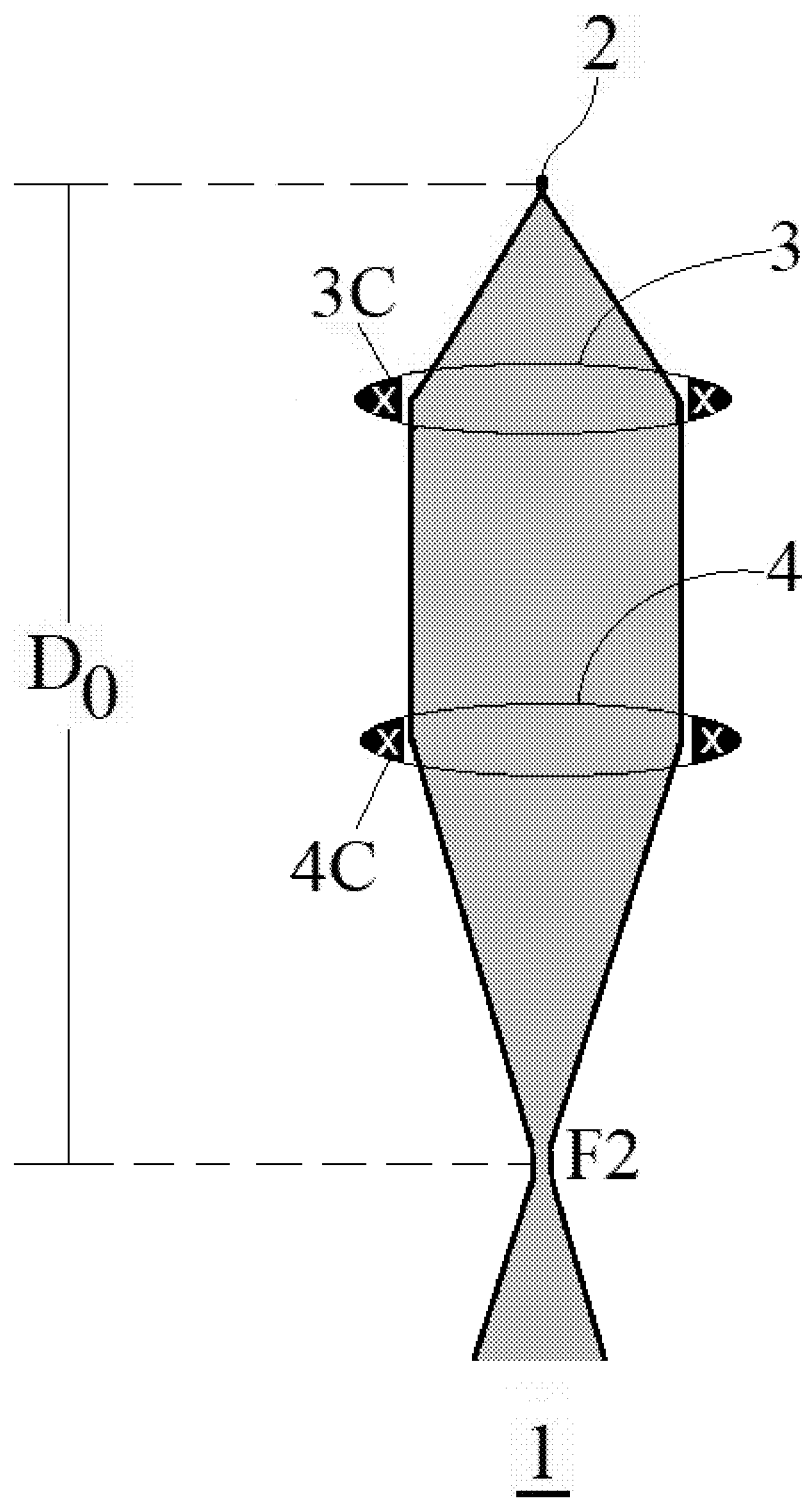
FIG. 44 shows two co-condensers with magnetic coils which can optionally be used with the electrode assembly (deflector) in an apparatus of charged-particle beam in the EOS in accordance with an exemplary embodiment of the present invention.

In the following exemplary embodiments, the deflector 71b is used with con-condensers as shown in FIGS. 43-44. The deflector 71b may also be a part of the deflection system 7 such as macroscopic deflection sub-system 71 shown in FIGS. 45-52.

In an apparatus of charged-particle beam such as an electron microscope (e.g. STEM) useful for EOS 51, the manipulation of an electron beam is performed using two physical effects. The interaction of electrons with a magnetic field will cause electrons to move according to the left-hand rule, thus allowing for electromagnets to manipulate the electron beam. The use of magnetic fields allows for the formation of a magnetic lens of variable focusing power, and the lens shape is determined by the distribution of magnetic flux. Electrostatic fields can cause the electrons to be deflected through a constant angle. Coupling of two deflections in opposing directions with a small intermediate gap allows for the formation of a shift in the beam path. From these two effects, as well as the use of an electron imaging system, sufficient control over the beam path is made possible. The lenses in the beam path can be enabled, tuned, and disabled entirely and simply via rapid electrical switching, the speed of which is only limited by effects such as the magnetic hysteresis.

In an apparatus 1 of charged-particle beam as shown in FIG. 43, a source 2 of charged particles is configured to emit a beam of charged particles. The source 2 may be for example an electron gun with a tungsten filament or a lanthanum hexaboride ($LaB_6$). In panel (a), a magnetic condenser 3 alone can focus the beam to a crossover spot F1. The beam is expanded after a crossover spot. In panel (b), another magnetic condenser 4 is placed between magnetic condenser 3 and crossover spot F1, and the beam is now focused to a new crossover spot F2 that is closer to source 2 than spot F1. In panel (c), a third magnetic condenser 5 is placed between magnetic condenser 4 and crossover spot F2, and the beam is again focused to another new crossover spot F3 that is even closer to source 2 than spot F2.

Generally, a condenser lens forms an image of the primary electron beam source for an objective lens, and the objective lens focuses the condenser lens image onto a specimen. Transmitted, secondary and backscattered electrons are released from the specimen material. These electrons are detected, amplified and the resulting signal used to modulate the beam of an imaging system operating synchronously with the scanning electron beam. The result is an image of the scanned area based on the electrons emitted or scattered from the specimen.

In the present invention, the term "co-condensers" is defined as two or more magnetic condensers configured to coherently focus the beam to a single crossover spot F. For example, magnetic condensers 3 and 4 in panel (b) coherently focus the beam to a single crossover spot F2, and they may be called a set of co-condensers. Magnetic condensers 3, 4 and 5 in panel (c) coherently focus the beam to a single crossover spot F3, and they may also be called a set of co-condensers. As shown in FIG. 43, the beam does not have any crossover spot between any two of the two or more magnetic condensers within a set of co-condensers.

The crossover spot F may be movable or immovable. In some embodiments of the invention, the single crossover spot F is so controlled that it remains stationary or immovable relative to the source 2 of charged particles. For example, crossover spot F2 may be kept stationary relative to the source 2, i.e. the distance D0 between spot F2 and source 2 remains unchanged. By the same token, crossover spot F3 may be kept stationary relative to the source 2, i.e. the distance D0 between spot F3 and source 2 remains unchanged.

While the single crossover spot F remains immovable relative to the source 2 of charged particles, the size A of the beam at crossover spot F (i.e. the cross-sectional area of the beam at F) may be so controlled to have a desired value. Preferably, size A may be tuned/adjusted by concertedly tuning/adjusting the individual condensing capacity of the two or more magnetic condensers within a set of co-condensers. For example, the condensing capacity of condenser 3 and that of condenser 4 may be individually but concertedly tuned/adjusted so that not only the single crossover spot F2 is fixed relative to the source 2, but also the size A of the beam at crossover spot F2 is controlled to have a value as desired. Likewise, the condensing capacities of two or more condensers 3, 4 and 5 may be individually but concertedly tuned/adjusted so that not only the single crossover spot F3 is fixed relative to the source 2, but also the size A of the beam at crossover spot F3 is controlled to have a value as desired. The two or more co-condensers are therefore configured to coherently focus the beam to the same cross-over point with different magnification rates.

As described above, the present invention is related to a rapid and automatic virus imaging and analysis system comprising one or more electron optical sub-systems (EOSs), each of which has a large field of view (FOV) and is capable of instant magnification switching for rapidly scanning a virus sample. In some embodiments, the "instant magnification switching" is at least partially made possible by the two or more co-condensers that are configured to coherently focus the beam to the same cross-over point with different magnification rates.

Although the apparatus 1 may include one, two or more sets of co-condensers, in some preferred embodiments of the invention, the apparatus 1 includes only one set of co-condensers with only two magnetic condensers configured to coherently focus the beam to a single crossover spot F. For example, the apparatus 1 may include only one set of co-condensers as shown in Panel (b) of FIG. 43 with only two magnetic condensers (3, 4) configured to coherently focus the beam to a single crossover spot F2.

Referring to FIG. 44, the only two magnetic condensers (3, 4) include a distal magnetic condenser 4 which is distal to the source 2, and a proximal magnetic condenser 3 that is located between the source 2 and the distal magnetic condenser 4. The proximal magnetic condenser 3 comprises a magnetic coil 3C driven by a coil current $I1$; and the distal magnetic condenser 4 comprises a magnetic coil 4C driven by a coil current $I2$. Generally, both coil currents $I1$ and $I2$ are greater than 0 (>0).

In preferred embodiments of the invention, coil currents $I1$ and $I2$ are configured to position single crossover spot F2 at a fixed position, i.e. maintain a predetermined distance D0 from source 2. With the "Fixed F2" condition being met, the size A of the crossover spot F2 may be increased by increasing coil current $I1$ and/or decreasing coil current $I2$; and decreased by decreasing coil current $I1$ and/or increasing coil current $I2$. The size A of the crossover spot F2 will be minimized when coil current $I1$ reaches its minimal value while coil current $I2$ reaches its maximal value. The size A is maximized when coil current $I2$ reaches its minimal value while I1 reaches its maximal value. There is no special limitation on the maximized size A, it may be smaller than, equal to, or bigger than the size of the source 2.

Figure 45:
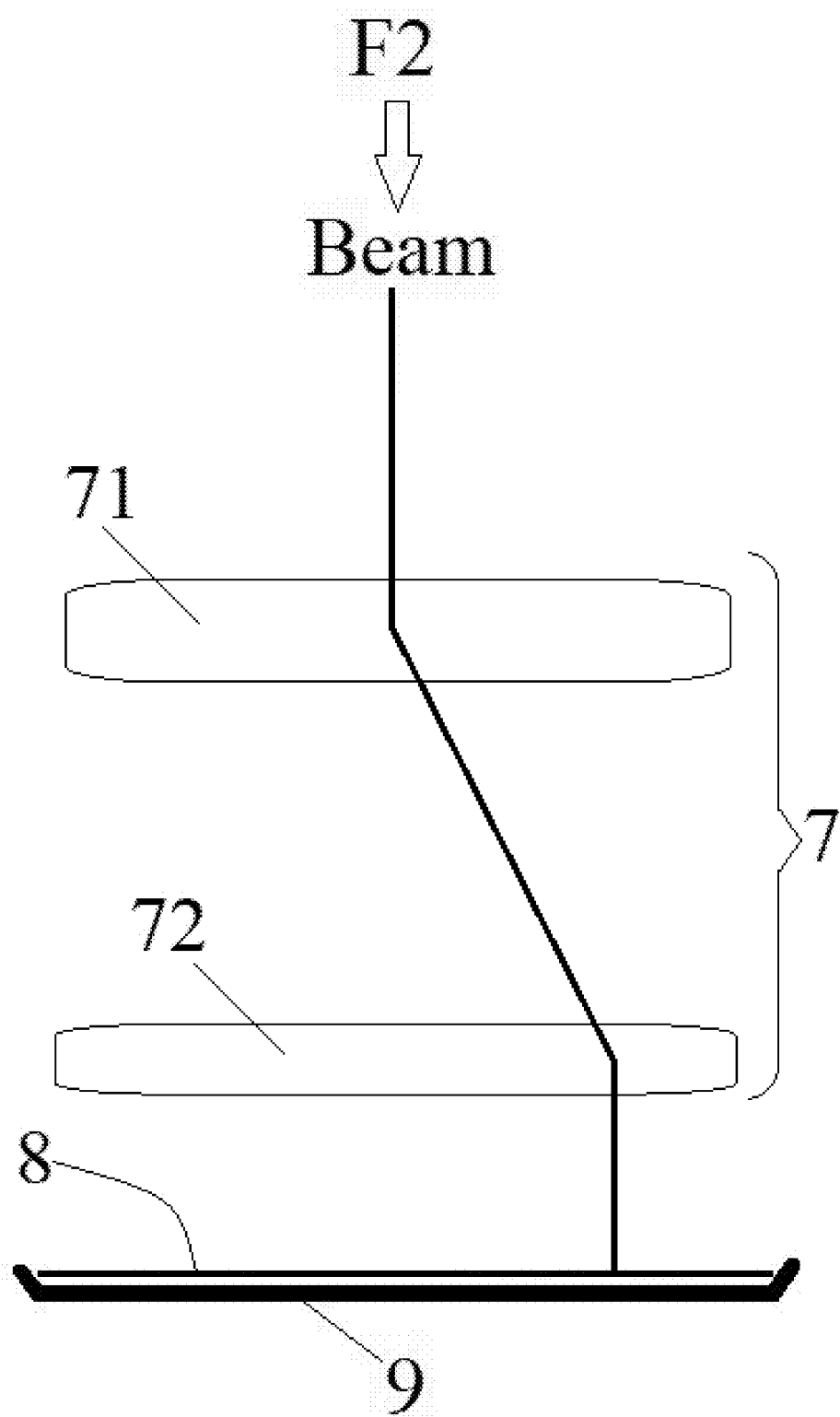
FIG. 45 illustrates an apparatus of charged-particle beam in the EOS with a magnetic objective lens and a deflection system including the electrode assembly (deflector) in accordance with an exemplary embodiment of the present invention.
Figure 50:
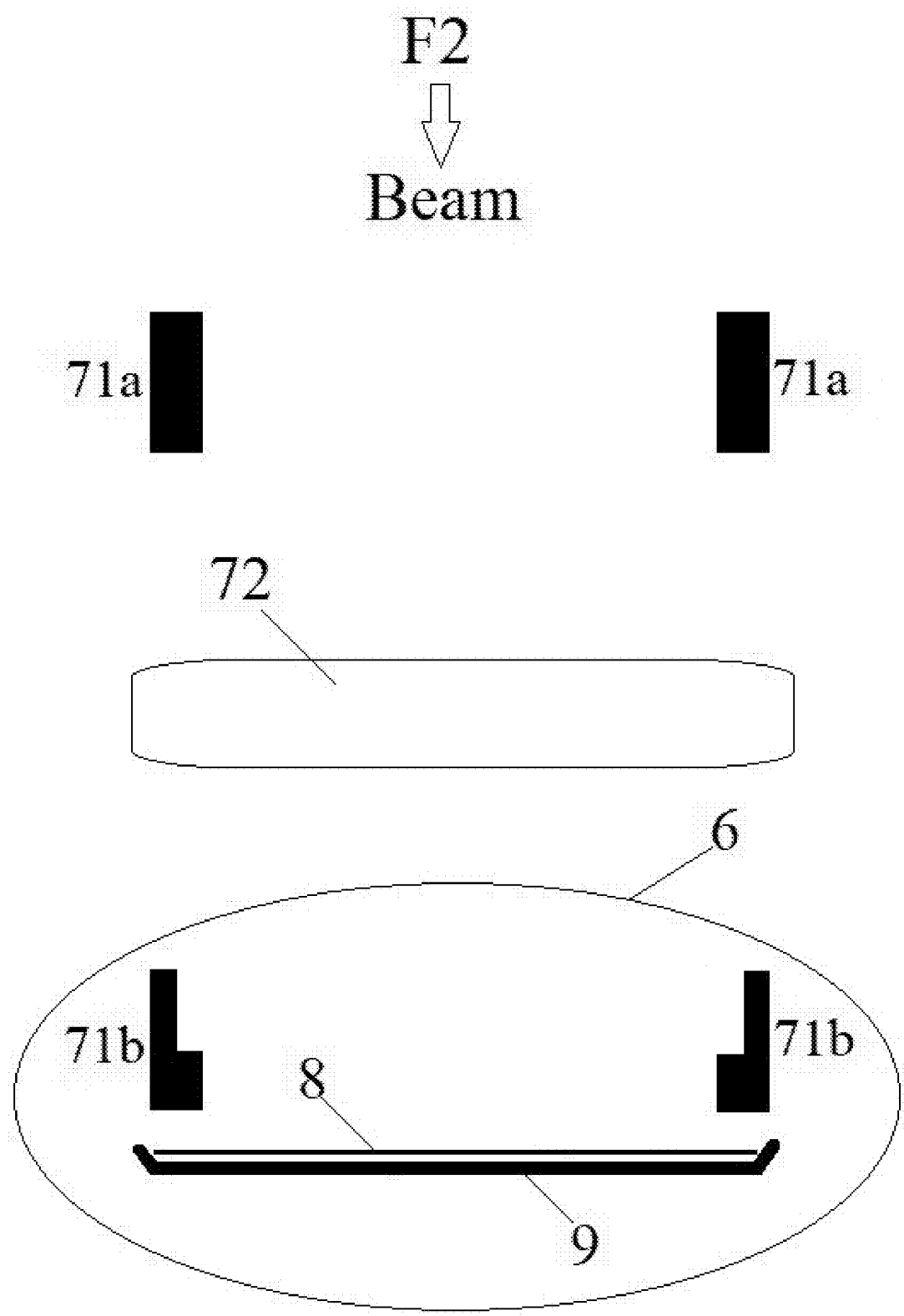
FIG. 50 schematically illustrates the configuration of a macroscopic deflection sub-system in the EOS including the electrode assembly (deflector) in accordance with an exemplary embodiment of the present invention.
Figure 51:
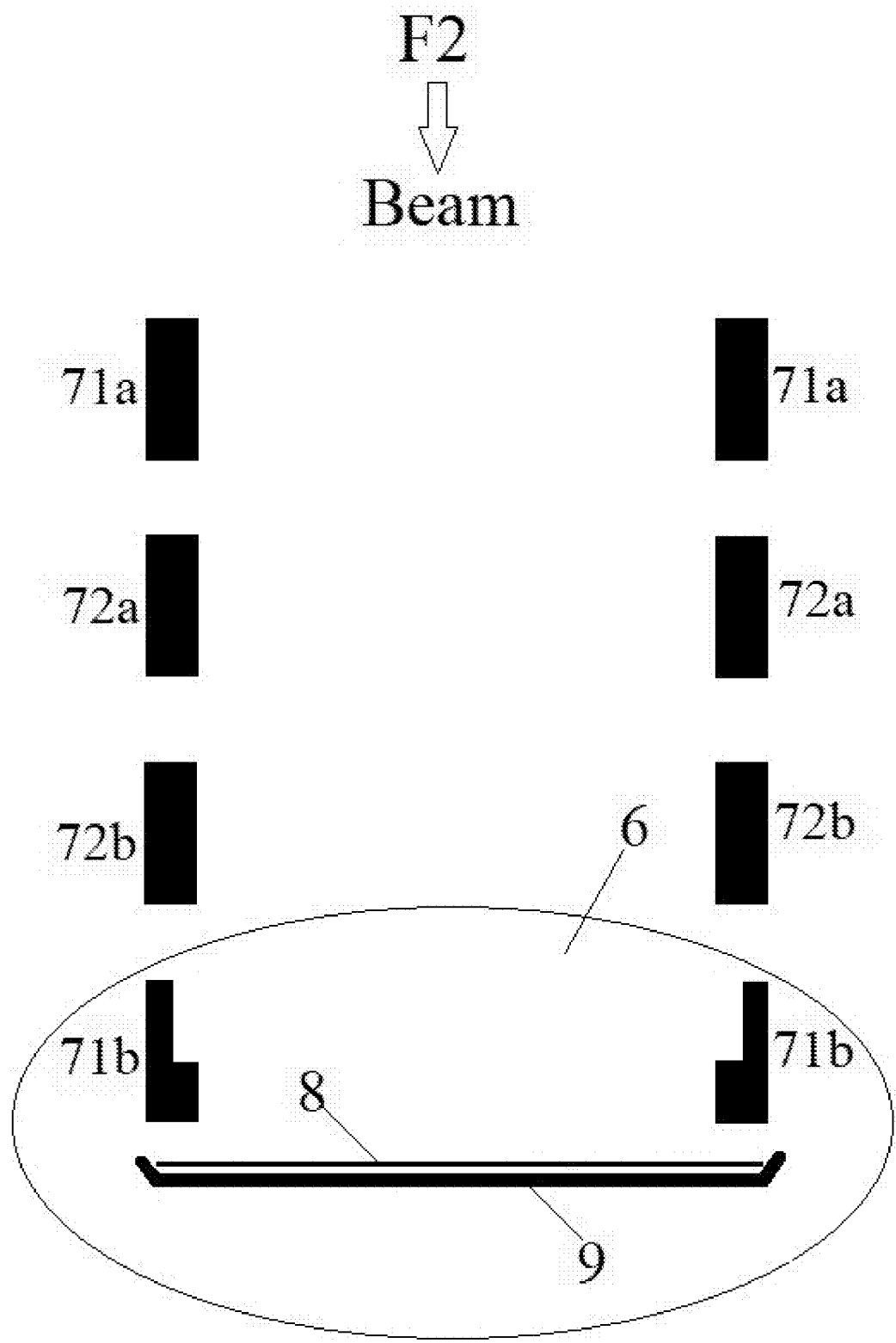
FIG. 51 schematically illustrates the configuration of a microscopic deflection sub-system in the EOS in accordance with an exemplary embodiment of the present invention.
Figure 52:
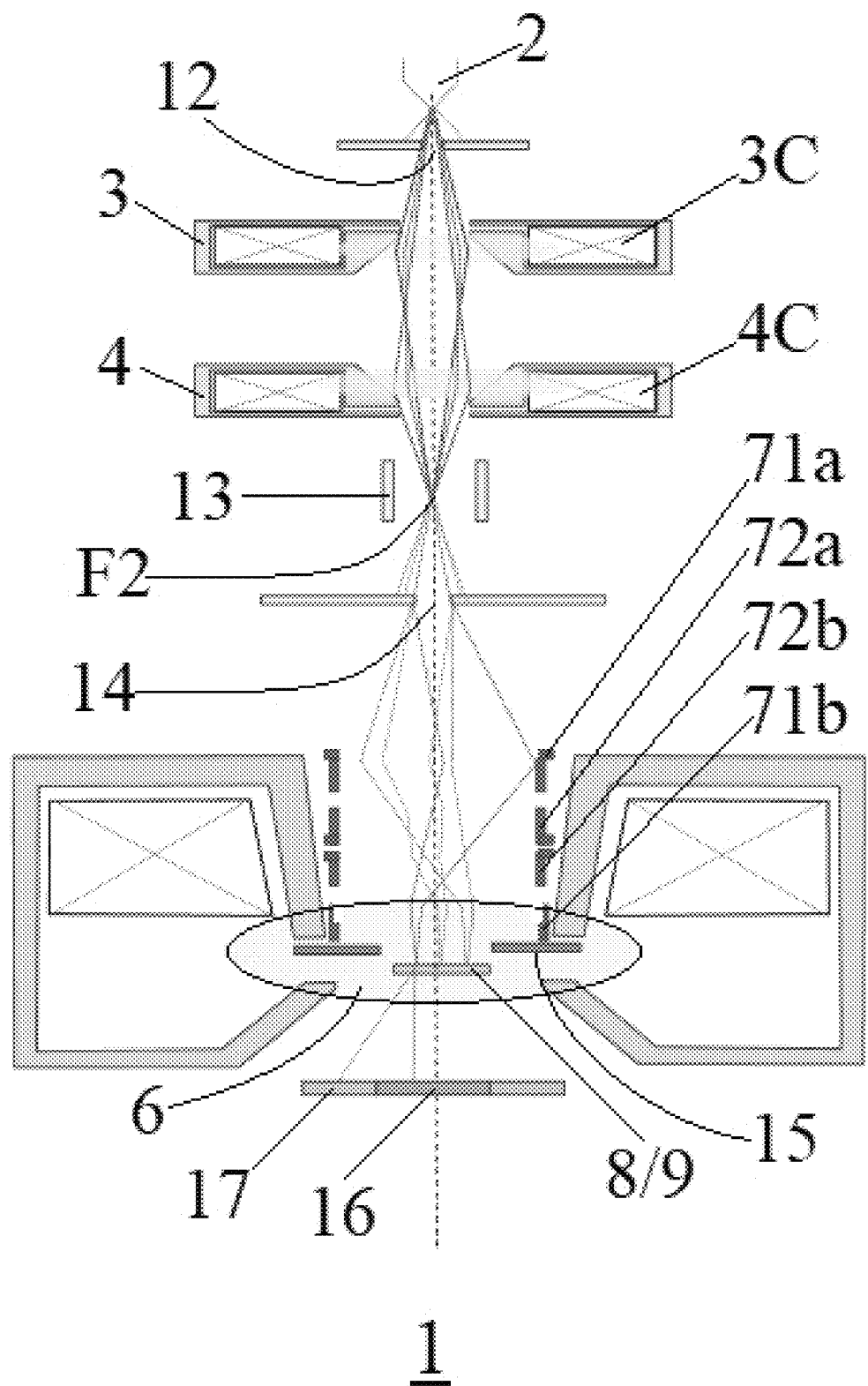
FIG. 52 shows an apparatus of charged-particle beam in the EOS with two co-condensers and the electrode assembly (deflector) in accordance with an exemplary embodiment of the present invention.

In various exemplary embodiments as shown in FIG. 45, the apparatus of charged-particle beam according to the invention may include a magnetic objective lens 6 (as shown in FIGS. 50-52) and a deflection system 7 including the electrode assembly (deflector) of the present invention, which are downstream with respect to the single crossover spot F (e.g. F2). Although electron lenses may operate electrostatically or magnetically, most electron lenses use electromagnetic coils to generate a convex lens. The field produced for the lens is typically radially symmetrical, as deviation from the radial symmetry of the magnetic lens causes aberrations such as astigmatism and worsens spherical and chromatic aberration. For example, a quadrupole lens is an arrangement of electromagnetic coils at the vertices of the square, enabling the generation of a lensing magnetic fields, the hexapole configuration simply enhances the lens symmetry by using six, rather than four coils. Electron lenses may be manufactured from iron, iron-cobalt or nickel cobalt alloys, such as permalloy, due to their good magnetic properties, such as magnetic saturation, hysteresis and permeability. It should be appreciated that the objective lens 6 may be an electromagnetic lens or an electrostatic lens.

Objective lens 6 allows for electron beam convergence, with the angle of convergence as a variable parameter. The magnification may be simply changed by modifying the amount of current that flows through the coil of lenses. Lens 6 may include yoke, magnetic coil, poles, pole piece, and external control circuitry. An electromagnetic lens may include an upper pole piece and a lower pole piece. The pole piece must be manufactured in a very symmetrical manner, as this provides the boundary conditions for the magnetic field that forms the lens. Imperfections in the manufacture of the pole piece can induce severe distortions in the magnetic field symmetry, which induce distortions that will ultimately limit the lenses' ability to reproduce the object plane. The exact dimensions of the gap, pole piece internal diameter and taper, as well as the overall design of the lens is often performed by finite element analysis of the magnetic field, taking into account of the thermal and electrical constraints of the design. The coils which produce the magnetic field are located within the lens yoke. The coils can contain a variable current, but typically utilize high voltages, and therefore require significant insulation in order to prevent short-circuiting the lens components. Thermal distributors are placed to ensure the extraction of the heat generated by the energy lost to resistance of the coil windings. The windings may be water-cooled, using a chilled water supply in order to facilitate the removal of the high thermal duty. A magnetic lens may include a magnetic material and exciting coils for providing magnetomotive force to a magnetic circuit having field lines through the magnetic material and between pole faces.

For the deflection system 7, it may include a macroscopic deflection sub-system 71 and a microscopic deflection sub-system 72, and the sub-system 71 may include the electrode assembly (deflector) of the present invention. The deflection system 7 causes the beam to position at, and scan across, a large field of view (FOV) on a specimen plane 8 of a specimen under examination in a specimen holder 9 and one or more small FOVs within the large FOV.

Figure 46:
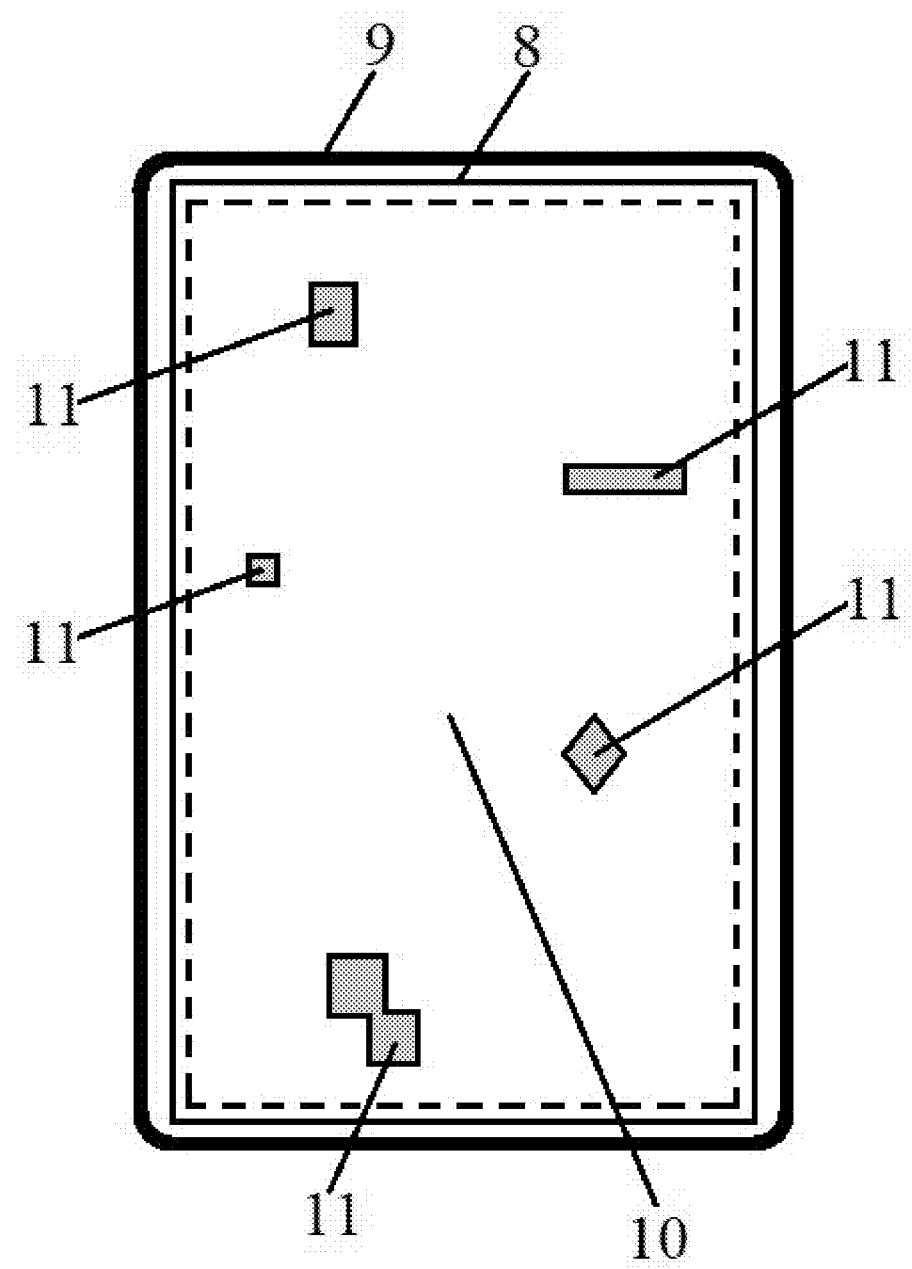
FIG. 46 demonstrates a single large field of view (FOV) on the specimen plane of the apparatus in the EOS with a deflection system including the electrode assembly (deflector) in accordance with an exemplary embodiment of the present invention.
Figure 47:
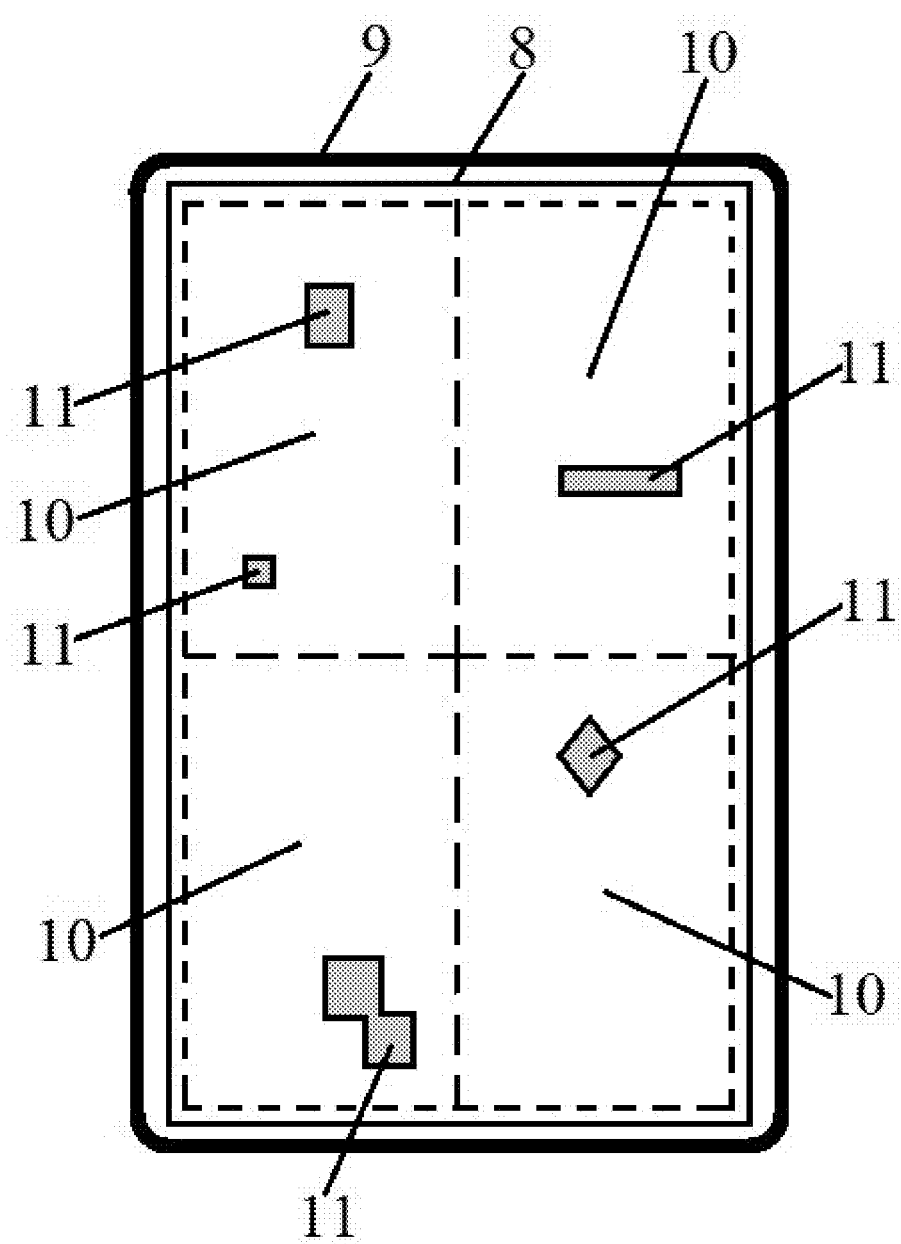
FIG. 47 demonstrates multiple large FOVs on the specimen plane of the apparatus in the EOS with a deflection system including the electrode assembly (deflector) in accordance with an exemplary embodiment of the present invention.

As shown in FIGS. 46 and 47, the macroscopic deflection sub-system 71 causes the beam to scan across a large field of view (FOV) 10 on the specimen plane 8 of the specimen holder 9, and the microscopic sub-deflection system 72 causes the beam to position at, and scan across, one or more small FOVs 11 within a large FOV.

For example, the macroscopic deflection sub-system 71 may cause the beam to scan across a large field of view (FOV) 10 on virus sample 56 loaded on sample grid 55 (as shown in FIG. 5) within the EOS 51. The microscopic sub-deflection system 72 may cause the beam to position at, and scan across, one or more small FOVs 11 within a given large FOV of virus sample 56 loaded on sample grid 55 (as shown in FIG. 5).

As shown in FIG. 46, the specimen plane 8 may contain only one large FOV 10, which may contain zero, one, two, three or more small FOVs 11. In FIG. 47, the specimen plane 8 may contain two, three or more large FOVs 10, each of which may contain zero, one, two, three or more small FOVs 11.

Figure 48:
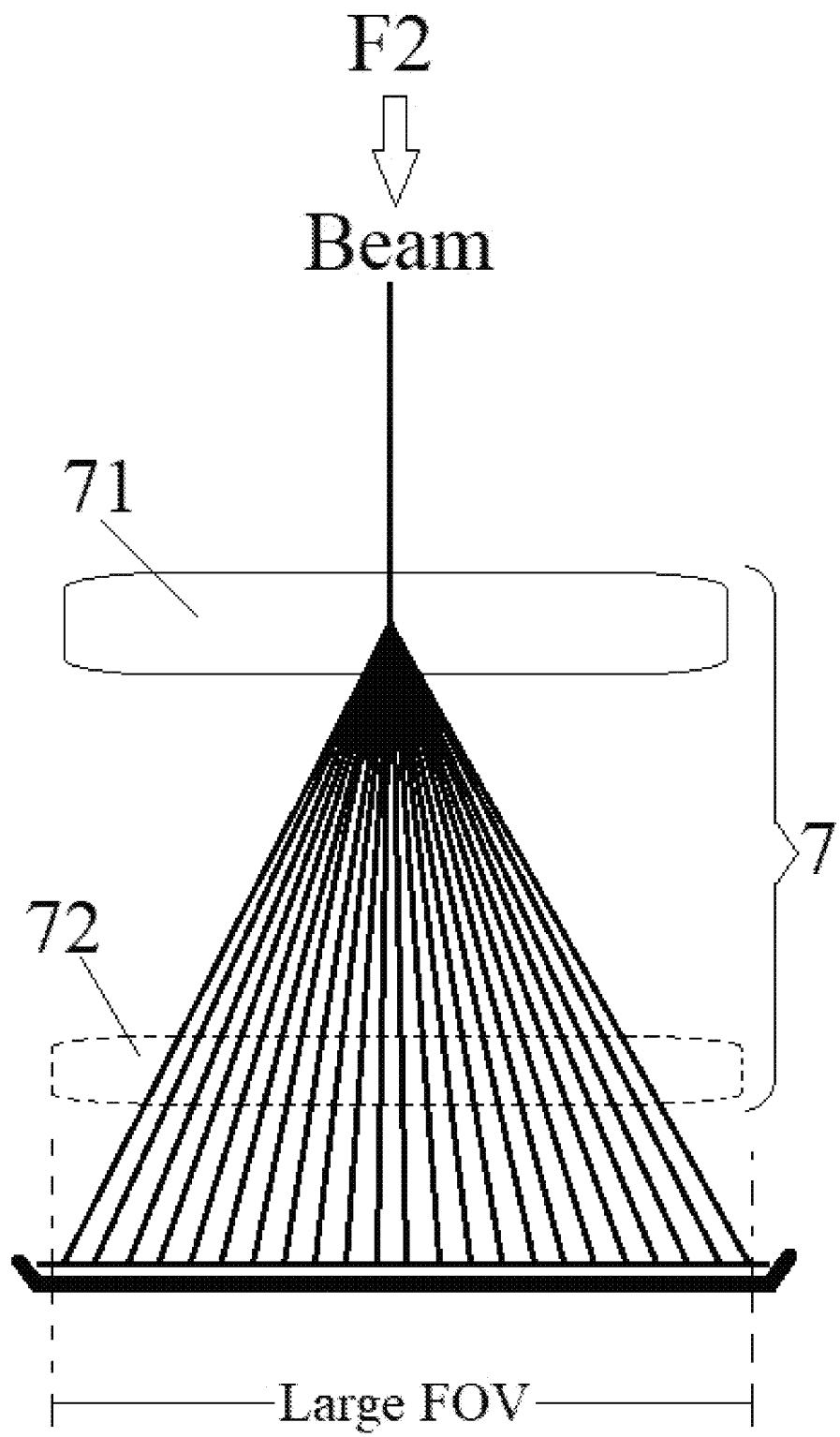
FIG. 48 illustrates a macroscopic deflection sub-system in the EOS including the electrode assembly (deflector) in accordance with an exemplary embodiment of the present invention that alone causes the beam to scan across a large FOV.

In the first step of an examination process as shown in FIG. 48, a user may turn off or inactivate the microscopic sub-deflection system 72. Then, the macroscopic deflection sub-system 71 causes the beam to scan across a large FOV 10 on the specimen plane 8 of the specimen holder 9 under a lower resolution (e.g. 10 nm). After the large FOV scanning is completed, the user finds a pattern of interesting (POI) in one or more small FOVs 11 within that large FOV 10, and the user will then zoom into the POI for further examination with a higher resolution (e.g. 1 nm). As an advantage of the present invention, the user will not need to mechanically move the specimen holder 9 to reposition or align the specimen plane 8 to the center of a target small FOV 11. In other words, the specimen holder 9 remains stationary relative to the source 2 of charged particles, no matter the beam is scanning across a given large FOV 10 or subsequently scanning across one, two or more small FOVs 11 within that large FOV 10.

Figure 49:
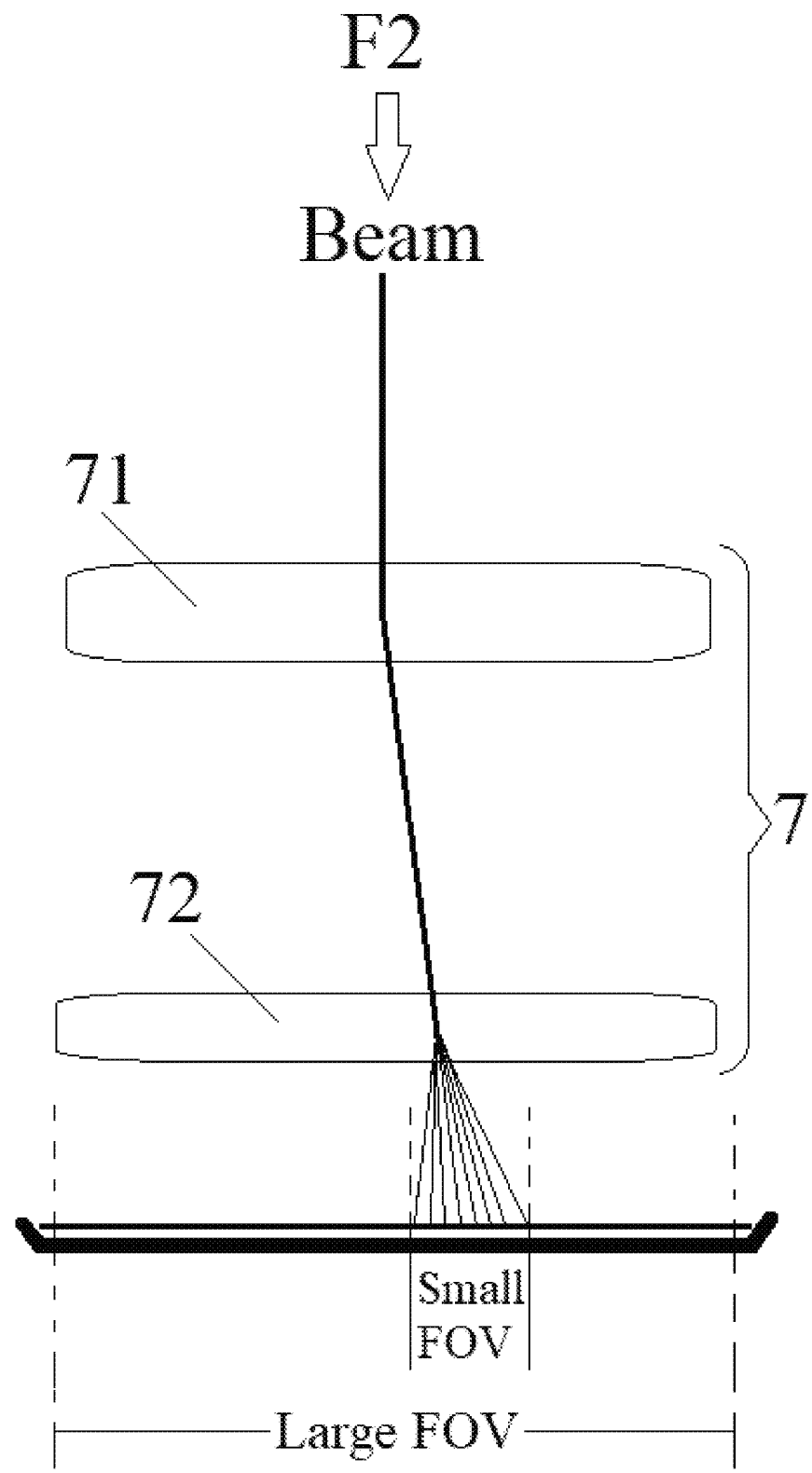
FIG. 49 illustrates a microscopic deflection sub-system in the EOS causing the beam to scan across a small FOV in accordance with an exemplary embodiment of the present invention.

Instead, the user may run the second step by simply retrieving stored deflecting parameter(s) of the macroscopic deflection sub-system 71 which previously directed the beam to the center of the target small FOV 11. The retrieved deflecting parameter(s) of the macroscopic deflection sub-system 71 will then be re-applied to the subsystem 71, to direct the beam to the center of the target small FOV 11. Generally, the position of any small FOV within a large FOV may be controlled as desired by the macroscopic deflection sub-system 71 by retrieving and re-applying stored deflecting parameters (e.g. voltage). As shown in FIG. 49, after the position of the small FOV within the large FOV is fixed by the macroscopic deflection sub-system 71, the retrieved and re-applied deflecting parameter(s) of the macroscopic deflection sub-system 71 will remain unchanged. Then, the deflecting parameter(s) of the microscopic deflection sub-system 72 is/are varied to cause the beam to scan across the small FOV with a higher resolution.

In various embodiments of the invention, when the beam scans across the large FOV 10 in the first step, the spot F2 has a size A1. When the beam scans across the small FOV 11 within the large FOV 10 in the second step, the spot F2 has a size A2, and A2<A1. The inequation of A2<A1 will result in the resolution for scanning a small FOV is higher than that for a large FOV.

Typically, the size of the large FOV 10 is adjustable, and its image may range from 50 um×50 um to 200 um×200 um in size with a resolution of 0.5-20 nm. For example, the large FOV 10 may have a size of 100 um×100 um with a resolution of 8 nm. The small FOV 11 (e.g. POI, or area of interest) is also adjustable, and it may range from 0.5 um×0.5 um to 5 um×5 um in size with a resolution of 0.5-2 nm. For example, the small FOV may have a size of 5 um×5 um with a resolution of 0.5 nm.

As shown in FIG. 50, the macroscopic deflection sub-system 71 may include an upper deflector 71a, and a lower deflector 71b which includes the electrode assembly of the present invention. The microscopic deflection sub-system 72 may be located between the upper deflector 71a and the lower deflector 71b of the macroscopic deflection system 71. The specimen holder 9 may be downstream with respect to the lower deflector 71b of the macroscopic deflection sub-system 71. As shown in FIG. 51, the microscopic deflection sub-system 72 may also include an upper deflector 72a and a lower deflector 72b.

Any other components known in any apparatus of charged-particle beam or their proper combination may be incorporated in the present invention. For a skilled person in the art, many of the components not shown in FIG. 43 are well-known, for example, suppressor electrode, beam extractor, anode, gun aperture, condenser lens that is responsible for primary beam formation, beam blanker, stigmator for the correction of asymmetrical beam distortions, objective aperture, SEM up detector, deflector, bright field (BF) detector, dark field (DF) detector. A system for the insertion into, motion within, and removal of specimens from the beam path is also needed. The system may include load lock, chamber interlock, lock port, loading and unloading mechanism, and transfer table. Other parts in the microscope may be omitted or merely suggested. In a specific yet exemplary electron microscope 1 as shown in FIG. 52, the source of charged particles may be an electron gun 2 configured to emit an electron beam through gun aperture 12. Along the beam trajectory, co-condenser 3 with magnetic coil 3C is placed between gun aperture 12 and co-condenser 4 with a magnetic coil 4C. The electron beam is focused to crossover spot F2 before it passes through beam blanking 13. After the beam passes through objective aperture 14, it is deflected by an upper deflector 71a and a lower deflector 71b in the macroscopic deflection sub-system 71. It can also be deflected by an upper deflector 72a and a lower deflector 72b in the microscopic deflection sub-system 72. In the meanwhile, the beam is focused by the magnetic objective lens 6 onto a specimen within the specimen holder 9. Electrons scattered from and penetrated through the specimen are detected by the BSE detector 15, BF detector 16 and DF detector 17 for generating specimen images. Deflectors 71a, 72a, 72b and 71b may reside in the central bore the magnetic objective lens 6, and they are disk-shaped rings which are axially symmetric about the Z-axis. Each deflector may have a same or different diameter and may fit at a particular position along the Z-axis. An actual bucket-shaped structure may be used to holds the deflectors, and the structure is inserted into the bucket-shaped space of the lens system thus making assembly easier.

The multiple deflection system (71a, 71b, 72a and 72b) is designed to control electron deflection with different FOV size. For example, deflectors or deflection nodes 71a and 71b control electron beam to be incident on a large FOV, while deflectors 72a and 72b on a small FOV size.

Figure 53:
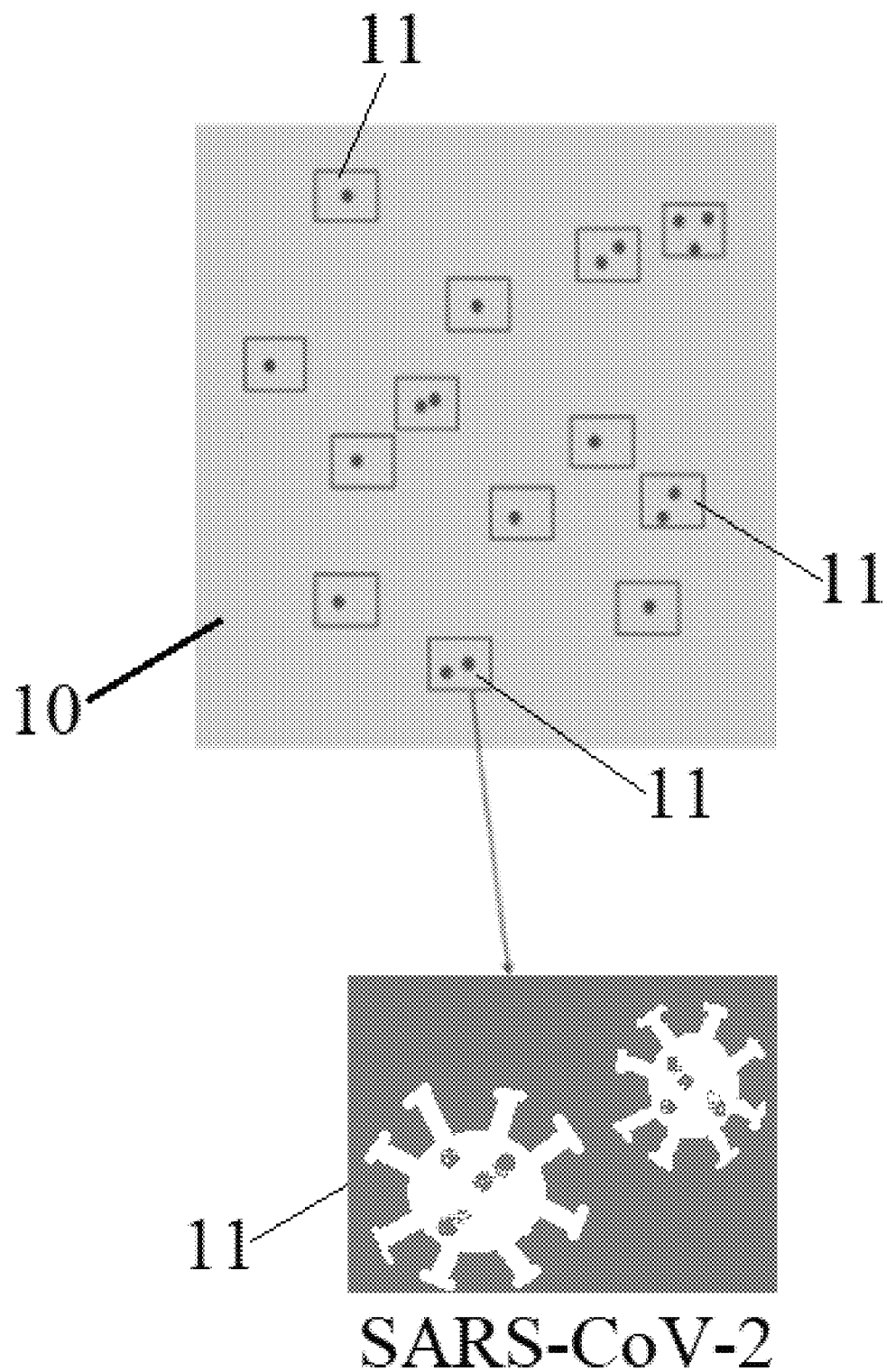
FIG. 53 shows the image of a biological sample in a large FOV with low resolution and a small FOV with high resolution from the EOS in accordance with an exemplary embodiment of the present invention.

The novel EM column system as shown in FIG. 52 can scan larger FOV with low resolution (like 5, 10 or 20 nm) for the full FOV size. Then, the EM column can switch to high resolution (like 1 nm) automatically without any position and focus change and start immediately to scan high resolution image on any special location. A specific software algorithm can be used to control EM scanning of a larger FOV image with two deflectors (71a, 71b) and co-condensers (3, 4) in a lower resolution mode (i.e. a higher contribution from co-condenser 3 or lower contribution from co-condenser 4). The algorithm will detect related POI (pattern of interesting) and record related location(s). As shown in FIG. 53, the algorithm can detect related POI (pattern of interesting) such as the morphological features of Covid-19 virus (SARS-CoV-2) in a biological sample and record their location(s). Then the software will quickly and automatically switch co-condensers (3, 4) to a higher resolution mode (i.e. a lower contribution from co-condenser 3 or a higher contribution from co-condenser 4). The two deflection nodes (71a and 71b) are set to or fixed to a controlled voltage. Other two deflection nodes (72a and 72b) are then used to scan a small FOV 11 with the higher resolution. As shown in the lower panel of FIG. 53, an image of Covid-19 virus (SARS-CoV-2) with a high resolution can be acquired. A software system can combine BSE, DF, BF's images from TEM/STEM system and use a machine learning (ML) algorithm to generate an enhanced image with differenced image resolution.

More generally, each of the virus detection and classification sub-systems (VDCSs) 53 as shown in FIG. 2A may be configured to execute (1) a software algorithm for combining BSE, DF and BF images from one of the EOSs 51, and (2) a machine learning (ML) algorithm for generating an enhanced image with improved image noise and resolution for both low-resolution EOS 51 imaging and high-resolution EOS 51 imaging. The VDCS 53 may be further configured to execute a software algorithm for processing low-resolution EOS images, detecting patterns of interest (POIs) based on user-predefined knowledge and script, and labeling out the accurate locations of the POIs.

The VDCS 53 may be further configured to execute a software algorithm for automatically classifying high-resolution EOS image of the POIs into (1) negative or false result, i.e. absence of pre-defined (known) type of virus particles, (2) positive or true result, i.e. presence of pre-defined (known) type of virus particles, or (3) positive or true result, i.e. presence of unknown type of virus particles, based on pre-defined user knowledge and script (e.g. Covid-19 virus at the time of later 2019). Additionally, the VDCS 53 may be further configured to execute an automatic uploading of the virus sample 56 scanning images and virus classification results into the cloud-based collaboration sub-system (CCS) 50C for further analysis.

In various embodiments, the cloud-based collaboration sub-system (CCS) 50C automatically generates a virus sample 56 scanning and analysis result report and automatically sends the report to a pre-defined user. The CCS 50C may control the electron optical sub-systems (EOSs) 51, the sample management sub-systems (SMSs) 52 and the virus detection and classification sub-systems (VDCSs) 53 with user-defined recipes (or conditions) including programmed script, and it keeps related scanning images and results for future analysis. In certain embodiments, the CCS 50C further includes a marketplace that enables a third party to develop and sell new applications based on (1) pre-processing BSE, DF and BF images from the EOSs 51 virus sample 56 scanning, (2) post-processing BSE, DF and BF images from the EOSs 51 virus sample 56 scanning, and fusion images thereof, and (3) virus sample 56 scanning and analysis result reports generated by the CCS 50C itself. In some embodiments, the CCS 50C can remotely monitor and maintain the system's performance and health, assists users of the system to predict hardware and software issues, diagnoses hardware and software (all general parameters related to system performance), and offers a service suggestion to the users.

Figure 54:
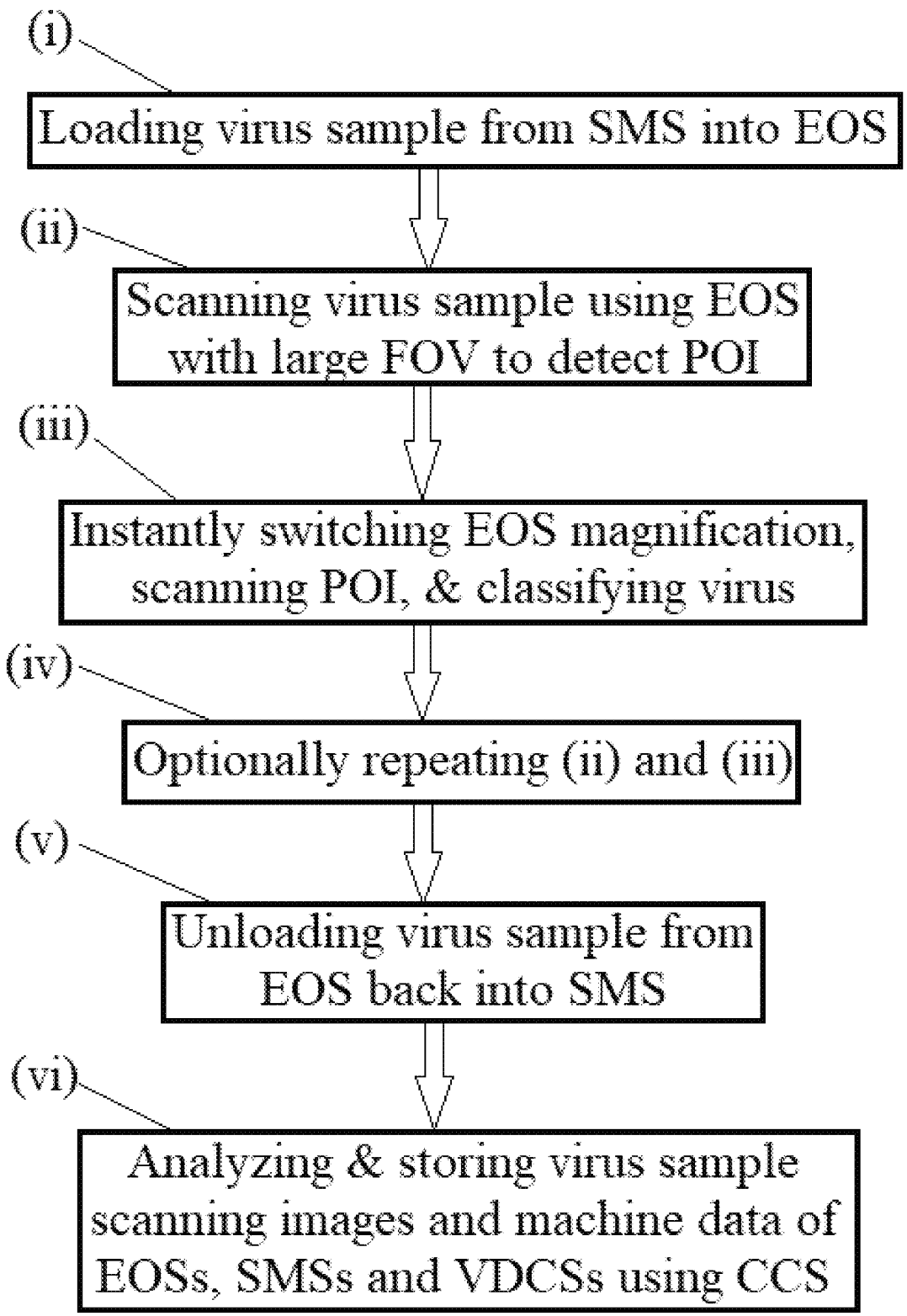
FIG. 54 is a flow chart showing a method of rapid and automatic virus imaging and analysis in accordance with an exemplary embodiment of the present invention.

Another aspect of the invention provides a method of rapid and automatic virus imaging and analysis using the system as described above. As shown in FIG. 54, the method includes the following steps:

(i) automatically loading a virus sample 56 from one of the sample management sub-systems (SMS) 52 into one of the EOSs 51 for virus sample scanning, (ii) automatically scanning the virus sample using the EOS 51 with a larger field of view (FOV) and a lower resolution, and then detecting one or more POIs based on images from the EOS 51 virus sample scanning, (iii) automatically and instantly switching magnification of the EOS 51 and scanning the one or more POIs locations with a smaller FOV and a higher resolution, and automatically classifying a virus based on images from the EOS 51 scanning of the POIs, (iv) optionally repeating steps (ii) and (iii) for N times for N more FOVs, wherein N≥0, (v) automatically unloading the virus samples from the EOS 51 back into the sample management sub-system (SMS) 52, and (vi) using the cloud-based collaboration sub-system (CCS) 50C to (1) analyze the virus sample scanning images, (2) store images from the EOSs 51 virus sample scanning, and (3) store and analyze machine data associated with the EOSs 51, the sample management sub-systems (SMSs) 52, and the virus detection and classification sub-systems (VDCSs) 53.

In some exemplary embodiments of the invention, the method as illustrated in FIG. 54 may further include one or more of the following steps before its step (i):

fixing a virus sample 56 on a sample grid 55, as shown in FIG. 5;

mounting the sample grid 55 onto a grid adapter 57, as shown in FIG. 4;

holding or carrying an array of grid adapters 57 in an adapter cartridge 61, as shown in FIG. 3;

storing multiple adapter cartridges 61 in a cartridge container 62 such as a Front Opening Unified Pod (FOUP), as shown in FIG. 6;

placing the cartridge container 62 on a loadport 63, as shown in FIG. 7;

automatically loading each of the multiple adapter cartridges 61 stored in the cartridge container 62 into a loadlock chamber 65 of a loadlock system 64 through a loadlock slit valve 81, using a cartridge carrier 80, as shown in FIG. 9;

automatically sensing the presence or absence of a grid adapter 57, reading a label 59 on the grid adapter 57 (if present) that contains information related to the virus sample 56, and storing information related to the virus sample 56 with an optical camera module 68, as shown in FIGS. 7 and 9;

automatically sensing the presence or absence of a sample on a sample grid 55, generating a sample distribution map of the sample grid 55, and generating a surface depth profile/landscape of the sample distribution map with an optical imaging system 69 with multiple cameras, and storing the distribution map and the surface depth profile/landscape, as shown in FIGS. 7 and 9;

automatically cooling down the virus samples 56 to a pre-defined temperature with a cooling system 66 such as a semiconductor cooling pad, as shown in FIG. 9; and automatically removing electrostatic charge (if any) from the virus sample 56 with a discharging device 67 within the loadlock chamber 65, as shown in FIG. 9.

Step (i) of the method as illustrated in FIG. 54 may include automatically loading each of the grid adaptors 57 held on the adapter cartridge 61 to a specimen table 244 within a column chamber 83 of the EOS 51 and releasing it onto the specimen table 244 through a column slit valve 84 using an adapter gripper 82, as shown in FIG. 10.

Step (ii) of the method as illustrated in FIG. 54 may include moving the specimen table 244 with a specimen stage 240, as shown in FIG. 10. The specimen stage 240 has an empty space as a receptacle for accommodating the specimen table 244. An objective lens 224 has a planar surface configured for the specimen table 244 to sit on and slide on. The specimen stage 240 can move the specimen table 244 by sliding it to a plurality of predetermined positions on the planar surface of the objective lens 224, and to hold the specimen table 244 on each of the predetermined positions for a period of EOS 51 examination time.

Step (ii) of the method as illustrated in FIG. 54 may include removing a vibration of the specimen table 244 caused by the specimen stage 240, as illustrated in FIGS. 28-30. The specimen stage 240 comprises an elastic protrusion and one or more elastic force receiving parts surrounding the receptacle such as a side wall opposite to the elastic protrusion, a side wall neighboring the elastic protrusion, and/or protrusion(s) on the side wall opposite to the elastic protrusion and/or the side wall neighboring the elastic protrusion. The elastic protrusion is configured to push or press the specimen table 244 against the one or more elastic force receiving parts of the specimen stage 240 after the specimen table 244 is placed into the receptacle, so that the orientation and the position of the specimen table 244 is fixed relative to the specimen stage 240. When a disturbing vibration between the objective lens 224 and the specimen stage 240 occurs during the period of examination time, the elastic protrusion will absorb the disturbing vibration to an effect that the specimen table 244 remains stationary relative to the objective lens 224.

Step (ii) of the method as illustrated in FIG. 54 may include moving the specimen stage 240 on the planar surface of the objective lens 224 with a stage driving system 100, as shown in FIG. 14. The stage driving system 100 comprises a first actuator configured to move a first shaft; a second actuator configured to move a second shaft; a first elastic connector connecting the first shaft and the specimen stage 240; and a second elastic connector connecting the second shaft and the specimen stage 240. The specimen stage 240 is moved around by combined elastic forces from the two elastic connectors that are deformed by the one or two actuators.

Steps (ii) and (iii) of the method as illustrated in FIG. 54 may include deflecting an electron beam with a deflector within the column chamber 83, as shown in FIGS. 33-39. A source of electrons is configured to emit the electron beam along a primary axis (e.g. z axis). The deflector includes an electrode assembly that comprises two or more electrodes arranged around the primary axis (e.g. z axis). There is a central channel space having a boundary surface that is axially symmetrical around the primary axis, and the deflector is configured to deflect the electron beam when the beam travels through the central channel space. The boundary surface is different from a single right cylindrical surface (or at least two round cross-sections of the central channel space along planes in parallel with the x-y plane have different diameters). Each of the electrodes has a body and a front face with a facial surface. The facial surface of each electrode overlaps (or conforms to) a portion of the boundary surface, and the entire body of each electrode remains outside the central channel space.

The so-called "switching magnification of the EOS 51" in step (iii) of the method as illustrated in FIG. 54 comprises coherently focusing an electron beam with co-condensers within the column chamber 83, as shown in FIGS. 43-44. The term "co-condensers" is defined as two or more magnetic condensers configured to coherently focus an electron beam emitted from a source of electrons to a single crossover spot F. The electron beam does not have a crossover spot between any two of the two or more magnetic condensers.

Step (v) of the method as illustrated in FIG. 54 may include automatically unloading each of the grid adaptors 57 from the column chamber 83 of the EOS 51 back to the adapter cartridge 61 through the column slit valve 84 using the adapter gripper 82, and then automatically unloading the adapter cartridge 61 back into the cartridge container 62 on the loadport 63 through the loadlock slit valve 81 using the cartridge carrier 80, as shown in FIG. 10.

Steps (ii) and (iii) of the method as illustrated in FIG. 54 may include (1) executing a software algorithm for combining BSE, DF and BF images from one of the EOSs 51, and (2) executing a machine learning (ML) algorithm for generating an enhanced image with improved image noise and resolution for both low-resolution large-FOV EOS 51 imaging and high-resolution small FOV EOS 51 imaging.

Step (ii) of the method as illustrated in FIG. 54 may include executing a software algorithm for processing low-resolution EOS images, detecting patterns of interest (POIs) based on user-predefined knowledge and script, and labeling out the accurate locations of the POIs.

Step (iii) of the method as illustrated in FIG. 54 may include executing a software algorithm for automatically classifying high-resolution EOS image of the POIs into (1) negative or false result, i.e. absence of pre-defined (known) type of virus particles, (2) positive or true result, i.e. presence of pre-defined (known) type of virus particles, or (3) positive or true result, i.e. presence of unknown type of virus particles, based on pre-defined user knowledge and script (e.g. Covid-19 virus at the time of later 2019); and executing an automatic uploading of the virus sample 56 scanning images and virus classification results into the cloud-based collaboration sub-system (CC S) 50C for further analysis.

Step (vi) of the method as illustrated in FIG. 54 may further include automatically generating a virus sample scanning and analysis result report and automatically sending the report to a pre-defined user.

Step (vi) of the method as illustrated in FIG. 54 may further include controlling the electron optical sub-systems (EOSs) 51, the sample management sub-systems (SMSs) 52 and the virus detection and classification sub-systems (VDCSs) 53 with user-defined recipes (or conditions) including programmed script and keeping related scanning images and results for future analysis.

Step (vi) of the method as illustrated in FIG. 54 may further include providing a marketplace that enables a third party to develop and sell new applications based on (1) pre-processing BSE, DF and BF images from the EOSs 51 virus sample 56 scanning, (2) post-processing BSE, DF and BF images from the EOSs 51 virus sample 56 scanning, and fusion images thereof, and (3) virus sample 56 scanning and analysis result reports generated by the cloud-based collaboration sub-system (CCS) 50C itself.

Step (vi) of the method as illustrated in FIG. 54 may further include remotely monitoring and maintaining the system's performance and health, assisting users of the system to predict hardware and software issues, diagnosing hardware and software (all general parameters related to system performance), and offering a service suggestion to the users.

Referring back to FIG. 2A, the one or more virus detection and classification sub-systems (VDCSs) 53, the controllers 54, and the cloud-based collaboration sub-system (CCS) 50C may be partially or completely implemented with computers and a network, as can be appreciated from the above description. For example, a specific software algorithm can be used to control EM scanning of a larger FOV image with two deflectors (71a, 71b) and co-condensers (3, 4) in a lower resolution mode (i.e. a higher contribution from co-condenser 3 or lower contribution from co-condenser 4), as shown in FIG. 52. The algorithm will detect related POI (pattern of interesting) and record related location(s). As shown in FIG. 53, the algorithm can detect related POI (pattern of interesting) such as the morphological features of Covid-19 virus (SARS-CoV-2) in a biological sample and record their location(s). Then the software will quickly and automatically switch co-condensers (3, 4) to a higher resolution mode (i.e. a lower contribution from co-condenser 3 or a higher contribution from co-condenser 4). The two deflection nodes (71a and 71b) are set to or fixed to a controlled voltage. Other two deflection nodes (72a and 72b) are then used to scan a small FOV 11 with the higher resolution. As shown in the lower panel of FIG. 53, an image of Covid-19 virus (SARS-CoV-2) with a high resolution can be acquired. A software system can combine BSE's, DF's, and BF's images from TEM/STEM system and use a machine learning (ML) algorithm to generate an enhanced image with differenced image resolution.

Such operations, tasks, and functions are sometimes referred to as being computer-executed, computerized, processor-executed, software-implemented, or computer-implemented. They may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or executable instructions that, when executed by one or more processor devices, cause the host computing system to perform the various tasks. In certain embodiments, the program or code segments are stored in a tangible processor-readable medium, which may include any medium that can store or transfer information. Examples of suitable forms of non-transitory and processor-readable media include an electronic circuit, a semiconductor memory device, a ROM, a flash memory, an erasable ROM (EROM), a floppy diskette, a CD-ROM, an optical disk, a hard disk, or the like.

Through the above description of the embodiments, those skilled in the art can understand clearly that the present application may be implemented by means of software plus necessary hardware platforms, or of course, may also be implemented all by software or hardware. Based on such understanding, the entirety of or a portion of that the technical solutions of the present application contribute over the background art may be embodied in the form of a software product. The computer software product may be stored in storage medium, such as ROM/RAM, disk, optical disk, etc., and comprise several instructions for enabling one computer apparatus (which may be a personal computer, a server, or a network equipment, etc.) to execute the methods described in the respective embodiments or described in certain parts of the embodiments of the present application.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. A rapid and automatic virus imaging and analysis system comprising:
   (i) one or more electron optical sub-systems (EOSs), each of which has a large field of view (FOV) and is capable of instant magnification switching for rapidly scanning a virus sample, wherein each of the EOSs comprises a column chamber with a column slit valve; and
   (ii) one or more sample management sub-systems (SMSs), each of which automatically loads virus samples through the column slit valve into one of the EOSs for virus sample scanning and then unloads the virus samples from the EOS through the column slit valve after the virus sample scanning is completed;
   wherein each of the sample management sub-systems comprises multiple adapter cartridges, wherein each of the adapter cartridges holds or carries an array of grid adapters, wherein a sample grid is mounted on each of the grid adapters, and wherein the sample grid is configured for loading a virus sample.

2. The system according to claim 1, wherein each of the sample management sub-systems further comprises:
   (1) a cartridge container such as a Front Opening Unified Pod (FOUP) for receiving and storing the multiple adapter cartridges;
   (2) a loadport for receiving the cartridge container and for placing the cartridge container thereon; and
   (3) a loadlock system including a loadlock chamber,
   wherein the loadlock system automatically loads each of the multiple adapter cartridges stored in the cartridge container on the loadport into the loadlock chamber, and, then automatically loads each of the grid adaptors held on the adapter cartridge into the EOS for virus sample scanning; and
   wherein the loadlock system automatically unloads each of the grid adaptors from the EOS back to the adapter cartridge after the virus sample scanning is completed, and then automatically unloads the adapter cartridge back to the cartridge container on the loadport.

3. The system according to claim 2, wherein the sample grid is a metal grid such as a 3 mm Cu-grid, or a semiconductor grid such as a MEMS grid configured for TEM/STEM samples.

4. The system according to claim 2, wherein the grid adapter comprises:
   (1) a grid mounting area such as a receptacle for mounting a sample grid thereon,
   (2) a machine-readable label containing information related to the virus sample loaded on the sample grid, and
   (3) an adapter orientation controller such as a notch on an edge of the grid adapter.

5. The system according to claim 2, wherein the array of the grid adapters is a single row of grid adapters arranged horizontally or vertically.

6. The system according to claim 2, wherein the sample management sub-system further comprises a cooling system such as a semiconductor cooling pad within the loadlock chamber for cooling down the samples to a pre-defined temperature.

7. The system according to claim 2, wherein the sample management sub-system further comprises a discharging device within the loadlock chamber for removing electrostatic charge (if any) from the sample.

8. The system according to claim 2, wherein the sample management sub-system further comprises an optical camera module for automatically sensing the presence or absence of a grid adapter, reading a label on the grid adapter (if present) that contains information related to the virus sample, and storing information related to the virus sample.

9. The system according to claim 2, wherein the sample management sub-system further comprises an optical imaging system with multiple cameras for automatically sensing the presence or absence of a sample on a sample grid, generating a sample distribution map of the sample grid, and generating a surface depth profile/landscape of the sample distribution map.

10. The system according to claim 2, wherein the sample management sub-system further comprises a cartridge carrier,
    wherein the loadlock chamber has a loadlock slit valve,
    wherein the cartridge carrier automatically loads each of the multiple adapter cartridges stored in the cartridge container on the loadport into the loadlock chamber through the loadlock slit valve, and
    wherein the cartridge carrier automatically unloads each of the adapter cartridge out from the loadlock chamber and back into the cartridge container through the loadlock slit valve.

11. The system according to claim 10, wherein the sample management sub-system further comprises an adapter gripper,
    wherein the adapter gripper automatically loads each of the grid adapters held by the adapter cartridge in the loadlock chamber into the column chamber through the column slit valve, and
    wherein the adapter gripper automatically unloads each of the grid adapters from the column chamber back to the adapter cartridge in the loadlock chamber through the column slit valve.

12. The system according to claim 11, wherein the EOS comprises a specimen table within the column chamber;
    wherein the adapter gripper automatically loads each of the grid adapters held by the adapter cartridge in the loadlock chamber to the specimen table through the column slit valve and then released it onto the specimen table, and
    wherein the adapter gripper automatically grips each of the grid adapters on the specimen table and unloads it from the column chamber back to the adapter cartridge in the loadlock chamber through the column slit valve.

13. The system according to claim 12, wherein the EOS further comprises an objective lens and a specimen stage within the column chamber;
    wherein the specimen stage has an empty space as a receptacle for accommodating the specimen table;
    wherein the objective lens has a planar surface configured for the specimen table to sit on and slide on; and wherein the specimen stage can move the specimen table by sliding it to a plurality of predetermined positions on said planar surface of the objective lens, and to hold the specimen table on each of the predetermined positions for a period of EOS examination time.

14. The system according to claim 13, wherein the specimen stage comprises an elastic protrusion and one or more elastic force receiving parts surrounding the receptacle such as a side wall opposite to the elastic protrusion, a side wall neighboring the elastic protrusion, and/or protrusion(s) on the side wall opposite to the elastic protrusion and/or the side wall neighboring the elastic protrusion;

wherein the elastic protrusion is configured to push or press the specimen table against said one or more elastic force receiving parts of the specimen stage after the specimen table is placed into the receptacle, so that the orientation and the position of the specimen table is fixed relative to the specimen stage; and wherein, when a disturbing vibration between the objective lens and the specimen stage occurs during said period of examination time, the elastic protrusion will absorb the disturbing vibration to an effect that the specimen table remains stationary relative to the objective lens.

15. The system according to claim 13, wherein the EOS further comprises a stage driving system for moving the specimen stage on said planar surface of the objective lens;

wherein the stage driving system comprises a first actuator configured to move a first shaft; a second actuator configured to move a second shaft; a first elastic connector connecting the first shaft and the specimen stage; and a second elastic connector connecting the second shaft and the specimen stage; and wherein the specimen stage is moved around by combined elastic forces from the two elastic connectors that are deformed by the one or two actuators.

16. The system according to claim 13, wherein the EOS further comprises co-condensers within the column chamber and a source of electrons configured to emit an electron beam, wherein the term "co-condensers" is defined as two or more magnetic condensers configured to coherently focus the electron beam to a single crossover spot F, and wherein the electron beam does not have a crossover spot between any two of said two or more magnetic condensers.

17. The system according to claim 13, wherein the EOS further comprises a deflector within the column chamber and a source of electrons configured to emit an electron beam along a primary axis (e.g. z axis), wherein the deflector includes an electrode assembly that comprises two or more electrodes arranged around the primary axis (e.g. z axis), wherein there is a central channel space having a boundary surface that is axially symmetrical around the primary axis, and the deflector is configured to deflect the electron beam when the beam travels through the central channel space, wherein the boundary surface is different from a single right cylindrical surface (or wherein at least two round cross-sections of the central channel space along planes in parallel with the x-y plane have different diameters), wherein each of the electrodes has a body and a front face with a facial surface, and wherein the facial surface of each electrode overlaps (or conforms to) a portion of the boundary surface, and the entire body of each electrode remains outside the central channel space.

18. A method of rapid and automatic virus imaging and analysis, comprising:

fixing a virus sample on a sample grid, mounting the sample grid onto a grid adapter, holding or carrying an array of grid adapters in an adapter cartridge, storing multiple adapter cartridges in a cartridge container such as a Front Opening Unified Pod (FOUP), placing the cartridge container on a loadport, automatically loading each of the multiple adapter cartridges stored in the cartridge container into a loadlock chamber of a loadlock system through a loadlock slit valve, using a cartridge carrier, automatically sensing the presence or absence of a grid adapter, reading a label on the grid adapter (if present) that contains information related to the virus sample, and storing information related to the virus sample with an optical camera module, automatically sensing the presence or absence of a sample on a sample grid, generating a sample distribution map of the sample grid, and generating a surface depth profile/landscape of the sample distribution map with an optical imaging system with multiple cameras, and storing the distribution map and the surface depth profile/landscape, automatically cooling down the virus samples to a predefined temperature with a cooling system such as a semiconductor cooling pad, and automatically removing electrostatic charge (if any) from the virus sample with a discharging device within the loadlock chamber.

19. The method according to claim 18, further comprising automatically loading each of the grid adaptors held on the adapter cartridge to a specimen table within a column chamber of the EOS and releasing it onto a specimen table through a column slit valve using an adapter gripper.

20. The method according to claim 19, further comprising moving the specimen table with a specimen stage, wherein the specimen stage has an empty space as a receptacle for accommodating the specimen table;

wherein an objective lens has a planar surface configured for the specimen table to sit on and slide on; and wherein the specimen stage can move the specimen table by sliding it to a plurality of predetermined positions on said planar surface of the objective lens, and to hold the specimen table on each of the predetermined positions for a period of EOS examination time.

21. The method according to claim 20, further comprising removing a vibration of the specimen table caused by the specimen stage, wherein the specimen stage comprises an elastic protrusion and one or more elastic force receiving parts surrounding the receptacle such as a side wall opposite to the elastic protrusion, a side wall neighboring the elastic protrusion, and/or protrusion(s) on the side wall opposite to the elastic protrusion and/or the side wall neighboring the elastic protrusion, wherein the elastic protrusion is configured to push or press the specimen table against said one or more elastic force receiving parts of the specimen stage after the specimen table is placed into the receptacle, so that the orientation and the position of the specimen table is fixed relative to the specimen stage; and wherein, when a disturbing vibration between the objective lens and the specimen stage occurs during said period of examination time, the elastic protrusion will absorb the disturbing vibration to an effect that the specimen table remains stationary relative to the objective lens.

22. The method according to claim 21, further comprising moving the specimen stage on said planar surface of the objective lens with a stage driving system;
   wherein the stage driving system comprises a first actuator configured to move a first shaft; a second actuator configured to move a second shaft; a first elastic connector connecting the first shaft and the specimen stage; and a second elastic connector connecting the second shaft and the specimen stage; and
   wherein the specimen stage is moved around by combined elastic forces from the two elastic connectors that are deformed by the one or two actuators.

23. The method according to claim 18, further comprising deflecting an electron beam with a deflector within a column chamber,
   wherein a source of electrons is configured to emit said electron beam along a primary axis (e.g. z axis),
   wherein the deflector includes an electrode assembly that comprises two or more electrodes arranged around the primary axis (e.g. z axis),
   wherein there is a central channel space having a boundary surface that is axially symmetrical around the primary axis, and the deflector is configured to deflect the electron beam when the beam travels through the central channel space,
   wherein the boundary surface is different from a single right cylindrical surface (or wherein at least two round cross-sections of the central channel space along planes in parallel with the x-y plane have different diameters);
   wherein each of the electrodes has a body and a front face with a facial surface, and
   wherein the facial surface of each electrode overlaps (or conforms to) a portion of the boundary surface, and the entire body of each electrode remains outside the central channel space.

* * * * *

UNITED STATES PATENT AND TRADEMARK OFFICE
CERTIFICATE OF CORRECTION

PATENT NO. : 11,593,938 B2
APPLICATION NO. : 17/452999
DATED : February 28, 2023
INVENTOR(S) : Zhongwei Chen et al.

It is certified that error appears in the above-identified patent and that said Letters Patent is hereby corrected as shown below:

On the Title Page

Item (73):
Delete "Assignee: BORRIRS PTE. LTD., Singapore (SG)" and
Insert -- Assignee: BORRIES PTE. LTD., Singapore (SG) --, therefor.

Signed and Sealed this
Sixteenth Day of May, 2023

Katherine Kelly Vidal
*Director of the United States Patent and Trademark Office*